United States Patent
Fischer et al.

(10) Patent No.: US 11,142,972 B1
(45) Date of Patent: Oct. 12, 2021

(54) ELECTRIC DRIVEN HYDRAULIC FRACKING OPERATION

(71) Applicant: National Service Alliance—Houston LLC, Houston, TX (US)

(72) Inventors: John Fischer, Hempstead, TX (US); David Kubricht, Cypress, TX (US); Richard Cheatham, Houston, TX (US); Jeffrey Pollack, Joliet, IL (US); Chad Lawman, Joliet, IL (US); David Todd, Houston, TX (US); Tyler Nolen, Houston, TX (US); John J. Crosetto, Oak Forest, IL (US)

(73) Assignee: National Service Alliance—Houston LLC, Houston, TX (US)

( * ) Notice: Subject to any disclaimer, the term of this patent is extended or adjusted under 35 U.S.C. 154(b) by 0 days.

(21) Appl. No.: 17/239,877

(22) Filed: Apr. 26, 2021

Related U.S. Application Data

(63) Continuation of application No. 16/790,897, filed on Feb. 14, 2020, now Pat. No. 10,988,998.

(Continued)

(51) Int. Cl.
  *G08B 5/36* (2006.01)
  *E21B 21/08* (2006.01)
  (Continued)

(52) U.S. Cl.
  CPC ............... *E21B 21/08* (2013.01); *E21B 4/04* (2013.01); *E21B 7/022* (2013.01); *E21B 43/2605* (2020.05); *E21B 43/2607* (2020.05); *F04B 17/03* (2013.01); *F04B 17/06* (2013.01); *F04D 13/0686* (2013.01); *H02B 1/52* (2013.01); *H02B 5/00* (2013.01); *H02J 13/00036* (2020.01);
  (Continued)

(58) Field of Classification Search
  CPC .. E21B 21/08; E21B 43/2605; E21B 43/2607; E21B 7/022; E21B 4/04; E21B 4/02; F04D 13/0686; H02J 13/00036; H02P 27/04; F04B 17/06; F04B 17/03; H02B 5/00; H02B 1/52; F05B 2220/706; F05B 2240/941; H05K 5/0213; H05K 7/20918; H02K 9/00; H02K 7/18
  See application file for complete search history.

(56) References Cited

U.S. PATENT DOCUMENTS

| | | | |
|---|---|---|---|
| 5,795,135 | A | 8/1998 | Nyilas et al. |
| 5,865,247 | A | 2/1999 | Paterson et al. |

(Continued)

*Primary Examiner* — Muhammad S Islam
(74) *Attorney, Agent, or Firm* — Taft Stettinius & Hollister LLP

(57) ABSTRACT

Certain embodiments of the present application relate to a variable frequency drive (VFD) cabin for a pump configuration including a mobile trailer on which the VFD cabin is to be mounted. The VFD cabin generally includes a medium-voltage VFD and a ventilation system. In certain embodiments, the ventilation system is configured to generate an overpressure condition within the cabin to discourage the entry of dust and debris into the cabin. In certain embodiments, one or more components of the medium-voltage VFD are coupled to the floor of the cabin via a vibration damping system. In certain embodiments, the VFD cabin may be directly coupled to a chassis of the mobile trailer without an intervening suspension being provided between the VFD cabin and the chassis.

26 Claims, 18 Drawing Sheets

Related U.S. Application Data

(60) Provisional application No. 62/805,521, filed on Feb. 14, 2019.

(51) Int. Cl.

| | | |
|---|---|---|
| *H02J 13/00* | (2006.01) |
| *E21B 43/26* | (2006.01) |
| *E21B 4/04* | (2006.01) |
| *E21B 7/02* | (2006.01) |
| *F04B 17/03* | (2006.01) |
| *F04B 17/06* | (2006.01) |
| *F04D 13/06* | (2006.01) |
| *H02B 1/52* | (2006.01) |
| *H02B 5/00* | (2006.01) |
| *H02K 7/18* | (2006.01) |
| *H02P 27/04* | (2016.01) |
| *E21B 4/02* | (2006.01) |
| *H02K 9/00* | (2006.01) |
| *H05K 5/02* | (2006.01) |
| *H05K 7/20* | (2006.01) |

(52) U.S. Cl.
CPC ............... *H02K 7/18* (2013.01); *H02P 27/04* (2013.01); *E21B 4/02* (2013.01); *F05B 2220/706* (2013.01); *F05B 2240/941* (2013.01); *H02K 9/00* (2013.01); *H05K 5/0213* (2013.01); *H05K 7/20918* (2013.01)

(56) References Cited

U.S. PATENT DOCUMENTS

| | | | |
|---|---|---|---|
| 6,129,529 A | 10/2000 | Young et al. |
| 6,271,637 B1 | 8/2001 | Kushion |
| 7,053,568 B2 | 5/2006 | Rudinec |
| 7,092,771 B2 | 8/2006 | Retlich et al. |
| 7,539,549 B1 | 5/2009 | Discenzo et al. |
| 7,949,483 B2 | 5/2011 | Discenzo et al. |
| 8,056,635 B2 | 11/2011 | Shampine et al. |
| 8,789,601 B2 | 7/2014 | Broussard et al. |
| 8,997,904 B2 | 4/2015 | Cryer et al. |
| 9,366,114 B2 | 6/2016 | Coll et al. |
| 9,410,410 B2 | 8/2016 | Broussard et al. |
| 9,475,020 B2 | 10/2016 | Coll et al. |
| 9,534,473 B2 | 1/2017 | Morris et al. |
| 9,556,721 B2 | 1/2017 | Jang et al. |
| 9,611,728 B2 | 4/2017 | Oehring |
| 9,650,871 B2 | 5/2017 | Oehring et al. |
| 9,650,879 B2 | 5/2017 | Broussard et al. |
| 9,777,723 B2 | 10/2017 | Wiegman et al. |
| 9,970,278 B2 | 5/2018 | Broussard et al. |
| 10,227,854 B2 | 3/2019 | Glass et al. |
| 10,519,730 B2 | 12/2019 | Morris et al. |
| 10,550,665 B1* | 2/2020 | Golden ................ F16K 31/041 |
| 10,648,311 B2 | 5/2020 | Oehring et al. |
| 2006/0260331 A1 | 11/2006 | Andreychuk |
| 2013/0030438 A1 | 1/2013 | Fox |
| 2013/0306322 A1 | 11/2013 | Sanborn et al. |
| 2014/0012416 A1 | 1/2014 | Negishi et al. |
| 2015/0211524 A1* | 7/2015 | Broussard ............... F04B 47/00 417/423.1 |
| 2015/0252661 A1 | 9/2015 | Glass |
| 2016/0025826 A1 | 1/2016 | Taicher |
| 2016/0326854 A1 | 11/2016 | Broussard et al. |
| 2016/0326855 A1 | 11/2016 | Coli et al. |
| 2016/0369609 A1 | 12/2016 | Morris et al. |
| 2017/0022788 A1* | 1/2017 | Oehring ................ F04B 49/103 |
| 2018/0112468 A1 | 4/2018 | Savage et al. |

\* cited by examiner

ELECTRIC DRIVEN HYDRAULIC FRACKING OPERATION

CROSS-REFERENCE TO RELATED APPLICATIONS

The present application is a continuation application of, and claims the priority benefit of, U.S. patent application Ser. No. 16/790,897, which was filed on Feb. 14, 2020, and which claims the benefit of U.S. Provisional Patent Application No. 62/805,521, which was filed on Feb. 14, 2019. The contents of those applications are incorporated by reference herein in their entireties.

TECHNICAL FIELD

The present disclosure generally relates to electrically-driven hydraulic fracking systems, and more specifically but not exclusively relates to a systems, subsystems, and methods for such electrically-driven hydraulic fracking systems.

BACKGROUND

Conventional hydraulic fracking systems are diesel-powered in that several different diesel engines supply the power to the hydraulic pumps, as well as several types of auxiliary systems that assist the hydraulic pumps to execute the fracking, such as hydraulic coolers and lubrication pumps. Conventional diesel-powered hydraulic fracking systems require a diesel engine and a transmission to be connected to a hydraulic pump to drive the hydraulic pump. However, typically several hydraulic pumps are required at a single fracking site to extract the fluid from the fracking well. Thus, each of the several hydraulic pumps positioned at a particular fracking site requires a dedicated diesel engine and dedicated transmission to adequately drive the corresponding hydraulic pump, thereby requiring several diesel engines and transmissions to also be positioned at the fracking site in addition to the several hydraulic pumps.

Typically, the diesel engines limit the horsepower (HP) at which the hydraulic pumps may operate, thereby requiring an increased quantity of hydraulic pumps to attain the required HP necessary to extract the fluid from the fracking well. The increase in hydraulic pumps also results in an increase in the number of diesel engines and transmissions required at the fracking site, as each hydraulic pump requires a corresponding diesel engine and transmission. As the diesel engines, transmissions, and hydraulic pumps for a single fracking site increase, so does quantity of trailers required to transport and position configurations at the fracking site.

The numerous diesel engines, transmissions, and hydraulic pumps required at a fracking site can significantly drive up the cost of the fracking operation. Each of the numerous trailers required to transport and position these configurations require commercial driver's license (CDL) drivers to operate, as well as increased manpower to rig the increased assets positioned at the fracking site. The amount of diesel fuel required to power the numerous diesel engines to drive the numerous hydraulic pumps required to extract the fluid from the fracking well also significantly drives up the cost of the fracking operation. Further, parasitic losses typically occur as the diesel engines drive the hydraulic pumps as well as drive the auxiliary systems. Such parasitic losses actually decrease the amount of HP that the hydraulic pumps have available for operation, thereby significantly decreasing the efficiency of hydraulic pumps. In doing so, the duration of the fracking operation is extended, resulting in significant increases in the cost of the fracking operation. The diesel engines also significantly increase the noise levels of the fracking operation. For these reasons among others, there remains a need for further improvements in this technological field.

SUMMARY

Certain embodiments of the present application relate to a variable frequency drive (VFD) cabin for a pump configuration including a mobile trailer on which the VFD cabin is to be mounted. The VFD cabin generally includes a medium-voltage VFD and a ventilation system. In certain embodiments, the ventilation system is configured to generate an overpressure condition within the cabin to discourage the entry of dust and debris into the cabin. In certain embodiments, one or more components of the medium-voltage VFD are coupled to the floor of the cabin via a vibration damping system. In certain embodiments, the VFD cabin may be directly coupled to a chassis of the mobile trailer without an intervening suspension being provided between the VFD cabin and the chassis. Further embodiments, forms, features, and aspects of the present application shall become apparent from the description and figures provided herewith.

DETAILED DESCRIPTION

Figure 1:
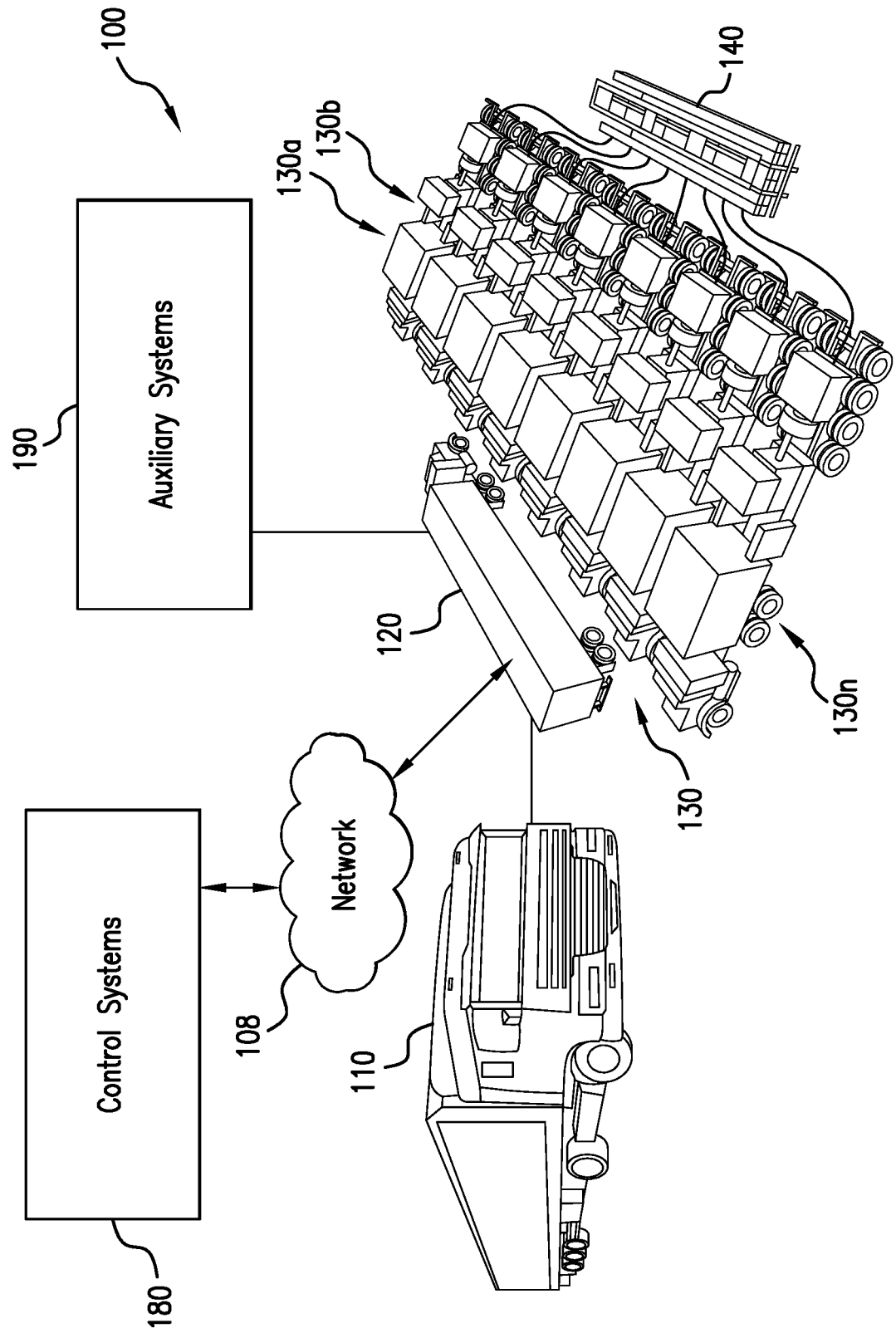
FIG. 1 is a schematic representation of a hydraulic fracking operation according to certain embodiments.

The following Detailed Description refers to the accompanying drawings to illustrate exemplary embodiments consistent with the present disclosure. References in the Detailed Description to "one exemplary embodiment," an "exemplary embodiment," an "example embodiment," etc., indicate the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic may be described in connection with an exemplary embodiment, it is within the knowledge of those skilled in the art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present disclosure. Therefore, the Detailed Description is not meant to limit the present disclosure. Rather, the scope of the present disclosure is defined only in accordance with the following claims and their equivalents.

Embodiments of the present disclosure may be implemented in hardware, firmware, software, or any combination thereof. Embodiments of the present disclosure may also be implemented as instructions applied by a machine-readable medium, which may be read and executed by one or more processors. A machine-readable medium may include any mechanism for storing or transmitting information in a form readable by a machine (e.g., a computing device). For example, a machine-readable medium may include read only memory ("ROM"), random access memory ("RAM"), magnetic disk storage media, optical storage media, flash memory devices, electrical optical, acoustical or other forms of propagated signals (e.g., carrier waves, infrared signals, digital signals, etc.), and others. Further firmware, software routines, and instructions may be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the spirit and scope of the present disclosure. Therefore, such adaptations and modifications are intended to be within the meaning and plurality of equivalents of the exemplary embodiments based upon the teaching and guidance presented herein. It is to be understood that the phraseology or terminology herein for the purpose of description and not of limitation, such that the terminology or phraseology of the present specification is to be interpreted by those skilled in the relevant art(s) in light of the teachings herein.

As used herein, ranges and quantities may be expressed as "about" a particular value or range. The term "about" includes values that are within 10% of the value provided, and also includes the value provided. For example, "about 50%" means "between 45% and 55%." As another example, "between about 30 and about 40" means "a lower limit between 27 and 33 and an upper limit between 36 and 44."

As used herein, the term "single" may be used to indicate that the described component lacks a corresponding counterpart, or that exactly one of the component is being described. For example, a "single-shaft electric motor" is an electric motor that includes exactly one output shaft. Similarly, components that are described as being mounted to a "single trailer" are mounted to the same trailer, and are not distributed across multiple trailers.

Figure 2:
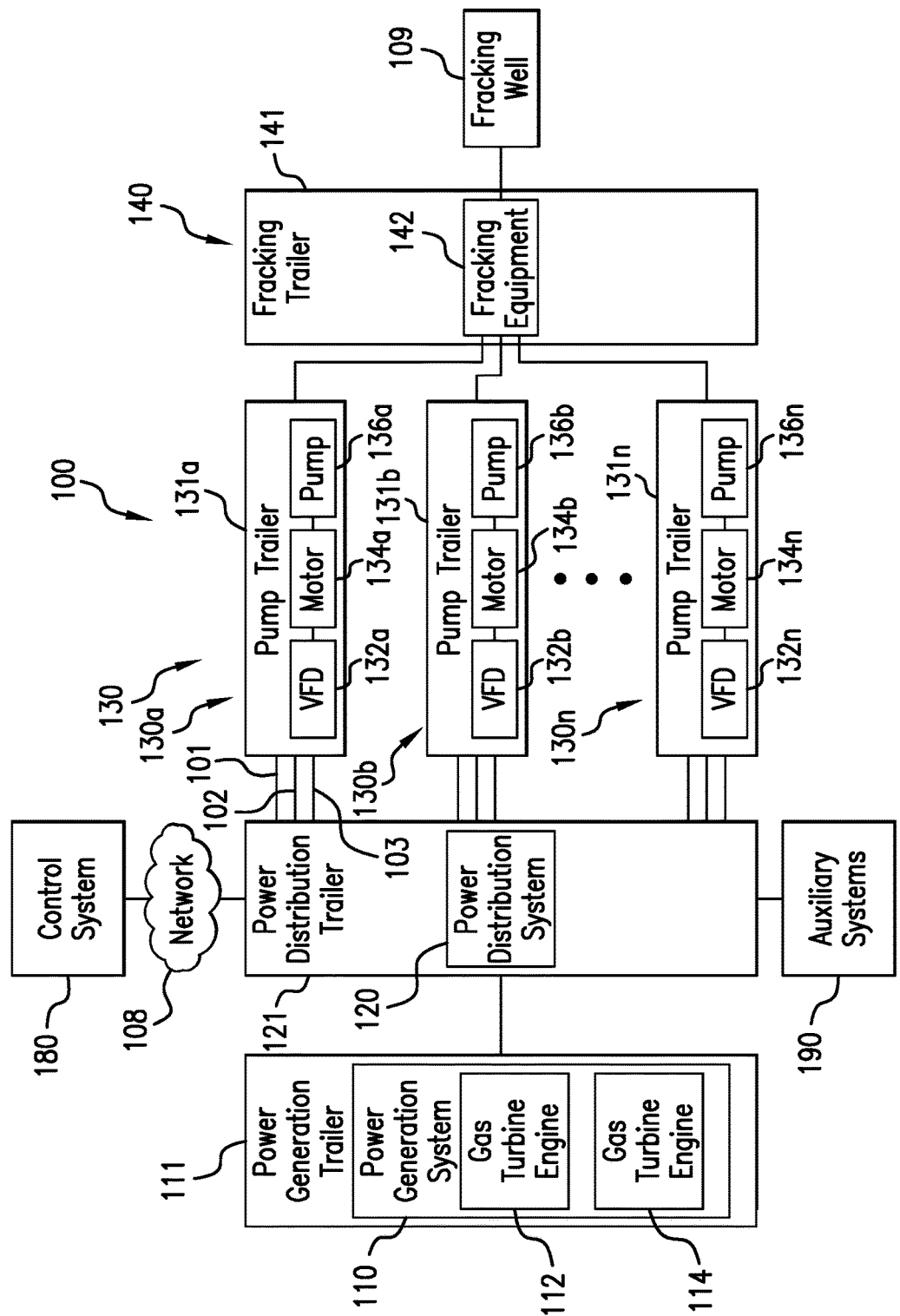
FIG. 2 is a schematic block diagram of the fracking operation illustrated in FIG. 1.

With reference to FIGS. 1 and 2, illustrated therein is a hydraulic fracking operation 100 in which hydraulic pumps may pump a fracking media into a fracking well 109 to execute a fracking operation in order to extract a fluid from the fracking well 109. The illustrated operation 100 includes a power generation system 110, a power distribution system 120 connected with the power generation system 110, a plurality of pump configurations 130 receiving power from the power distribution system 120, and a fracking system 140 connected with the plurality of pump configurations 130. The power distribution system 120 may be in communication with a control system 180, for example via a network 108, and may further supply electric power to one or more auxiliary systems 190. As described herein, during operation, the power generation system 110 generates electric power that is supplied to the power distribution system 120, the power distribution system 120 distributes electric power to the pump configurations 130, the pump configurations 130 utilize the distributed electric power to continuously pump a fracking media to the fracking system 140, and the fracking system 140 utilizes the fracking media in a fracking operation in which the fracking system 140 extracts fluid from the fracking well 109. While certain details regarding the operation 100 are provided herein, further details regarding the hydraulic fracking operation 100 can be found in U.S. patent application Ser. No. 16/790,538, filed on Feb. 13, 2020, the contents of which are incorporated by reference in their entirety.

The power generation system 110 is configured to generate electric power that can be directed to the power distribution system 120. The power generation system 110 may be a mobile power generation system, such as one installed to a trailer 111 that can be transported to the fracking site. In certain forms, the power generation system 110 may include one or more power sources (e.g., gas turbine engines 112, 114) configured to generate electric power having a wattage in the megawatt (MW) range at an initial voltage level in the medium-voltage range. When generated by the power generation system 110, the initial voltage level may alternatively be referred to as the power generation voltage level. In certain embodiments, the power generation system 110 may be omitted from the fracking operation 100. For example, the power distribution system 120 and/or the pump configurations 130 may receive electric power directly from a substation of a power grid. Further details regarding the power generation system 110 are provided herein.

The power generation system 110 may generate electric power at a power generation voltage level in which the power generation voltage level is the voltage level that the power generation system is capable of generating the electric power. For example, when the power sources of the power generation system 110 include a quantity of gas turbine engines, the power generation system 110 may generate the electric power at the power generation voltage level of 13.8 kV, which is a typical voltage level for electric power generated by gas turbine engines. In another example, when the power sources of the power generation system include an electric power plant, the power generation system 110 may generate the electric power at the power generation voltage level of 12.47 kV, which is a typical voltage level for electric power generated by an electric power plant.

In another example, the power generation system 110 may generate electric power that is already at a VFD voltage level to power the single-shaft electric motor as discussed in detail below. In such an example, the power generation system 110 may generate the electric power that is already at the VFD voltage level, such as a VFD voltage level of 4160V. In another example, the power generation system 110 may generate the electric power at the power generation voltage level at a range of 4160V to 15 kV. In another example, the power generation system 110 may generate electric power at the power generation voltage level of up to 38 kV. The power generation system 110 may generate the electric power at any power generation voltage level that is provided by the power sources included in the power generation system 110 that will be apparent to those skilled in the relevant art(s) without departing from the spirit and scope of the disclosure. The power generation system 110 may then provide the electric power at the power generation voltage level to the power distribution trailer 120 via one or more medium-voltage cables.

The power distribution system 120 is configured to receive electric power at an initial medium-voltage voltage level (e.g., from the power generation system 110 and/or the power grid), and to distribute the electric power to the pump configurations 130 and/or the auxiliary system(s) 190. The power distribution system 120 may be a mobile power distribution system, such as one installed to a trailer 121 that can be transported to the fracking site. The power distribution system 120 may transmit electric power at a medium-voltage voltage level to each pump configuration 130 via medium-voltage power lines 101, and may further transmit electric power at a medium-voltage voltage level to one or more auxiliary systems 190. The power distribution system 120 may additionally transmit electric power at a low-voltage voltage level to each pump configuration 130 and/or the auxiliary system(s) via low-voltage power lines 102. The power distribution system 120 may be in communication with the pump configurations 130 via communication lines 103 and/or via wireless communication devices. Further details regarding the power distribution system 120 are provided herein. Additional details regarding an exemplary form of the power distribution system are provided in U.S. patent application Ser. No. 16/790,538, filed on Feb. 13, 2020, the contents of which are incorporated by reference in their entirety.

Each pump configuration 130 is configured to receive electric power from the power distribution system 120 and/or another source, and to pump a fracking media to the fracking system 140 using the received electric power. Each pump configuration 130 generally includes a medium-voltage variable frequency drive (VFD) 132 that converts electric power at the initial medium-voltage voltage level to electric power at a VFD voltage level, a single, single-shaft electric motor 134 that generates motive power in response to being supplied with the electric power at the VFD voltage level, and a single hydraulic pump 136 connected to the single shaft 135 of the single, single-shaft electric motor 138 to continuously pump a fracking media to the fracking system 140. As described herein, the medium-voltage VFD 132 may be housed in a VFD cabin, which may further include a ventilation system that operates using low-voltage power to cool the medium-voltage VFD 132. Further details regarding the pump configuration 130 and the VFD cabin are provided herein. Additional details regarding an exemplary form of the medium-voltage VFD 132 are provided in U.S. patent application Ser. No. 16/790,581, filed on Feb. 13, 2020, the contents of which are incorporated by reference in their entirety.

The illustrated fracking system 140 generally includes a mobile trailer 141 on which a fracking configuration may be positioned. The fracking configuration may be the fracking equipment 142 that executes the actual fracking to extract the fluid from the fracking well 109. For example, the fracking trailer 141 may include the fracking equipment 142 that implements the missile in addition to the well heads that are affixed to the fracking well 109 and distribute the fracking media into the fracking well 109 to prepare the well 109 for later extraction of the fluid from the well 109. The fluid extracted from the fracking well 109 may include a liquid, such as crude oil or the like, or a gas, such as natural gas, hydrocarbons, or the like that is extracted from the fracking well 109 that is then stored and/or distributed. In certain embodiments, a portion of the extracted fluid may be utilized to fuel power sources (e.g., gas turbine engines 112, 114) of the power generation system 110.

The power that is generated to provide power to each of the numerous components included in the hydraulic fracking operation 100 may be provided as a power generation system 110, which may be provided on a power generation trailer 111. Often times, the fracking site is a remote site where it has been determined that sufficient fluid has been located underground to justify temporarily establishing the hydraulic fracking operation 100 for a period of time to drill the fracking well 109 and extract the fluid from the fracking well 109. Such fracking sites are oftentimes positioned in remote locations such as uninhabited areas in mountainous regions with limited road access to the fracking sites. As a result, the hydraulic fracking operation 100 is oftentimes a mobile operation where each of the components is positioned on a corresponding trailer that is then hauled to the fracking site via semi-trucks and/or tractors. For example, the fracking system 140 includes a trailer 141 including fracking equipment 142 that is hauled in via a semi-truck and is positioned closest to the fracking well 109 as compared to the other components in order to execute the fracking operation.

In certain embodiments, the power generation system 110 may also be a mobile operation such that the power generation equipment may be positioned on a power generation trailer 111 and transported to the fracking site via a semi-truck and/or tractor. The power generation system 110 may be positioned at the fracking site such that each and any component/subsystem of the hydraulic fracking operation 100 may be powered by the power generation system 110. In doing so, the power required for the hydraulic fracking operation 100 may be consolidated to the power generation system 110 such that the power generation system 110 provides the necessary power required for the hydraulic fracking operation 100. Thus, the power generation system 110 may be positioned at the fracking site such that each component/subsystem of the hydraulic fracking operation 100 may have power distributed from the power generation system 110 to each respective component of the hydraulic fracking operation 100.

The power generation system 110 may include power generation systems that generate electric power such that the hydraulic fracking operation 100 is powered via electric power generated by the power generation system 110 and does not require subsidiary power generation systems such as subsidiary power generation systems that include diesel engines. In doing so, the power generation system 110 may provide electric power to each component of the hydraulic fracking operation 100 such that the hydraulic fracking operation 100 is solely powered by electric power generated by the power generation system 110. The power generation system 110 may consolidate the electric power that is generated for the electric driven hydraulic fracking system 100 such that the quantity and size of power sources included in the power generation system 110 is decreased.

The power generation system 110 may include power generation systems that generate electric power such that the hydraulic fracking operation 100 is powered only via electric power generated by power generation system 110. In such forms, the fracking operation 100 may not necessarily require subsidiary power generation systems, such as subsidiary power generation systems that include diesel engines. The power generation system 110 may provide electric power to each component of the hydraulic fracking operation 100 such that the hydraulic fracking operation 100 is solely powered by electric power generated by the power generation system 110.

In certain embodiments, the power generation system 110 may include at least one power source (e.g., a gas turbine engine and/or generator), and the power source may operate using one or more fuels (e.g., unleaded gasoline) and generate electric power that is then provided to each component of the hydraulic fracking operation 100. In certain embodiments, the at least one power source may operate using fluid extracted from the fracking well 109 during the course of the fracking operation. In certain embodiments, the power generation system 110 may include electric power that is provided directly by an electric utility company such that mobile power sources are not required to provide electric power to the hydraulic fracking operation 100. In certain embodiments, the power generation system 110 may include a combination of electric power generated by at least one power source and electric power generated by the electric utility company to power each of the components of the hydraulic fracking operation 100. The power generation system 110 may include any type of power source to generate electric power to power each component of the hydraulic fracking operation 100 that will be apparent to those skilled in the relevant art(s) without departing from the spirit and scope of the disclosure.

The power generation system 110 may generate electric power at an initial power level in the megawatt (MW) range and an initial voltage level in the medium-voltage range. In certain embodiments, the initial power level is about 24 megawatts (MW) or greater. In certain embodiments, the initial voltage level is about 10 kilovolts (kV) to about 15 kV. While certain embodiments and examples provided herein are described with reference to an initial voltage level of about 13.8 kV, or about 13.8 kV or greater, it is to be understood that in other embodiments, the initial voltage level may be a different voltage level in the medium-voltage range. In certain embodiments, the initial voltage level may be between 1 kV and 16 kV. In certain embodiments, the initial voltage level may be between about 6 kV and about 15 kV. In certain embodiments, the initial voltage level may be in the range of 12.5 kV±about 20%, 12.5 kV±about 15%, or 12.5 kV±about 10%. In certain embodiments, the initial voltage level may be in a range of about 11.8 kV to about 14.5 kV. In certain embodiments, the initial voltage level may be in the standard 15 kV voltage class, the most common forms of which are 12.47 kV, 13.2 kV, 13.8 kV, and 14.4 kV. Accordingly, the examples provided herein are not to be construed as limiting the scope of the disclosed subject matter to initial voltages of 13.8 kV.

The power generation system 110 may generate electric power at a wattage level such that there is sufficient electric power to adequately power each of the components of the hydraulic fracking operation 100 while having power sources (e.g., gas turbine engines 112, 114) in quantity and in size that enable the power sources to be transported to the fracking site and set up remotely via a trailer 111. In doing so, the power generation system 110 may include power sources that generate sufficient electric power to adequately power each of the components of the hydraulic fracking operation 100 while not requiring a large quantity of power sources and/or power sources of significant size that may significantly increase the difficulty and cost to transport the power sources to the fracking site.

In order to provide sufficient electric power to adequately power each of the components of the hydraulic fracking operation 100 while not requiring large quantities of power sources and/or power sources of significant size, the power generation system 110 may include power sources (e.g., gas turbine engines 112, 114) that generate electric power at a wattage level of about 5 MW, about 12 MW, about 16 MW, about 20 to about 25 MW, about 30 MW and/or any other wattage level that may not require large quantities of power sources and/or power sources of significant size that will be apparent to those skilled in the relevant art(s) without departing from the spirit and scope of the disclosure.

In certain embodiments, the power generation system 110 may include a first power source in the form of a first gas turbine engine 112 that generates a first electric power at a first power level in range of about 12 MW to about 16 MW and a second power source in the form of a second gas turbine engine 114 that generates a second electric power at a second power level in a range of about 12 MW to about 16 MW. The first gas turbine engine 112 and the second gas turbine engine 114 may generate the electric power at the initial voltage level, which electric power may be provided to the power distribution system 120. In certain embodiments, it may be desirable to provide sufficient electric power to adequately power each component of the hydraulic fracking operation 100 as well as limit the quantity of gas turbine engines and the size of the gas turbine engines such that the gas turbine engines may be positioned on a single trailer 111 and transported to the fracking site. In order to do so, the power generation system 110 may include two electric gas turbine engines 112, 114 that generate electric power at power levels in the range of about 12 MW to about 16 MW such that the total electric power that is available to power the components of the hydraulic fracking operation 100 is in the range of about 24 MW to about 32 MW. In another example, the power generation system 110 may be the electric utility power plant that is local to the location of the fracking operation such that the power distribution trailer 120 may receive the electric power at the power level of 24 MW and the power generation voltage level of 12.47 kV directly from the electric utility power plant.

Further, the power generation system 110 including plural power sources (e.g., gas turbine engines 112, 114) to generate the electric power provides redundancy in the power generation for the hydraulic fracking operation 100. In doing so, the power generation system 110 provides a fault redundancy to the electric driven hydraulic fracking system in that the first power source continues to provide the first power level to the power distribution system 120 in the event that the second power source suffers a fault condition. Similarly, the second power source continues to provide the second power level to the power distribution system 120 in the event that the first power source suffers the fault condition. The power generation system 110 may then maintain one or more hydraulic pumps 136a-136n to continuously operate in the continuous duty cycle without interruption in continuously pumping the fracking media due to the system level redundancy provided by the first power source and the second power source.

By incorporating two power sources (e.g., two gas turbine engines 112, 114), redundancy may be provided in that the electric power is provided to the components of the hydraulic fracking operation 100 such that the fracking media is continuously pumped into the fracking well 109 despite one of the power sources suffering a short circuit condition. In doing so, the incident energy may be reduced thereby reducing the short circuit availability of the power generation system 110. However, if one of the power sources 112, 114 were to fail due to a short circuit condition, the remaining power source engine may continue to provide sufficient power to ensure the fracking media is continuously pumped into the fracking well 109, albeit at a reduced level. A failure to continuously pump the fracking media into the well may result in the sand, which is a major component of the fracking media coming out of the suspension and creating a plug at the bottom of the well, which typically results in a significant expense to remove the sand in the well so that the fracking can continue. The power generation system 110 may include any combination of power sources and/or single power source at any wattage level to sufficiently generate electric power to adequately power each of the components of the hydraulic fracking operation 100 that will be apparent to those skilled in the relevant art(s) without departing from the spirit and scope of the disclosure. As noted above, it is also contemplated that the power generation system 110 may be omitted, for example in embodiments in which the power distribution system 120 receives the initial electric power from the power grid.

The power generation system 110 may generate the electric power at an initial voltage level that is in the medium voltage range of 1.0 kV to 72.0 kV. In certain embodiments, the power generation system 110 may generate the electric power at an initial voltage level of about 5 kV to about 15 kV. In certain embodiments, the initial voltage may be provided in the range of 12.5 kV±about 10%. In certain embodiments, the initial voltage may be provided in the range of about 10 kV to about 15 kV. In certain embodiments, the initial voltage may be provided as about 13.8 kV or greater. The generation of the electric power at the voltage level in the medium voltage range enables medium-voltage cables to be used to connect the power generation system 110 to the power distribution system 120 to propagate the electric power from the power generation system 110 to the power distribution system 120, as well as enabling the use of medium-voltage cables to propagate the electric voltage level to any of the components powered by the electric power in the medium voltage range. The use of medium-voltage cables rather than the use of high-voltage cables decreases the size of the cable required, in that medium-voltage cables are smaller than high-voltage cables. This may reduce the cost of the cables required for the hydraulic fracking operation 100.

Further, the consolidation of power sources to decrease the quantity of power sources required to power the components of the hydraulic fracking operation 100 also reduces the quantity of medium-voltage cables that are required to connect each of the power sources to the power distribution system 120, thereby further reducing the cost of the cables required for the hydraulic fracking operation 100. Further, in embodiments in which the power generation system 110 generates the electric power at the initial voltage level of about 13.8 kV, and the capability of the power distribution system 120 to distribute such power, enables the hydraulic fracking operation 100 to be easily integrated with many electric utility grids the world over, since the most common voltage for distribution from the substations of the electric utility grids is about 13.8 kV. As a result, the electric grid may be easily substituted for the power generation system 110 in replacement of the power sources (e.g., the gas turbine engines 112, 114).

The power distribution system 120 may distribute the electric power at the power level generated by the power generation system 110 to each pump configuration 130a-130n, where n is an integer greater than or equal to one and corresponds to the number of pump configurations 130. As noted above, the power generation system 110 may include at least one power source to generate the electric power, and may be supplemented or replaced by the electric utility grid. In doing so, a medium-voltage power cable may be connected from the power generation system 110 to the power distribution system 120. For example, the power generation system 110 may include two gas turbine engines 112, 114 with each of the gas turbine engines generating electric power at the power level of about 12 MW to about 16 MW at the initial voltage level (e.g., an initial voltage level of about 13.8 kV). In such an example, two to five medium-voltage power cables may then connect the two gas turbine engines 112, 114 to the power distribution system 120 such that the electric power may propagate from the gas turbine engines 112, 114 to the power distribution system 120.

As noted above, the power distribution system 120 may distribute the electric power to each of the pump configurations 130a-130n. More particularly, the power distribution system 120 distributes the electric power at the medium-voltage initial voltage level to each of the medium-voltage VFDs 132a-132n, each of which is positioned on a corresponding one of the pump trailers 131a-131n and included in the corresponding pump configuration 130a-130n. As discussed in further detail below, several different hydraulic pumps 136a-136n may be required to continuously pump the fracking media into the fracking well 109 to execute the fracking operation. In doing so, each of the hydraulic pumps 136a-136n may be driven by a corresponding VFD 132a-132n also positioned on the corresponding pump trailer 131a-131n of the corresponding pump configuration 130a-130n. Each of the medium-voltage VFDs 132a-132n may then provide the appropriate power to drive the corresponding single-shaft electric motors 134a-134n, each of which drives a corresponding one of the hydraulic pumps 136a-136n to continuously pump the fracking media into the fracking well 109 to execute the fracking operation to extract the fluid from the fracking well 109. Thus, the power distribution system 120 may distribute the electric power generated by the power generation system 110 to the several different VFDs 132a-132n positioned on each of the pump trailers 131a-131n. As described herein, the power distribution system 120 may further provide medium-voltage power to the auxiliary system(s) 190 and/or may provide low-voltage power to the pump configurations 130a-130n and/or the auxiliary system(s) 190.

In an example, the power distribution system 120 is configured to distribute the electric power at the power level of about 24 MW or greater generated by the at least one power source (e.g., the one or more gas turbine engines 112, 114) from an initial voltage level of about 13.8 kV to the medium-voltage VFDs 132a-132n, each of which is positioned on a corresponding pump trailer 131a-131n. In such an example, the power generation system 110 includes two different gas turbine engines 112, 114 that each generate electric power at the power level of about 12 MW to about 16 MW and at the initial voltage level of about 13.8 kV. Two to five different medium-voltage cables may then propagate the electric power generated by the two gas turbine engines 112, 114 to the power distribution system 120. The power distribution system 120 may then combine the power levels of about 12 MW to about 16 MW generated by each of the two gas turbine engines 112, 114 to generate a power level of about 24 MW to about 32 MW at the initial voltage level of about 13.8 kV. The power distribution system 120 may then distribute the electric power at the initial voltage level of about 13.8 kV to each of eight different VFDs 132a-132n via eight different medium-voltage cables 101. The power distribution system 120 may distribute the power generated by any quantity of gas turbine engines to any quantity of VFDs that will be apparent to those skilled in the relevant art(s) without departing from the spirit and scope of the disclosure.

In certain embodiments, the power distribution system 120 may include a plurality of switchgear, wherein each switchgear switches the electric power generated by the power generation system 110 and received by the corresponding medium-voltage cable to the medium-voltage cable 101 for each of the corresponding medium-voltage VFDs 132a-132n. For example, the power distribution system 120 may include eight different switchgear feeders to switch the electric power generated by the power source (e.g., the two gas turbine engines 112, 114) at the initial medium-voltage voltage level to the eight different medium-voltage cables 101 for the eight medium-voltage VFDs 132a-132n to distribute the electric power at the initial medium-voltage voltage level to each of the eight medium-voltage VFDs 132a-132n. Further details regarding an illustrative form of the power distribution system 120 are provided in the above-referenced U.S. patent application Ser. No. 16/790,538.

In certain embodiments, the switchgears may include a solid state insulated switchgear (2SIS) or a gas insulated switchgear (GIS), such as those manufactured by ABB or Schneider Electric. Such medium-voltage switchgears may be sealed such that there is no exposure to contacts for the medium-voltage electric power. Oftentimes the fracking site generates an immense amount of dust and debris. Thus, removing any environmental exposure to medium-voltage contacts included in the 2SIS or GIS may decrease the maintenance required for the 2SIS or GIS. Further, the 2SIS and/or GIS may be permanently set to distribute the electric power from each of the power sources (e.g., the gas turbine engines 112, 114) to each of the different VFDs 132a-132n with little maintenance. The power distribution system 120 may incorporate any type of switchgear and/or switchgear configuration to adequately distribute the electric power from the power generation system 110 to each of the different pump configurations 130a-130n that will be apparent to those skilled in the relevant art(s) without departing from the spirit and scope of the disclosure.

Figure 3:
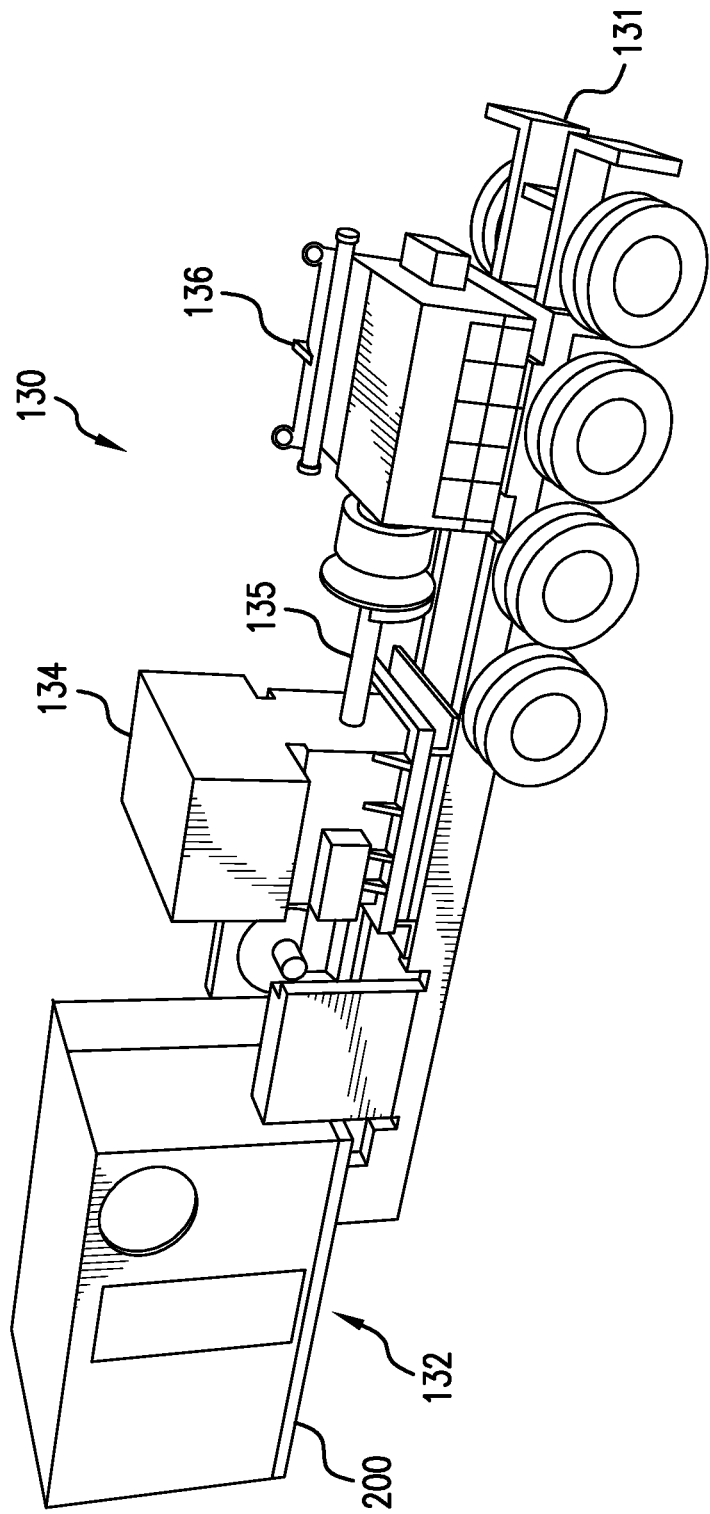
FIG. 3 illustrates a single-pump pump configuration according to certain embodiments.

With additional reference to FIG. 3, illustrated therein is a single, single-pump configuration 130 that includes a medium-voltage VFD 132, a single, single-shaft electric motor 134 and a single hydraulic pump 136, each of which is mounted on a single pump trailer 131. Also mounted to the same trailer 131 is a VFD cabin 200 in which the medium-voltage VFD 132 is housed. Further details regarding the illustrative VFD cabin 200 are provided below with reference to FIGS. 4-14, and an exemplary process for manufacturing the cabin 200 is provided below with reference to FIG. 15.

The power distribution system 120 may distribute the electric power at the initial voltage level generated by the power generation system 110 to the medium-voltage VFD 132 that is positioned on the single pump trailer 131 of the pump configuration 130. The medium-voltage VFD 132 may then drive the single, single-shaft electric motor 134 and the single hydraulic pump 136 as well as control the operation of the single, single-shaft electric motor 134 and the single hydraulic pump 136 as the single-shaft electric motor 134 continuously drives the single hydraulic pump 136 to cause the single hydraulic pump 136 to continuously pump the fracking media. In doing so, the VFD 132 may convert the electric power distributed by the power distribution system 120 at the initial voltage level generated by the power generation system 110 to a VFD voltage level that is appropriate to drive the single-shaft electric motor 134.

Often times, the initial voltage level of the electric power distributed by the power distribution system 120 as generated by the power generation system 110 may be at a voltage level that is significantly higher than a voltage level that is appropriate to drive the single-shaft electric motor 134. Thus, the medium-voltage VFD 132 may convert the initial voltage level of the electric power as distributed by the power distribution system 120 to significantly lower the voltage level to the VFD voltage level that is appropriate to drive the single-shaft electric motor 134. In certain embodiments, the medium-voltage VFD 132 may convert the initial voltage level of the electric power as distributed by the power distribution system 120 to a VFD voltage level of about 4160V or greater. In certain embodiments, the medium-voltage VFD 132 may convert the initial voltage level of the electric power distributed by the power distribution system 120 to a VFD voltage level that ranges from about 4160V to about 6600V. In certain embodiments, the VFD voltage level may be in a range of about 2 kV to about 8 kV. Further details regarding an illustrative form of the medium-voltage VFD 132 are provided in the above-referenced U.S. patent application Ser. No. 16/790,581.

In an example, the power generation system 110 generates the electric power at an initial voltage level in a range of about 10 kV to about 15 kV. The power distribution system 120 then distributes the electric power at the initial voltage level in the range of about 10 kV to about 15 kV to the medium-voltage VFD 132. However, the single-shaft electric motor 134 operates at a voltage level of about 4160V in order to drive the single hydraulic pump 136, and the voltage level of about 4160V for the single-shaft electric motor 134 to operate is significantly less than the voltage level in the range of about 10 kV to about 15 kV of the electric power that is distributed by the power distribution system 120 to the medium-voltage VFD 132. The medium-voltage VFD 132 may then convert the electric power at the initial voltage level in the range of about 10 kV to about 15 kV to a VFD voltage level of about 4160V and drive the single, single-shaft electric motor 134 that is positioned on the single pump trailer 131 at the VFD voltage level of about 4160V to control the operation of the single, single-shaft electric motor 134 and the single hydraulic pump 136. The medium-voltage VFD 132 may convert any voltage level of the electric power distributed by the power distribution system 120 to any VFD voltage level that is appropriate to drive the single-shaft electric motor that will be apparent to those skilled in the relevant art(s) without departing from the spirit and scope of the disclosure.

The medium-voltage VFD 132 may also control the operation of the single-shaft electric motor 134 and the single hydraulic pump 136. The medium-voltage VFD 132 may include a sophisticated control system able to control in real-time the operation of the single-shaft electric motor 134 and the single hydraulic pump 136 in order for the single-shaft electric motor 134 and the single hydraulic pump 136 to adequately operate to continuously pump the fracking media into the fracking well 109. Although the single, single-shaft electric motor 134 and the single hydraulic pump 136 may operate continuously to continuously pump the fracking media into the fracking well 109, such continuous operation may not necessarily be continuously executed with the same parameters throughout the entirety of the continuous operation. The parameters according to which the single-shaft electric motor 134 and the single hydraulic pump 136 continuously operate may actually vary based on the current state of the fracking operation 100. The medium-voltage VFD 132 may automatically adjust the parameters according to which the single-shaft electric motor 134 and the single hydraulic pump 136 continuously operate to adequately respond to the current state of the fracking operation 100.

As noted above, the medium-voltage VFD 132 may convert the electric power at the initial voltage level distributed by the power distribution system 120 to the VFD voltage level that is appropriate to drive the single-shaft electric motor 134. The single-shaft electric motor 134 may be a single-shaft electric motor in that the single shaft 135 of the electric motor is coupled to the single hydraulic pump 136 such that the single, single-shaft electric motor 134 drives the single hydraulic pump 136. The single, single-shaft electric motor 134 may continuously drive the single hydraulic pump 136 at an operating frequency to enable the single hydraulic pump 136 to continuously pump the fracking media into the fracking well 109. The single, single-shaft electric motor 134 may operate at the VFD voltage level and at the operating frequency in order to rotate at a RPM level that is sufficient to continuously drive the single hydraulic pump 136 at the maximum horsepower (HP) level that the single hydraulic pump 136 is rated to pump. In certain embodiments, the single-shaft electric motor 134 may operate at a VFD voltage level of at least 4160V or at a voltage level of about 4160V. In certain embodiments, the single-shaft electric motor 134 may operate at a VFD voltage level in a range of 4160V to 6600V or in a range of about 4160V to about 6600V. In certain embodiments, the single-shaft electric motor 134 may operate at other VFD voltages. The single-shaft electric motor 134 may operate any VFD voltage level that is adequate to continuously drive the single hydraulic pump 136 that will be apparent to those skilled in the relevant art(s) without departing from the spirit and scope of the disclosure.

In an example, the power distribution system 120 may distribute the electric power to the medium-voltage VFD 132 at an initial voltage level of about 13.8 kV. The medium-voltage VFD 132 may then convert the electric power at the voltage level of about 13.8 kV to the VFD voltage level of about 4160V to adequately drive the single, single-shaft electric motor 134. The single-shaft electric motor 134 may operate at an operating frequency of 0 Hz to 100 Hz and, in response to provision of the VFD voltage level of about 4160V to about 6900V to adequately drive the single-shaft electric motor at the operating frequency of 0 Hz to 100 Hz, the single, single-shaft electric motor 134 may then rotate at an RPM level of about 750 RPM or greater. The single-shaft electric motor 134 may rotate at an RPM level of at least about 750 RPM based on the VFD voltage level of about 4160V to about 6900V as provided by the medium-voltage VFD 132, and to drive the corresponding single hydraulic pump 136 with the rotation at the RPM level of at least about 750 RPM.

In certain embodiments, the single-shaft electric motor 134 may rotate at an RPM level of at least 5 RPM to 750 RPM, or an RPM level of about 750 RPM or greater. In certain embodiments, the motor 134 may rotate at an RPM level of about 500 RPM or greater. In certain embodiments, the single-shaft electric motor 134 may rotate at an RPM level of about 750 RPM to about 1500 RPM. The single-shaft electric motor 134 may operate at any RPM level to continuously drive the single hydraulic pump 136 that will be apparent to those skilled in the relevant art(s) without departing from the spirit and scope of the disclosure. The single-shaft electric motor 134 may operate at any operating frequency to continuously drive the single hydraulic pump 136 that will be apparent to those skilled in the relevant art(s) without departing from the spirit and scope of the disclosure.

In certain embodiments, the single-shaft electric motor 134 may be an induction motor that rotates at the RPM level based on the input gear box ratio of the single hydraulic pump 136. Based on the operating frequency of the single-shaft electric motor 134 and the VFD voltage level applied to the single-shaft electric motor 134, the single-shaft electric motor 134 may then rotate at the RPM level, and outputs torque at an output torque level that corresponds to the operating frequency and VFD voltage level. However, the VFD voltage level applied to the single-shaft electric motor 134 may be determined based on the input gear box ratio of the single hydraulic pump 136 as the single-shaft electric motor 134 typically cannot rotate at the RPM level that exceeds the input gear box ratio of the single hydraulic pump 136. The single-shaft electric motor 134 may be an induction motor, a traction motor, a permanent magnet motor and/or any other motor that continuously drives the single hydraulic pump 136 that will be apparent to those skilled in the relevant art(s) without departing from the spirit and scope of the disclosure.

As noted above, the single-shaft electric motor 134 may be coupled to the single hydraulic pump 136 and drive the single hydraulic pump 136 such that the single hydraulic pump 136 continuously pumps the fracking media into the fracking well 109 to execute the fracking operation to extract the fluid from the fracking well 109. The single hydraulic pump 136 may operate on a continuous duty cycle such that the single hydraulic pump 136 continuously pumps the fracking media into the fracking well 109. Rather than operating on an intermittent duty cycle that causes conventional hydraulic pumps to temporarily stall in the pumping of the fracking media into the fracking well 109, the single hydraulic pump 136 in operating on a continuous duty cycle may continuously pump the fracking media into the fracking well 109 without any intermittent stalling in the pumping. In doing so, the efficiency in the fracking operation to extract the fluid from the fracking well 109 may significantly increase as any intermittent stalling in pumping the fracking media into the fracking well 109 may result in setbacks in the fracking operation, and may increase the risk of sand coming out of suspension and/or other debris entering into the fracking well 109. Thus, the single hydraulic pump 136 in operating on the continuous duty cycle may mitigate the risks of any setbacks in the fracking operation due to the continuous pumping of the fracking media into the fracking well 109.

The single hydraulic pump 136 may continuously pump the fracking media into the fracking well 109 at the HP level at which the single hydraulic pump 136 is rated. The increase in the HP level that the single hydraulic pump 136 may continuously pump the fracking media into the fracking well 109 may result in an increase in the efficiency in the fracking operation. For example, the single hydraulic pump 136 may continuously pump the fracking media into the fracking well 109 at the HP level of about 5000 HP or greater as driven by the single-shaft motor 134 at the RPM level of about 750 RPM or greater. In certain embodiments, the single hydraulic pump 136 operates on a continuous duty cycle to continuously pump the fracking media at the HP level of about 5000 HP or greater. In certain embodiments, the single hydraulic pump 136 may operate at continuous duty with a HP level of about 5000 HP. The hydraulic pump 136 may, for example, be provided as a Weir QEM5000 pump, or other manufacturers of similar rating. However, the single hydraulic pump 136 may any type of hydraulic pump that operates on a continuous duty cycle and at any HP level that adequately continuously pumps the pumping fracking media into the fracking well 109 to execute the fracking operation to extract the fluid from the fracking well 109 that will be apparent to those skilled in the relevant art(s) without departing from the spirit and scope of the disclosure.

In certain embodiments, the individual pump configuration 130 discussed in detail above may be incorporated into the hydraulic fracking operation 100 depicted in FIG. 1 as each of the pump configurations 130a-130n. Each of the several pump configurations 130a-130n may be incorporated into the hydraulic fracking operation 100 to increase the overall HP level that is applied to the fracking equipment 142 positioned on the fracking trailer 141 by the hydraulic pumps 136a-136n positioned on the pump trailers 131a-131n. In doing so, the overall HP level that is applied to the fracking equipment 142 in order to continuously pump the fracking media into the fracking well 109 may be significantly increased, as the HP level that is applied to the fracking equipment 142 is scaled with each pump configuration 130 that is added to the hydraulic fracking operation 100.

The positioning of each medium-voltage VFD 132a-132n, each single-shaft electric motor 134a-134n, and each single hydraulic pump 136a-136n on a corresponding pump trailer 131a-131n enables the power distribution system 120 to distribute the electric power at the initial voltage level to each medium-voltage VFD 132a-132n from a single power distribution source (e.g., the power distribution system 120) rather than having a dedicated power distribution source for each pump configuration 130a-130n. In doing so, the electric power at the initial voltage level may be distributed to each VFD 132a-132n, and each VFD 132a-132n may individually convert the initial voltage level to the appropriate VFD voltage for the corresponding single-shaft electric motor 134a-134n and the single hydraulic pump 136a-136n that is positioned on the corresponding pump trailer 131a-131n. The medium-voltage VFD 132 may also control the corresponding single-shaft electric motor 134 and hydraulic pump 136 positioned on the corresponding pump trailer 131.

In isolating the medium-voltage VFD 132 to convert the electric power at the initial voltage level to the VFD voltage level appropriate for the single, single-shaft electric motor 134 and the single hydraulic pump 136, the capabilities of the single-pump pump configuration 130 may then be easily scaled by replicating the single-pump pump configuration 130 into several different single-pump pump configurations 130a-130n. In scaling the single-pump pump configuration 130 into several different single-pump pump configurations 130a-130n, the parameters for the medium-voltage VFD 132, the single-shaft electric motor 134, and the single hydraulic pump 136 may be replicated to generate the several different pump configurations 130a-130n, and in doing so scaling the fracking operation 100 to a desired size (e.g., a desired overall HP level).

In certain embodiments, the medium-voltage VFD 132 may convert the electric power at the initial voltage level (as distributed by the power distribution system 120) to the VFD voltage level appropriate to drive the corresponding single-shaft electric motor 134, such that each single-shaft electric motor 134 rotates at the RPM level sufficient to continuously drive the single hydraulic pump 136 at the rated HP level of the hydraulic pump 136. Rather than simply having a single hydraulic pump 136 as depicted in FIG. 2 and discussed in detail above to continuously pump at the HP level of the single hydraulic pump 136, several different hydraulic pumps 136a-136n and single-shaft electric motors 134a-134n (as positioned on different pump trailers 131a-131n) may be scaled together to scale the overall HP level that is provided to the fracking equipment 142 positioned on the fracking trailer 141. In doing so, the overall HP level that is provided to the fracking equipment 142 may be easily scaled by incorporating each of the individual pump trailers 131a-131n each with single hydraulic pumps 136a-136n operating at the corresponding pump HP levels to scale the HP levels of the single hydraulic pumps 136a-136n to generate the overall HP level for the hydraulic fracking operation 100.

For example, the single hydraulic pump 136 of each corresponding pump configuration 130a-130n may be operating on a continuous duty cycle at a HP level about 5000 HP or greater. A total of eight pump configurations 130a-130n, each with a single hydraulic pump 136a-136n positioned on the corresponding pump trailer 131a-131n, results in a total of eight hydraulic pumps 136a-136n operating on a continuous duty cycle at a HP level of about 5000 HP or greater (where n is equal to eight). In doing so, each of the eight hydraulic fluid pumps 136a-136n continuously pumps the fracking media into the fracking well 109 at a HP level of about 40,000 HP or greater, and do so continuously with each of the eight hydraulic fluid pumps 136a-136n operating on a continuous duty cycle. Thus, the fracking media may be continuously pumped into the fracking well 109 at a HP level of about 40,000 HP or greater to execute the fracking operation to extract the fluid from the fracking well 109. The hydraulic pumps 136a-136n positioned on the corresponding pump trailers 131a-131n may operate on a continuous duty at any HP level, and the quantity of pump configurations 130a-130n may be scaled to any quantity obtain a desired overall HP level for the hydraulic fracking operation 100 that will be apparent to those skilled in the relevant art(s) without departing from the spirit and scope of the present disclosure.

Conventional hydraulic fracking operations that incorporate diesel engines as the power generation source rather than electric gas turbine engines struggle to deliver an increased performance and efficiency with regard to executing the fracking operation as compared to the electric driven hydraulic fracking operation 100. Typically, conventional hydraulic pumps that are associated with the conventional diesel engines are not rated for continuous duty, resulting in the conventional hydraulic pumps having intermittent interruptions in the pumping of the fracking media into the fracking well 109. Such intermittent interruptions may decrease the efficiency in executing the fracking operation in that the quality in the fracking operation may decrease as the risk of sand and/or other debris being mixed into fracking well 109 increases. Rather than having a continuous duty single hydraulic pump 136 that continuously pumps the fracking media into the fracking well 109 without interruption, the conventional hydraulic pump suffers the intermittent interruption due to not being continuous duty.

Further, conventional hydraulic fracking operations that incorporate diesel engines require dedicated diesel engines to drive each conventional hydraulic pump, rather than being able to consolidate the power generation to a power generation system 110 that consolidates the quantity and size of the gas turbine engines to generate the electric power. Such an increase in diesel engines significantly increases the cost of the fracking operation in that significantly more trailers are required to transport the diesel engines. This results in significantly more semi-trucks and/or trailers required to transport the diesel engines, and a corresponding increase in the number of CDL drivers required. As the overall asset count increases at the fracking site, the overall cost increases due to the increased amount of manpower required, as well as an increase in the amount of rigging that is required to rig each of the diesel engines to the conventional hydraulic pumps. By contrast, the electric driven hydraulic fracking operation 100 may decrease the asset count by consolidating the power generation to the gas turbine engines 112, 114 of decreased size and quantity that are consolidated into the power generation system 110. The power distribution system 120 then further decreases the cost by consolidating the medium-voltage cabling that is required to power each of the assets (e.g., the pump configurations 130 and/or the auxiliary system(s) 190), thereby decreasing the amount of rigging required.

It should also be noted that conventional hydraulic fracking operations that incorporate diesel engines suffer significant parasitic losses throughout the different components included in the fracking operation. Diesel engines that generate power that satisfies the HP level at which the conventional fluid pumps are rated oftentimes do not reach that HP level due to parasitic losses throughout the conventional hydraulic fracking configuration. For example, the diesel engines may suffer parasitic losses when driving the hydraulic coolers and the lubrication pumps that are associated with the conventional hydraulic pump, in addition to the parasitic losses suffered from driving the conventional hydraulic pump itself. By way of example, the diesel engine may be driving the conventional hydraulic pump that is rated at 2500 HP at a nominal HP level of 2500 HP, but due to parasitic losses, the diesel engine is actually only driving the conventional hydraulic pump at 85% of the HP level of 2500 HP. However, the electric driven hydraulic fracking operation 100 may have the hydraulic pumps 136a-136n that are rated at the HP level of 5000 HP and, due to the lack of parasitic losses in providing electric power to the individual hydraulic pumps 136a-136n, each individual hydraulic pump 136a-136n actually continuously pumps the fracking media into the fracking well 109 at about 5000 HP. Thus, the asset count required for the electric driven hydraulic fracking operation 100 may be significantly reduced as compared to the hydraulic fracking operations that incorporate diesel engines due to the lack of parasitic losses for the electric driven hydraulic fracking operation 100.

Conventional hydraulic fracking operations that incorporate diesel engines may also consume significantly more fuel than the electrically-driven hydraulic fracking operation 100. The cost and quantity of diesel fuel consumed by the diesel engines may be significantly higher than the cost and quantity of unleaded fuel consumed by the gas turbine engines that are consolidated in size and quantity in the power generation system 110. For example, the estimated fuel consumption for fifteen conventional 2500 HP hydraulic pumps that are driven by diesel may be $48,600 per day at $3.00 per gallon for diesel fuel resulting in a diesel fuel cost of $1,477,400 per month. However, the electric driven hydraulic fracking operation 100 may generate sufficient energy to drive fifteen single hydraulic pumps 136a-136n operating at the HP level of 5000 HP resulting in a fuel cost of $27,000 per day and $820,800 per month. This represents a fuel savings of $650,000 per month from the conventional hydraulic fracking operations that incorporate diesel engines, while generating significantly more HP with the 5000 HP single hydraulic pumps 136a-136n as compared to the 2500 HP conventional hydraulic pumps for the diesel engine approach. Moreover, in certain embodiments, the gas turbine engines 112, 114 may be fueled by fluid extracted from the fracking well 109, which may further decrease the cost of fuel required to generate power via the mobile power generation system 110.

Conventional hydraulic fracking operations that incorporate diesel engines may also generate significantly more noise than the electric driven hydraulic fracking operation 100. The numerous diesel engines required in the conventional hydraulic fracking operations generate increased noise levels in that the diesel engines generate noise levels at 110 dBa. However, the gas turbine engines 112, 114 incorporated into the power generation system 110 of the electric driven hydraulic fracking operation 100 may generate noise levels that are less than 85 dBa. Oftentimes, the fracking site has noise regulations in that the noise levels of the fracking operation cannot exceed 85 dBa. In such situations, an increased cost is associated with the conventional hydraulic fracking operations that incorporate diesel engines in attempts to lower the noise levels generated by the diesel engines to below 85 dBa. The electric driven fracking operation 100 may not necessarily have the increased cost, as the noise levels of the gas turbine engines may already fall below 85 dBa.

Certain conventional hydraulic fracking systems attempt to increase the overall HP level of the fracking site by having dual-shaft motors drive two conventional hydraulic pumps simultaneously. In doing so, the overall HP level of the fracking site is essentially doubled by doubling the quantity of conventional hydraulic pumps by having conventional dual-shaft motors drive the two conventional hydraulic pumps simultaneously. However, the two conventional hydraulic pumps are both connected to a single conventional dual-shaft motor such that the single conventional dual-shaft motor drives the two hydraulic pumps simultaneously and also in synchronization. In driving the two conventional hydraulic pumps in synchronization, significantly increased harmonics are generated from the synchronized operation of the two conventional hydraulic pumps. Those harmonics resonate into the fracking operation and down the line into the fracking well 109, and may cause wear and pulsation of the high-pressure iron in the fracking well 109, thereby negatively affecting the fracking operation. In contrast to the illustrated operation 100, in which single-shaft electric motors 134a-134n drive individual hydraulic pumps 136a-136n at the HP level of 5000 HP that results in no harmonics, the conventional dual-shaft motors drive two conventional hydraulic pumps at the HP level of 2500 HP to attain the HP level of 5000 HP, but does so with no way to offset the synchronized operation to eliminate the harmonics from resonating into the fracking well 109.

Further, the increase in the quantity of conventional hydraulic pumps further increases the asset count, which increases the first costs as well as the cost of operation. Rather than having eight individual hydraulic pumps 136a-136n rated at the HP level of 5000 HP to obtain a total HP level of about 40,000 HP for the fracking site, the conventional hydraulic fracking systems require sixteen conventional hydraulic pumps rated at the HP level of 2500 HP to obtain the total HP level of 40,000 HP. In doing so, a significant cost is associated with the increased quantity of conventional hydraulic pumps. Further, conventional hydraulic pumps that fail to incorporate a medium-voltage VFD 132a-132n, a single-shaft electric motor 134a-134n, and a single hydraulic pump 136a-136n onto a single pump trailer 131 further increase the cost by increasing additional trailers and rigging required to set up the numerous different components at the fracking site. By contrast, the electric driven hydraulic fracking operation 100 may incorporate the power distribution system 120 to consolidate the power generated by the power generation system 110 and then limit the distribution and the cabling required to distribute the electric power to each of the single-pump pump configurations 130a-130n.

In certain embodiments, one or more auxiliary systems 190 may be positioned at the fracking site, and may also be electrically driven by the electric power generated by power generation system 110. The auxiliary systems 190 may assist each of the hydraulic pumps 136a-136n as well as the fracking equipment 142 as each of the hydraulic pumps 136a-136n operate to execute the fracking operation to extract the fluid from the fracking well 109. In doing so, the auxiliary systems 190 may be systems in addition to the fracking equipment 142 and the hydraulic pumps 136a-136n that are required to execute the fracking operation or otherwise desired by the party or parties performing and/or controlling the fracking operation.

For example, the auxiliary system 190 may include a hydration system that provides adequate hydration to the fracking media as the hydraulic pumps 136a-136n continuously pump the fracking media into the fracking well 109. As another example, an auxiliary system 190 may include an electric blender that blends the fracking media that is then pumped by the hydraulic pumps. Such an electric blender may operate using power distributed to the auxiliary system 190 by the power distribution system 120, for example power at a voltage level of about 4160V. Auxiliary systems 190 may include but are not limited to hydration systems, chemical additive systems, blending systems, mixing systems and/or any other type of system that is required or desired at the fracking site that may be electrically driven by the electric power generated by the power generation system 110 that will be apparent to those skilled in the relevant art(s) without departing from the spirit and scope of the disclosure.

The electric power generated by the power generation system 110 may thus be distributed by the power distribution system 120 such that the electric power generated by the power generation system 110 may also be incorporated to power the auxiliary systems 190. In doing so, the electric power generated by the power generation system 110 may be incorporated to not only drive the pump configurations 130a-130n via the medium-voltage VFDs 132a-132n positioned on each pump trailer 131a-131n but to also power the auxiliary systems 190 and/or auxiliary systems of the pump configurations 130a-130n. Thus, the hydraulic fracking operation 100 may be completely electrically-driven in that each of the required systems positioned on the fracking site may be powered by the electric power generated by the electric power that is consolidated to the power generation system 110.

As noted above, each medium-voltage VFD 132 may include a sophisticated control system that may control in real-time the operation of the corresponding single-shaft electric motors 134 and the individual hydraulic pumps 136 in order for the single-shaft electric motors 134 and the individual hydraulic pumps 136 to adequately operate to continuously pump the fracking media into the fracking well 109. However, the control system 180 that may be positioned at the fracking site and/or remote from the fracking site may also control the medium-voltage VFDs 132a-132n, and in doing so control the real-time operation of the single-shaft electric motors 134a-134n and the single hydraulic pumps 136a-136n in order for the single-shaft electric motors 134a-134n and the single hydraulic pumps 136a-136n to adequately operate to continuously pump the fracking media into the fracking well 109. In doing so, the control system 180 may intervene to control the medium-voltage VFDs 132a-132n when necessary. The control system 180 may additionally or alternatively control the fracking system 140 and/or the auxiliary systems 190 in order to ensure that the fracking operation is adequately executed to extract the fluid from the fracking well 109.

Communication between the control system 180 on the one hand and the medium-voltage VFDs 132a-132n, the fracking equipment 142, and/or the auxiliary systems 190 on the other hand may occur via wireless and/or wired connection communication. Wireless communication may occur via one or more networks 108 such as the internet. In some embodiments, the network 108 may include one or more wide area networks (WAN) or local area networks (LAN). The network(s) 108 may utilize one or more network technologies such as Ethernet, Fast Ethernet, Gigabit Ethernet, virtual private network (VPN), remote VPN access, a variant of IEEE 802.11 standard such as Wi-Fi, and the like. Communication over the network(s) 108 may take place using one or more network communication protocols including reliable streaming protocols such as transmission control protocol (TCP), Ethernet, Modbus, CanBus, EtherCAT, ProfiNET, and/or any other type of network communication protocol that will be apparent from those skilled in the relevant art(s) without departing from the spirit and scope of the present disclosure. Wired connection communication may occur but is not limited to a fiber optic connection, a coaxial cable connection, a copper cable connection, and/or any other type of direct wired connection that will be apparent from those skilled in the relevant art(s) without departing from the spirit and scope of the present disclosure. These examples are illustrative and not intended to limit the scope of the present disclosure.

Figure 4:
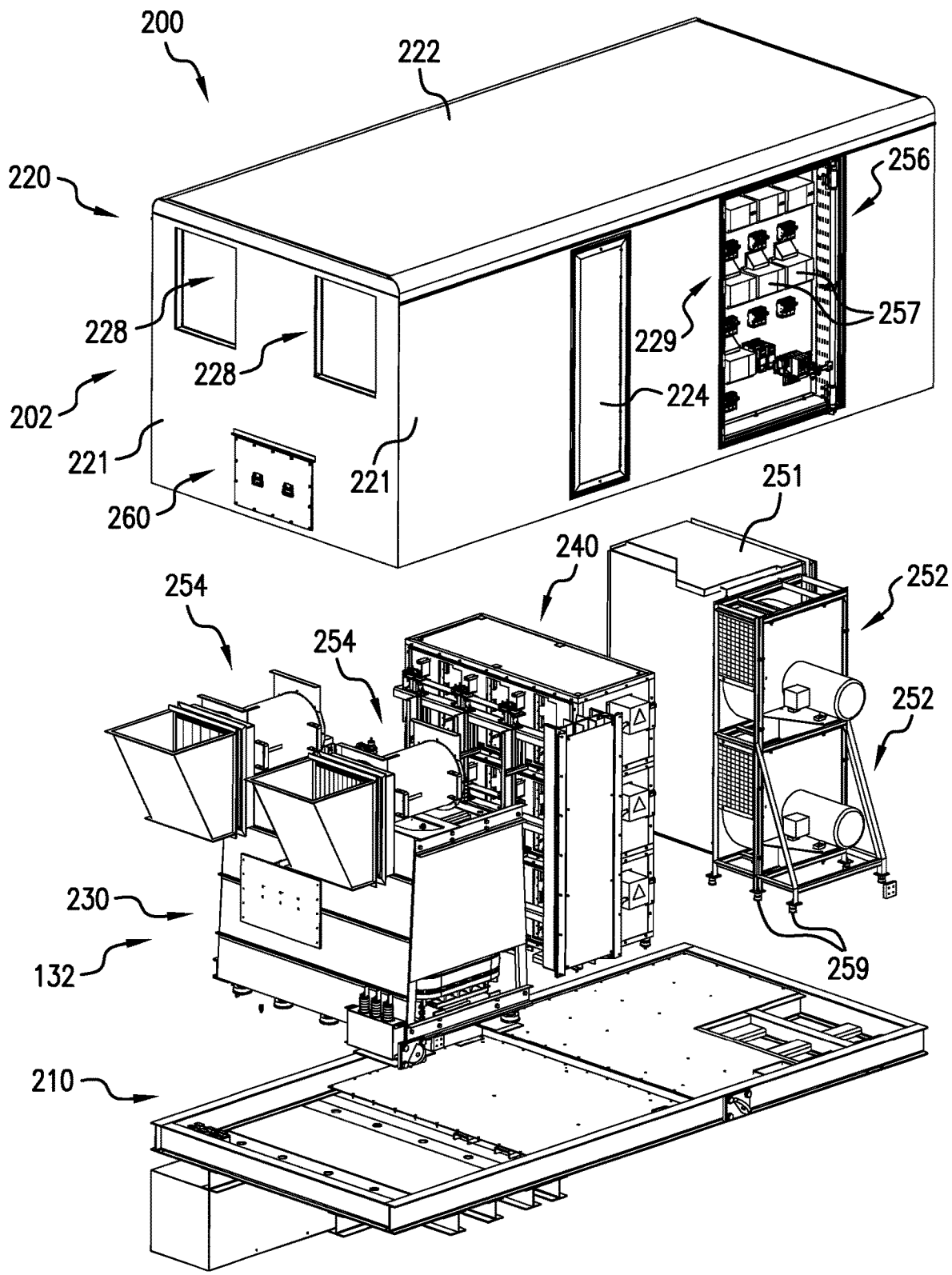
FIGS. 4 and 5 are partially-exploded assembly views of a VFD cabin according to certain embodiments.
Figure 5:
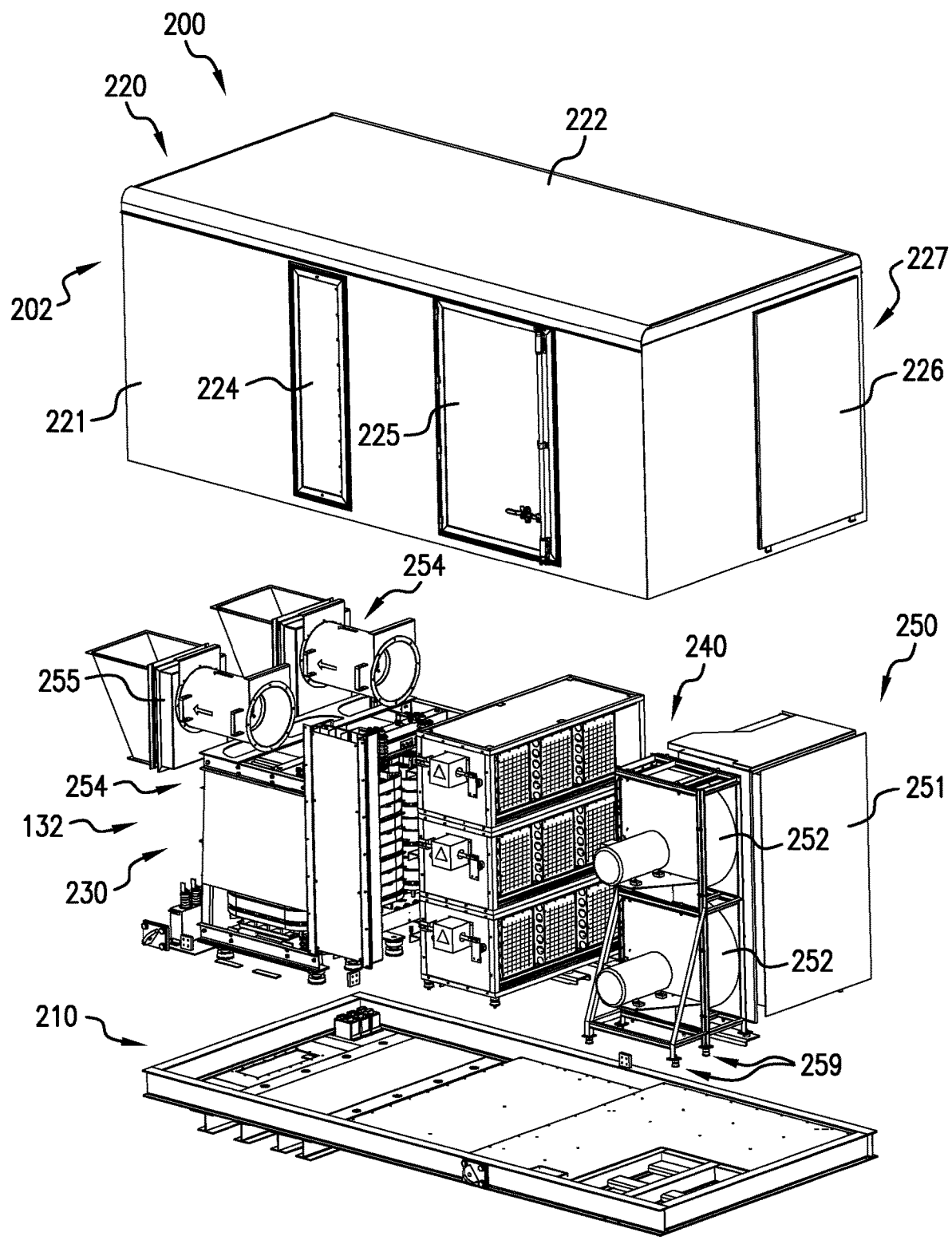
Figure 6:
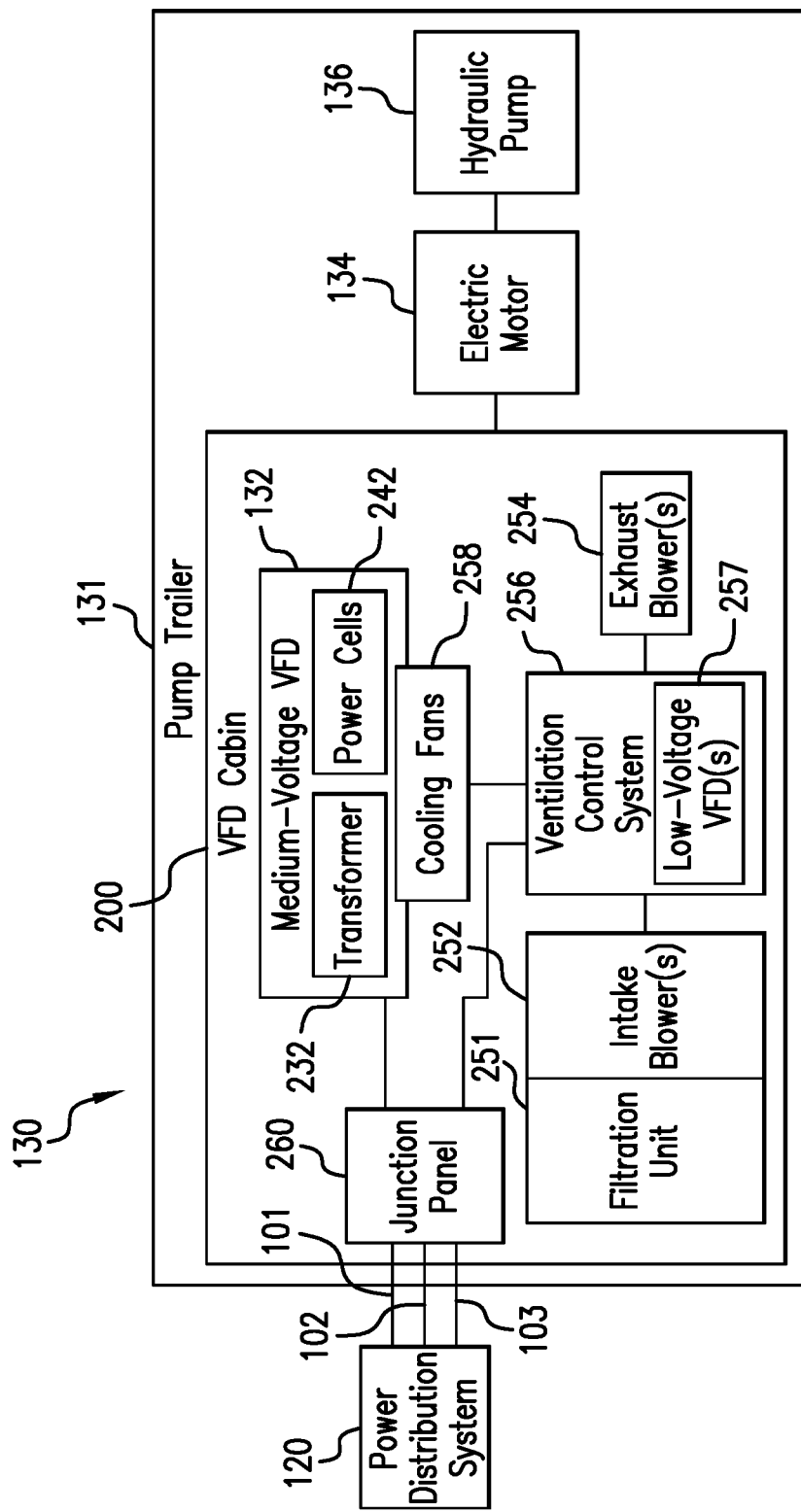
FIG. 6 is a schematic block diagram of a pump configuration including the VFD cabin illustrated in FIGS. 4 and 5.

With additional reference to FIGS. 4-6, the VFD cabin 200 generally includes a cabin housing 202 including a floor 210 and a cap 220, and the medium-voltage VFD 132 generally includes a transformer assembly 230 and a power cell assembly 240. The cabin housing 202 further houses a ventilation system 250 operable to circulate air to cool the medium-voltage VFD 132 during operation, and a junction panel 260 connected with the medium-voltage VFD 132 and the ventilation system 250.

The VFD cabin 200 may be connected with the power distribution system 120 via one or more lines, and in the illustrated embodiment is connected with the power distribution system 120 via a medium-voltage power line 101 and a low-voltage power line 102. As used herein, the term "low voltage" refers to voltages of about 1.0 kV or less. In certain embodiments, the VFD cabin 200 may further be connected with the power distribution system 120 via a communication line 103 such that the power distribution system 120 is able to control operation of the VFD cabin 200 (e.g., under control of the control system 180), and thereby to control operation of the hydraulic pump 136. In certain embodiments, the VFD cabin 200 may be in wireless communication with the power distribution system 120 such that the power distribution system 120 is operable to wirelessly communicate with the VFD cabin 200. As described herein, the lines 101-103 may connect to the cabin 200 via the junction panel 260, further details of which are provided below with reference to FIG. 12.

The floor 210 supports various internal components of the VFD cabin 200, and in the illustrated embodiment is configured for direct coupling with the pump trailer 131, for example via bolts and/or welding. This is in contrast to certain existing VFD cabins, in which a cabin cap is lowered onto a cabin floor to form a cabin housing, and the cabin housing is indirectly coupled to the trailer frame via a shock-absorbing suspension, such as airbags and/or springs. In such prior art cabins, the shock-absorbing suspension was required in order to isolate the relatively delicate electronic components of the VFD from the vibrations that are inherent to road travel, and which can be particularly severe when traveling to a remote fracking site. As described herein, however, the need for such a suspension between the cabin 200 and the trailer 131 may be obviated by the vibration-damping components provided within the cabin 200.

The cap 220 includes a plurality of sidewalls 221 and a roof 222, and is configured for mounting to the floor 210 to enclose the cabin 200. In certain forms, the cap 220 may include a skeleton or base structure on which a skin or external structure is mounted. While other materials are contemplated, in the illustrated form, the skeleton is formed of steel, the skin for the sidewalls 221 is formed of aluminum, and the skin for the roof 222 is formed composite. In certain embodiments, the cap 220 may be provided as a preformed cap that is lowered onto the floor 210 after installation of the transformer assembly 230 and/or one or more other internal components of the cabin 220. In other forms, the cap 220 may be built up from the floor 210 after installation of one or more internal components of the cabin 200, such as the transformer assembly 230.

One or more of the sidewalls 221 may have formed therein a maintenance hatch covered by a maintenance door 224 and/or a low-voltage VFD closet 229 covered by a low-voltage VFD closet door 225. The maintenance hatch and maintenance door 224 permit maintenance of certain internal components of the cabin 200 without requiring the maintenance personnel to enter the cabin 200. Similarly, the low-voltage VFD closet 229 and VFD closet door 225 permit maintenance of one or more low-voltage VFDs 257 from outside the cabin 200, thereby obviating the need for maintenance personnel to enter the higher-voltage environment of the cabin interior. In certain forms, the components of the cabin 200 most likely to require service are accessible via one or more maintenance doors 224 and/or the low-voltage VFD closet door 225. Accordingly, the cabin 200 may lack an entry door sized and shaped to permit entry into the cabin interior, thereby preventing personnel from entering the medium-voltage environment within the cabin 200. In such embodiments, should one or more components inaccessible via the doors 224, 225 require maintenance or replacement, the cap 220 may need to be removed in order to permit such maintenance or replacement, and the cap 220 may be removably coupled to the floor 210 to facilitate such removal. In other embodiments, the cap 220 may include an entry door in order to permit entry into the cabin interior.

One of the sidewalls 221 includes an air intake port 227, which in the illustration of FIG. 4 is covered by a sliding door 226 that covers a filtration unit 251 of the ventilation system at least during transport of the cabin 200. As will be appreciated, the sliding door 226 may be opened prior to operation of the ventilation system 250 to expose the intake port 227 to permit intake air to flow into the filtration unit 251 under the force of one or more intake blowers 252. In certain embodiments, the sliding door 226 may be equipped with a prop switch that detects whether the door 226 is propped, and operation of the ventilation system 250 may be controlled based upon information received from the prop switch. One of the sidewalls 221 includes one or more air outlet ports 228 that permit expulsion of air from the cabin 200. While other locations are contemplated, in the illustrated form, the air intake port 227 and the air outlet ports 228 are respectively positioned on the fore and aft end walls of the cabin cap 220.

Figure 7:
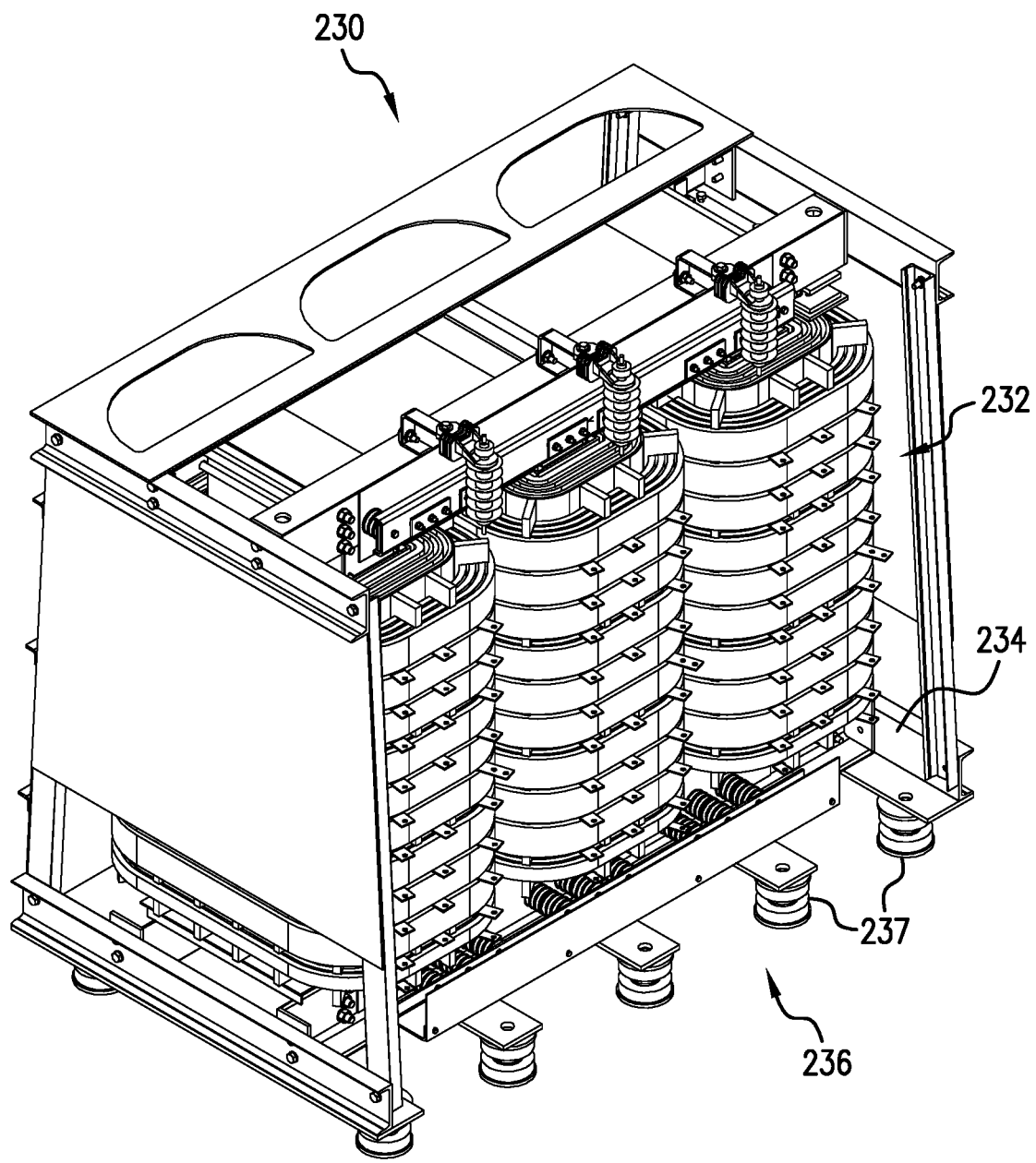
FIG. 7 is a perspective view of a transformer assembly according to certain embodiments.

With additional reference to FIG. 7, the transformer assembly 230 generally includes a transformer 232, a transformer assembly frame 234 to which the transformer 232 is mounted, and a vibration damping assembly 236 through which the frame 234 is mounted to the cabin floor 210. The transformer 232 is connected between the medium-voltage line 101 and the power cell assembly 240, and is configured to transform the medium-voltage power received via the medium-voltage line 101 to a transformer voltage that is suitable for use by the power cell assembly 240, such as about 750V. The vibration damping assembly 236 includes a plurality of vibration damping couplers 237, each of which aids in coupling the frame 234 to the floor 210 while reducing vibrations transmitted from the cabin floor 210 to the frame 234. An example form of a vibration damping coupler 300 that may be used as the vibration damping couplers 237 is described below with reference to FIGS. 13 and 14.

Figure 8:
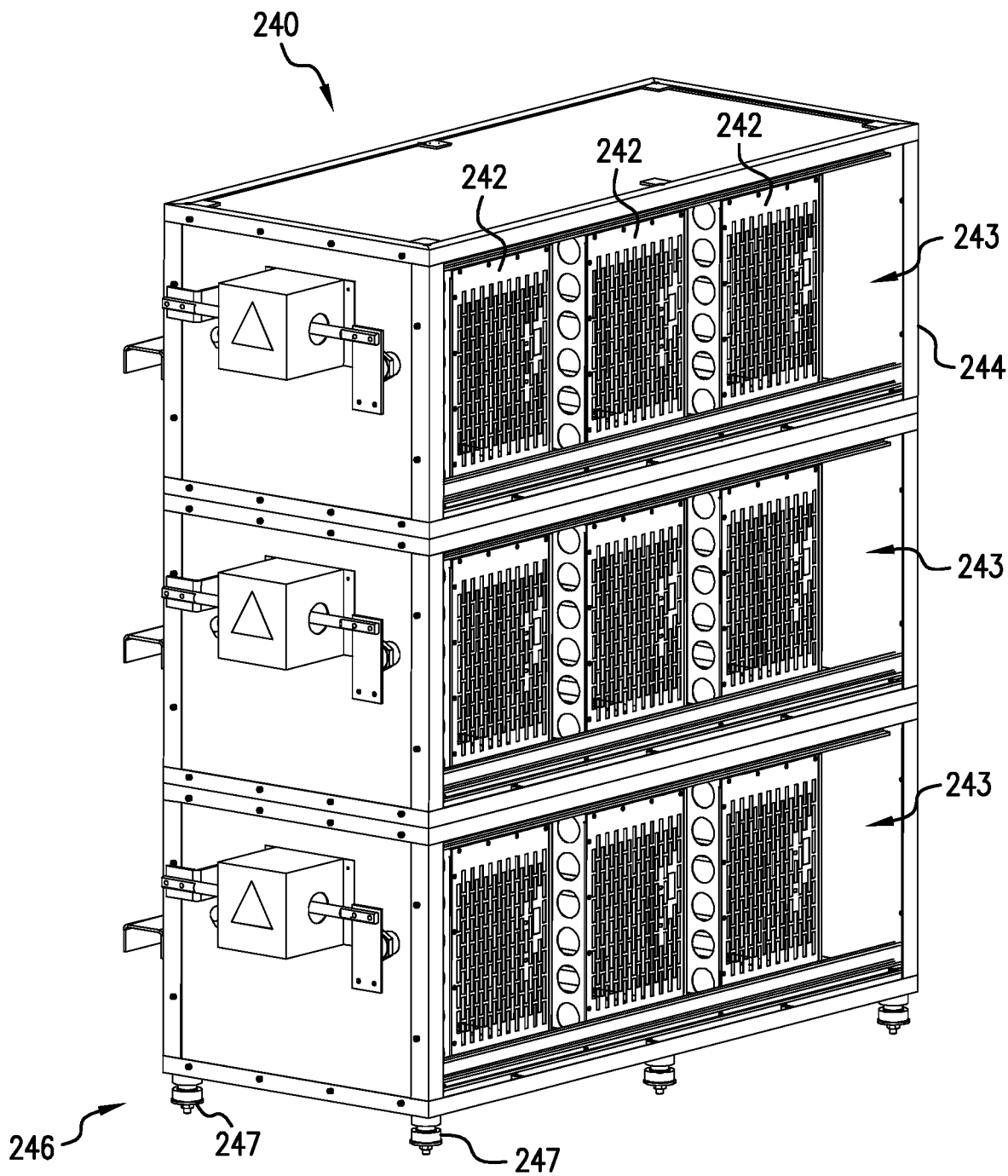
FIG. 8 is a perspective view of a power cell assembly according to certain embodiments.
Figure 9:
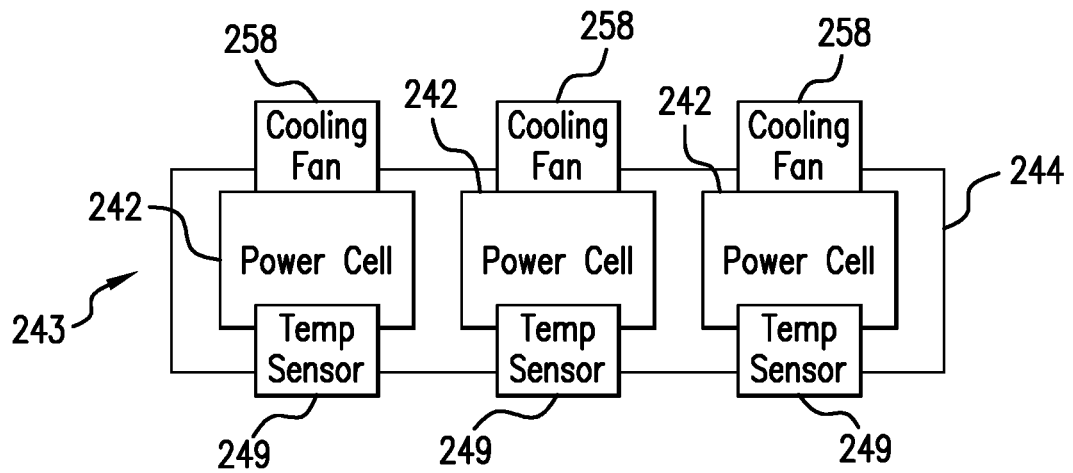
FIG. 9 is a schematic diagram of a power stack according to certain embodiments.
Figure 10:
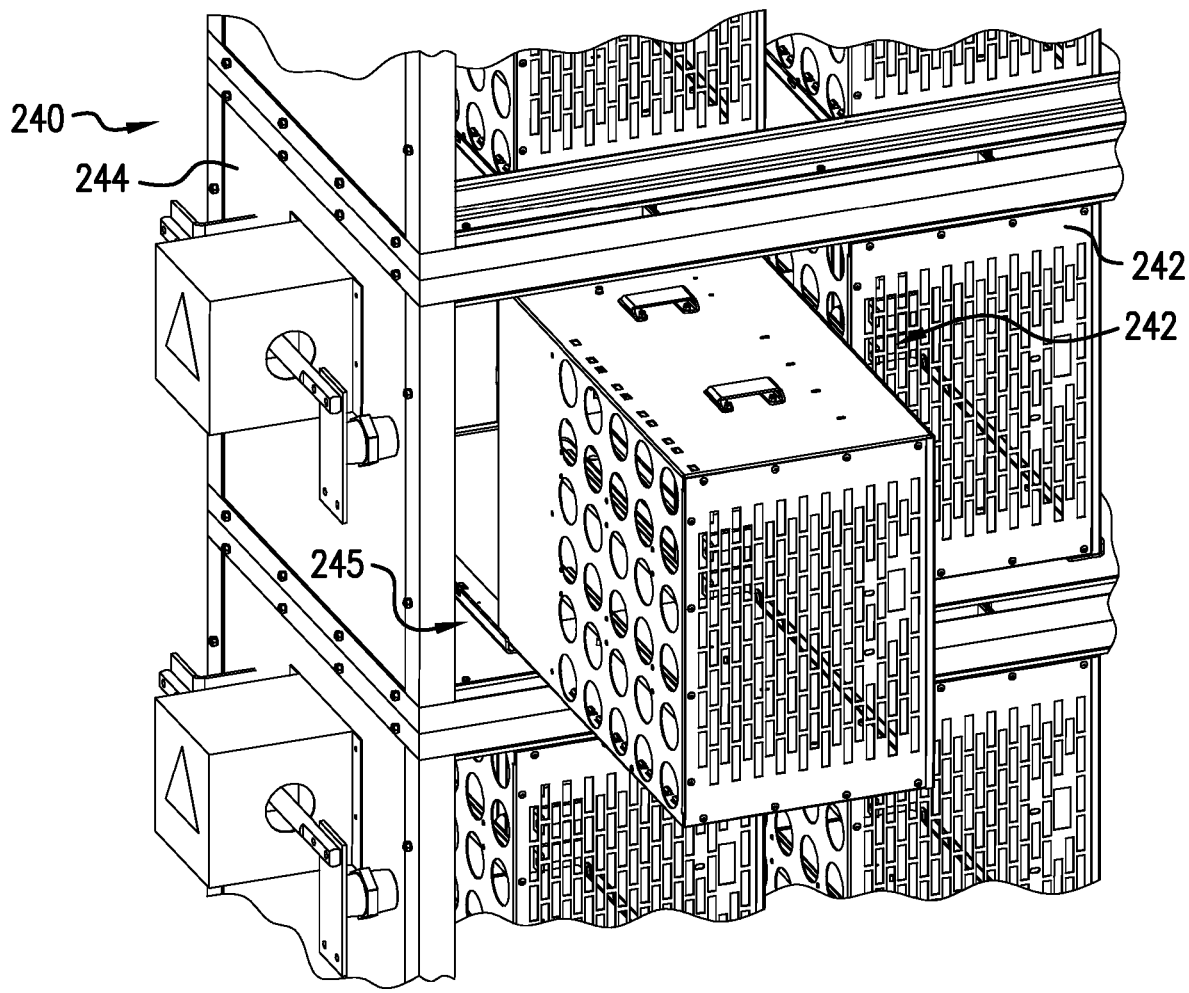
FIG. 10 is a perspective view of the power cell assembly illustrated in FIG. 8 with a power cell being extracted along a pair of slide rails.

With additional reference to FIGS. 8-10, the power cell assembly 240 generally includes a plurality of power cells 242, a power cell assembly frame 244 to which the plurality of power cells 242 are mounted, a vibration damping assembly 246 through which the frame 244 is mounted to the cabin floor 210, and a plurality of temperature sensors 249. The power cells 242 are arranged in stacks 243, each stack 243 including three power cells 242 corresponding to the three phases of three-phase alternating current (AC). Each stack 243 is configured to step up the three-phase AC power received from the transformer 232 at the transformer voltage level to a higher voltage such that the power output from the medium-voltage VFD 132 is in a form suitable to drive the corresponding single-shaft electric motor 134. For example, each stack 243 may step up the voltage by about 750V. In certain embodiments, each power cell 242 accepts a voltage of approximately 750 VAC and produces a single phase AC voltage, and these voltages are combined in series per each phase to create a three-phase output suitable to control the electric motor 134. Further details regarding the electrical operation of the medium-voltage VFD 132 can be found in the above-referenced U.S. patent application Ser. No. 16/790,581.

In the illustrated embodiment, each power cell 242 is mounted to the frame 244 via one or more slide rails 245, which facilitate removal and replacement of the individual power cells 242. Additionally, each power cell 242 has a dedicated temperature sensor 249 and a dedicated cooling fan 258, with the cooling fans 258 comprising a portion of the ventilation system 250. As with the above-described vibration damping assembly 236, the vibration damping assembly 246 includes a plurality of vibration damping couplers 247, each of which aids in coupling the frame 244 to the cabin floor 210 while reducing vibrations transmitted from the floor 210 to the frame 244. An example form of vibration damping coupler 300 that may be used as the vibration damping couplers 247 is described below with reference to FIGS. 13 and 14.

The ventilation system 250 generally includes one or more intake filtration units 251 positioned at the one or more intake ports 227, one or more intake blowers 252 connected with the filtration unit(s) 251, one or more exhaust blowers 254 positioned at the exhaust port 228, and a ventilation control system 256 in communication with the intake blower(s) 252 and the exhaust blower(s) 254. The ventilation system 250 further includes the plurality of cooling fans 258, which may also be in communication with the ventilation control system 256.

The filtration unit 251 comprises one or more filters that filter the air being drawn into the cabin 200 under the charging of the intake blower(s) 252. In certain embodiments, one or more of the filters provided in the filtration unit 251 may be a hydrophobic filter. When the sliding door 226 is open and the intake port 227 is exposed, the at least one intake blower 252 is operable to draw air into the cabin 200 via the intake port 227 and the filtration unit 251 under the control of the ventilation control system 256. The filtration unit(s) 251 may be sealed to the intake blower(s) 252 to ensure that all air drawn into the intake blowers 252 first passes through the filtration unit(s) 251. The at least one exhaust blower 254 is configured to blow air from the cabin interior through the exhaust port(s) 228 to cause the air to exit the cabin 200. In certain embodiments, the total cubic feet per minute (CFM) rating of the intake blower(s) 252 may be greater than the total CFM rating of the exhaust blower(s) 254. In certain embodiments, an exhaust filter 255 may be positioned at the exhaust port 228 to discourage the entry of contaminants (e.g., dust and debris) into the cabin 200 when the ventilation system 250 is idle.

In the illustrated form, the ventilation control system 256 includes one or more low-voltage VFDs 257 by which the intake blower 252, the exhaust blower 254, and/or the cooling fans 258 are controlled. In certain forms, the one or more low-voltage VFDs 257 control operation of the blowers 252, 254 and/or the cooling fans 258 using power supplied by the power distribution system 120 via the low-voltage power line 102. In certain embodiments, the control system 256 includes multiple low-voltage VFDs 257, each of which is dedicated to a corresponding one of the blowers 252, 254. By way of example, the ventilation system 250 may include a pair of intake blowers 252 and a pair of exhaust blowers 254, and the ventilation control system 256 may include four low-voltage VFDs 257, each dedicated to controlling operation of a respective one of the blowers 252, 254. In such forms, the provision of multiple low-voltage VFDs 257 enables the operating speed of the blowers 252, 254 to be ramped up and ramped down as needed. This is in contrast to certain conventional systems, in which intake and exhaust blowers are operated solely as on/off blowers. Due to the fact that blowers can contribute a significant amount of acoustic noise to a fracking operation, the additional control afforded by providing each blower 252, 254 with a dedicated low-voltage VFD 257 may enable the cabin 200 to produce less noise when the full degree of cooling is not required.

The ventilation control system 256 may receive power via the low-voltage line 102, which may be connected with the ventilation control system 256 via the junction panel 260. While other voltages are contemplated, in certain forms, the low-voltage line 102 may provide power to the ventilation control system 256 at a low-voltage voltage level of about 480V. In the illustrated form, the low-voltage VFDs 257 are positioned in a VFD closet 229 that is accessible via the VFD closet door 225 such that the low-voltage VFD 257 can be accessed from the exterior of the cabin 200 without requiring maintenance personnel to enter the higher-voltage interior of the cabin 200.

As noted above, the sliding door 226 that covers the intake filtration unit 251 during transport may be equipped with a prop switch that detects the open/closed position of the door 226. In certain embodiments, the ventilation control system 256 may control operation of the ventilation system 250 based upon information received from the prop switch (e.g., information indicating the open/closed position of the door 226). For example, the ventilation control system 256 may limit operation of the intake blower(s) 252 to times at which the prop switch indicates that the door 226 is open. By way of illustration, it may be the case that the door 226 has been closed in an attempt to warm up the functional components of the medium-voltage VFD 132, and the ventilation control system 256 may cause the ventilation system 250 to remain idle during such a warming procedure.

The ventilation system 250 also includes or is in communication with the plurality of temperature sensors 249, each of which may be dedicated to a corresponding one of the power cells 242 as noted above. In certain embodiments, the ventilation control system 256 may control operation of the cooling fans 258 based upon information received from the temperature sensors 249. For example, in the event that a particular temperature sensor 249 indicates that the temperature of the corresponding power cell 242 has increased, the ventilation control system 256 may cause the corresponding cooling fan 258 to increase in speed. When the temperature sensor 249 indicates that the temperature of the corresponding power cell 242 has fallen, the ventilation control system 256 may reduce the speed of the corresponding cooling fan 258. In certain embodiments, each cooling fan 258 is rated to provide about 650 CFM of airflow or more.

As noted above, one issue that frequently arises in the context of fracking operations is the presence of dust and debris in the air. Should this dust and debris make its way into the VFD cabin 200, the power cells 242 may become damaged or degraded. However, the VFD cabin 200 includes certain features that may discourage such entry of contaminants into the cabin 200. As one example, the intake filtration unit 251 serves to filter the air entering the cabin 200, such as when the intake blower 252 is operated to draw air into the cabin 200 via the intake port 227. The exhaust port(s) 228 may similarly be provided with filter(s) 255 to discourage the entry of dust when the ventilation system 250 is idle. Additionally, the sliding door 226 serves to cover the intake port 227 during transport and times of non-use, thereby protecting the filtration unit 251 from the gusts and sustained winds that may otherwise damage the filtration unit 251.

A further feature of the ventilation system 250 that may aid in discouraging the entry of dust and debris is the creation of an overpressure condition within the cabin 200. As used herein, the term "overpressure condition" indicates that the pressure within the cabin 200 is greater than the pressure outside the cabin 200. As a result of this overpressure condition, any dust or debris that may otherwise make its way through cracks or openings within the cabin housing 202 will instead be blown away from the cabin interior. In certain forms, the overpressure condition may be created by operating the intake blower(s) 252 at a higher rate than the exhaust blower(s) 254 is/are operated. By way of illustration, the intake blower(s) 252 may be controlled to provide an intake airflow rate of about 14,000 CFM, while the exhaust blower(s) 254 may be operated to provide an exhaust airflow rate of about 12,000 CFM. As will be appreciated by those skilled in the art, such a difference in intake flowrate and exhaust flowrate will generally create an overpressure condition within the enclosed cabin 200 to discourage dust and debris from infiltrating into the cabin 200 through any cracks or openings that may be present in the cabin housing 202. As noted above, the blowers 252, 254 may be controlled by dedicated low-voltage VFDs 257. In such forms, the ventilation control system 256 may cause the low-voltage VFDs 257 to control the intake blower(s) 252 and the exhaust blower(s) 254 such that the total intake CFM provided by the one or more intake blowers 252 exceeds the total exhaust CFM provided by the one or more exhaust blowers 254.

Figure 11:
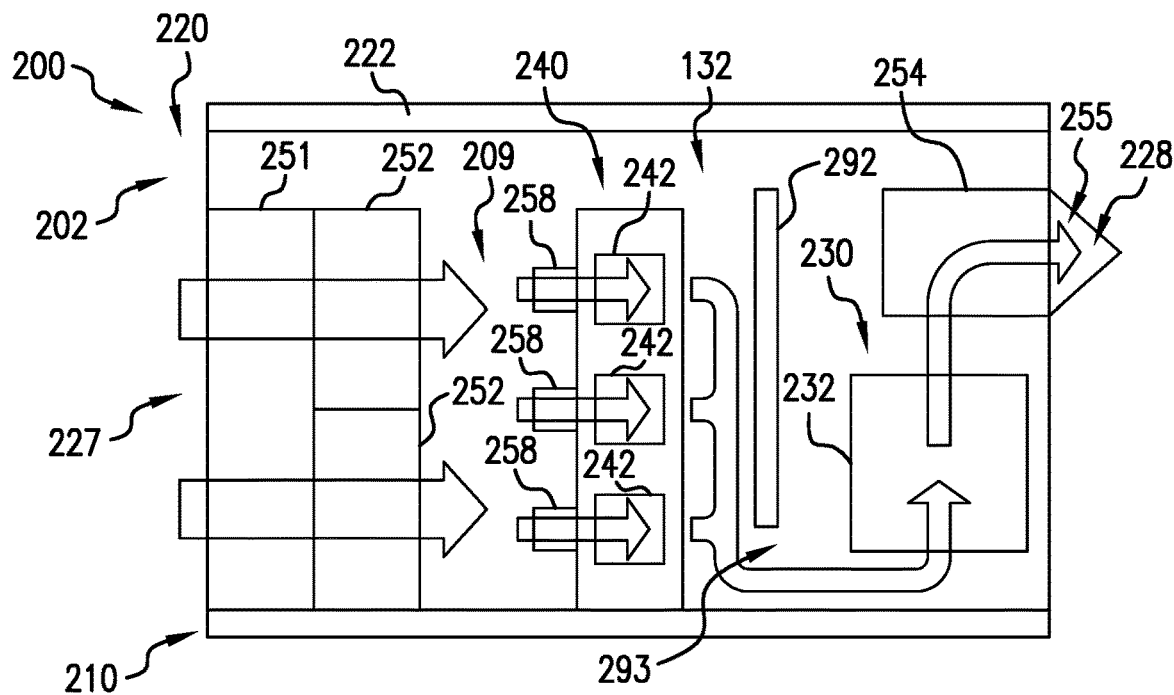
FIG. 11 is a schematic diagram of the cabin illustrated in FIGS. 4 and 5, and schematically illustrates an airflow stream that is generated by operation of a ventilation system.

With additional reference to FIG. 11, operation of the ventilation system 250 results in the generation of an airstream 209 that generally travels or flows from the intake port 227 to the exhaust port 228. The transformer assembly 230 and the power cell assembly 240 are positioned within this airstream 209 such that the airstream 209 cools the transformer 232 and the power cells 242 as the relatively cooler air flows over the relatively warmer electrical components. Typically, the transformer 232 will run at a higher temperature than the power cells 242. In order to ensure that the power cells 242 receive relatively cooler air (i.e., air that has not been heated by the relatively hot transformer 232), the power cells 242 may be positioned in the airstream 209 upstream of the transformer 232 and the transformer 232 may be positioned in the airstream 209 downstream of the power cells 242.

In certain embodiments, the cabin 200 may include an internal wall 292 in the vicinity of the transformer 232 with a gap 293 below the wall 292 and/or openings 293 positioned at the lower end of the wall 292. Such a wall 292 may serve to direct the airstream 209 downward after the airstream 209 exits the power cell assembly 240 such that the majority of the airstream 209 enters the transformer 232 from the bottom of the transformer 232. In such forms, the airstream 209 may flow upward through the transformer 232 and exit via the top of the transformer 232, from which location the airstream 209 may be directed to the exhaust port 228 by the exhaust blower 254.

Figure 12:
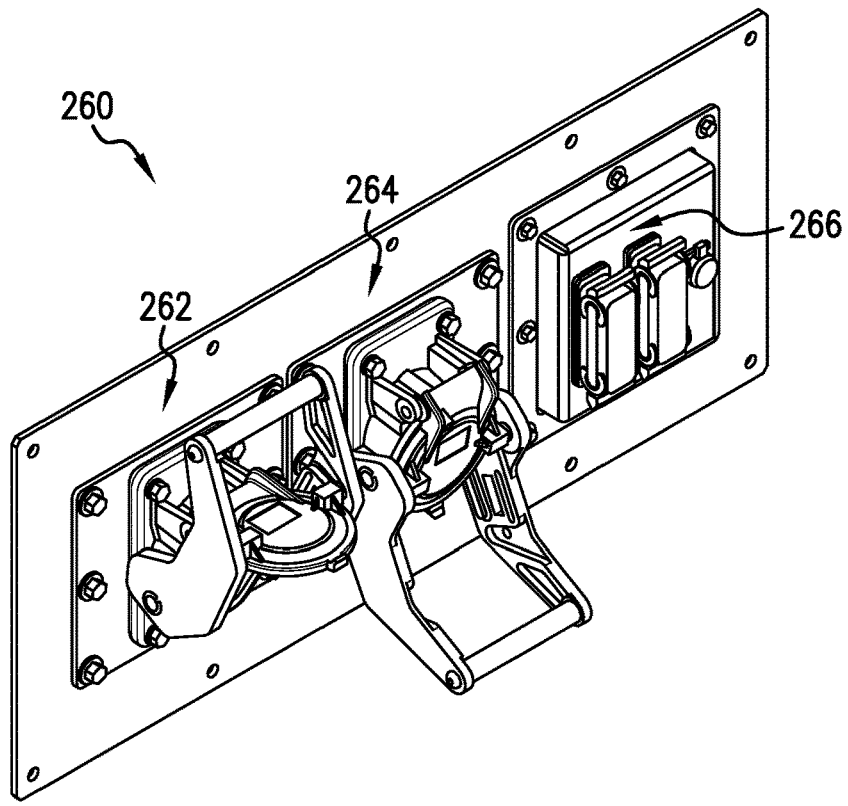
FIG. 12 is a perspective view of a junction panel according to certain embodiments.

With additional reference to FIG. 12, the illustrated junction panel 260 generally includes a medium-voltage connector 262, a low-voltage connector 264, and a communication cable connector 266. The medium-voltage connector 262 is configured for connection with the medium-voltage power line 101, and is connected with the medium-voltage VFD 132 such that the medium-voltage VFD 132 is operable to receive power from the medium-voltage power line 101 via the junction panel 260. The low-voltage connector 264 is configured for connection with the low-voltage power line 102, and is connected with the ventilation control system 250 such that the ventilation control system 250 is operable to receive power from the low-voltage power line 102 via the junction panel 260. The low-voltage connector 264 may further be connected with auxiliary systems of the electric motor 134 and/or auxiliary systems of the hydraulic pump 136 such that the auxiliary systems are operable to receive power from the low-voltage power line 102 via the junction panel 260. The communication cable connector 266 is configured for connection with the communication cable 103, and is connected with the medium-voltage VFD 132 such that the medium-voltage VFD 132 is operable to receive electrical signals and/or commands via the junction panel 260.

In certain embodiments, the medium-voltage connector 262 and the low-voltage connector 264 may be of different sizes, different shapes, and/or different configurations such that the medium-voltage line 101 cannot couple with the low-voltage connector 264 and the low-voltage line 102 cannot couple with the medium-voltage connector 262. In certain forms, the power distribution system 120 may include a plurality of junction panels along the lines of the junction panel 260, with each junction panel of the power distribution system 120 corresponding to a respective one of the pump configurations 130a-130n.

Figure 13:
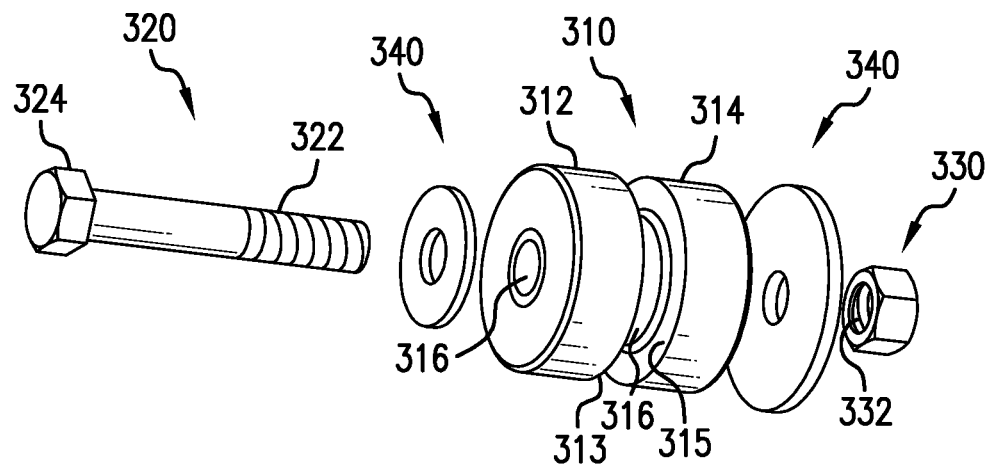
FIG. 13 is a partially exploded assembly view of a vibration damping coupler according to certain embodiments.

With additional reference to FIG. 13, illustrated therein is an example of a vibration damping coupler 300 that may be utilized in connection with certain embodiments. In certain embodiments, the vibration damping couplers 237 of the transformer assembly 230 may be provided along the lines of the vibration damping coupler 300. In certain embodiments, the vibration damping couplers 247 of the power cell assembly 240 may be provided along the lines of the vibration damping coupler 300. The illustrated vibration damping coupler 300 generally includes a vibration damper 310, a bolt 320, and a nut 330, and may further include one or more washers 340.

The vibration damper 310 generally includes a first portion 312 and a second portion 314 separable from the first portion 312, and an aperture 318 extends through the first portion 312 and the second portion 314. The first portion 312 includes a shoulder 313 that faces the second portion 314. The second portion 314 also includes a shoulder 315 that faces the first portion 312, and further includes a neck 316. The vibration damper 310 is formed of a vibration-damping material that is softer or more pliant than the metal of the cabin floor 210 and the frames 234, 244, and is thereby operable to reduce the transmission of vibrations between the cabin floor 210 and the frames 234, 244. In certain embodiments, the vibration damper 310 may be formed of an elastic material, a rubber, a plastic, and/or another form of vibration damping material.

The bolt 320 is sized and shaped to extend through the vibration damper 310 and the washers 340, and includes a threaded portion 322 configured to engage internal threads 332 of the nut 330. In the illustrated form, a first washer 340 is positioned between a head 324 of the bolt 320 and the outer face of the first portion 312, and a second washer 340 is positioned between the nut 330 and the outer face of the second portion 314.

Figure 14:
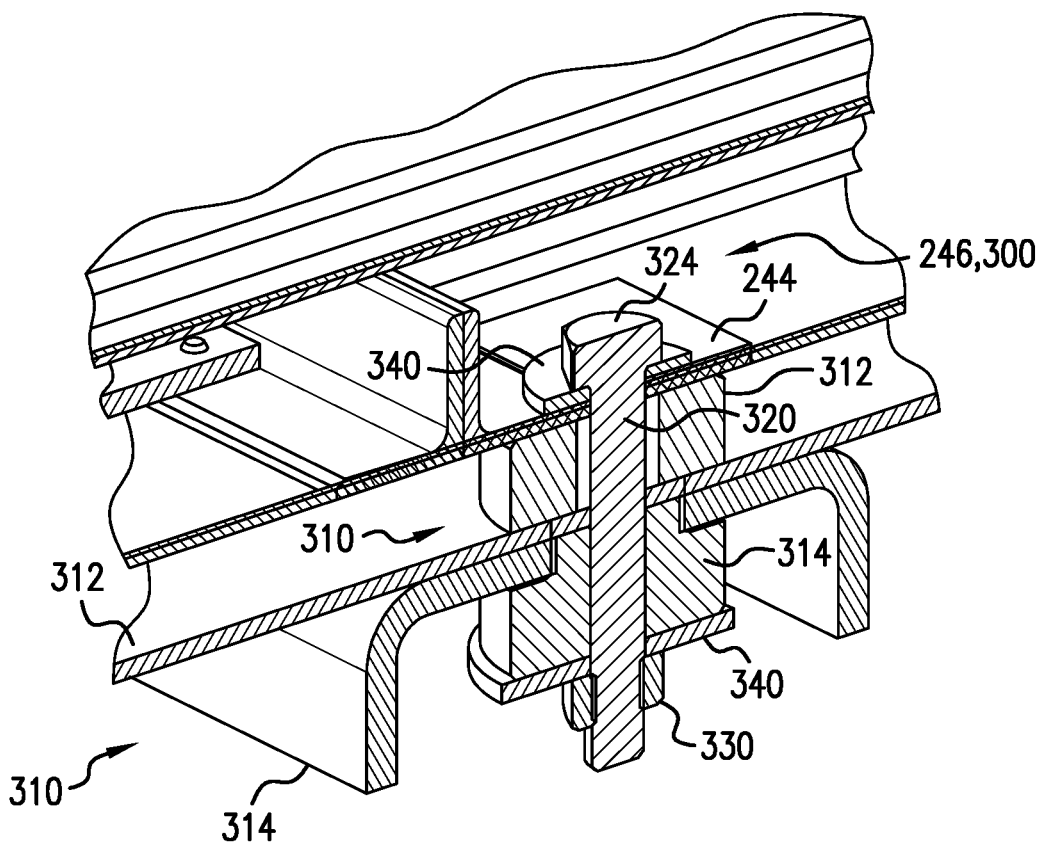
FIG. 14 is a cutaway view of the vibration damping coupler in use.

With additional reference to FIG. 14, in certain embodiments, the vibration damping couplers 247 of the vibration damping assembly 246 of the power cell assembly 240 may be provided along the lines of the vibration damping coupler 300. By way of illustration, the first portion 312 may be positioned between the power cell assembly frame 244 and a floor panel 212 of the cabin floor 210 such that the aperture 318 aligns with apertures in the first washer 340, the frame 244, and the floor panel 212. Similarly, the second portion 314 may be positioned on an opposite lower side of the floor 210 (e.g., within a reinforcing channel 214 of the cabin floor 210) such that the aperture 318 formed in the second portion 314 aligns with the aperture 318 formed in the first portion 312. The bolt 320 may then be inserted through the aligned apertures and engaged with the nut 330. The nut 330 and bolt 320 may then be tightened such that the first portion 312 is captured between the frame 244 and the floor 210 while the second portion 314 is captured between the nut 330 and the floor 210.

In the configuration illustrated in FIG. 14, the first portion 312 is captured between the frame 244 and the floor 210, and the second portion 314 is captured between the nut 330 and the floor 210. As a result, neither the metal of the coupled nut-bolt combination nor the metal of the frame 244 directly contacts the metal of the floor 210, but is instead isolated from the floor 210 by the material of the damper 310. The damper 310 is formed of a relatively soft material in comparison to the relatively hard metal of the floor 210 and the frame 244, and the material of the damper 310 is selected to dampen vibrations that would otherwise be transmitted from the floor 210 to the frame 244. In certain embodiments, the damper 310 may be formed of an elastic material, such as an elastomer or rubber. In certain embodiments, the damper 310 may be provided as a spring.

In certain embodiments, the vibration damping couplers 237 of the vibration damping assembly 236 of the transformer assembly 230 may be provided along the lines of the vibration damping coupler 300. Those skilled in the art will readily appreciate that in such forms, the vibration damping couplers 237/300 may be utilized to couple the transformer assembly frame 234 to the cabin floor 210 in a manner analogous to that described above with reference to the coupling of the power cell assembly frame 242 to the floor 210 by the vibration damping couplers 247. In certain embodiments, the intake blowers 252 of the ventilation system 250 may be mounted to the cabin floor 210 via one or more additional vibration damping couplers 259, such as vibration damping couplers along the lines of the vibration damping coupler 300.

Oftentimes, the transformer assembly 230 will be significantly heavier than the power cell assembly 240. As such, it may be the case that the transformer assembly 230 and the power cell assembly 240 have different vibrational characteristics and/or different support requirements. In order to accommodate these differences, the overall stiffness of the vibration damping assembly 236 of the transformer assembly 230 may be greater than the overall stiffness of the vibration damping assembly 246 of the power cell assembly 240. Similarly, should the intake blowers 252 be mounted to the cabin floor 210 via vibration damping couplers 259, the overall stiffness of the vibration damping couplers 259 coupling the blowers 252 to the cabin floor may be less than the overall stiffness of the vibration damping couplers 237 coupling the transformer assembly 230 to the cabin floor 210.

As noted above, in certain embodiments, the VFD cabin 200 is mounted directly to the trailer 131 without an intervening suspension. For example, the VFD cabin 200 may be mounted to the trailer 131 via bolts and/or welding. This is in contrast to certain existing VFD cabins, which required the intervening suspension for reasons described above. In the current VFD cabin 200, however, the need for the intervening suspension is reduced or eliminated due to the provision of the vibration damping couplers. In addition to reducing costs by obviating the need for the more-expensive suspension, the use of vibration damping couplers allows for each component or subassembly of the cabin 200 to be mounted to the cabin floor 210 via a vibration damping assembly having vibration damping characteristics (e.g., stiffness) tailored to the needs of the particular component or subassembly. For example, as noted above, the transformer assembly 230 may be mounted to the cabin floor 210 via a vibration damping assembly 236 having a first overall stiffness, the power cell assembly 240 may be mounted to the cabin floor 210 via a vibration damping assembly 236 having a second overall stiffness, and the first overall stiffness may be greater than the second overall stiffness to account for the greater mass of the transformer assembly 230 in comparison to the power cell assembly 240.

As noted above, the vibration damping assemblies described herein may aid in isolating the operating components of the cabin 200 from the cabin floor 210 during times of transport, when the pump configuration 130 is not operating to pump the fracking media. The vibration damping assemblies 236, 246 may further aid in isolating the corresponding subsystems from vibration of the cabin floor 210 during operation of the pump configuration 130, which may entail significant vibrations due to the operation of the motor 134 and the pump 136. This damping of vibrations can be a significant factor in reducing the flexing of the metal components of the medium-voltage VFD 132. In the medium-voltage environment within the cabin 200, such flexing can result in electrical arcing, which can result in short circuit conditions and/or damage to the components of the cabin 200. Thus, the vibration damping assemblies may aid in protecting the VFD 132 not only from mechanical shock damage during transport, but also from electrical shock damage during operation.

Figure 15:
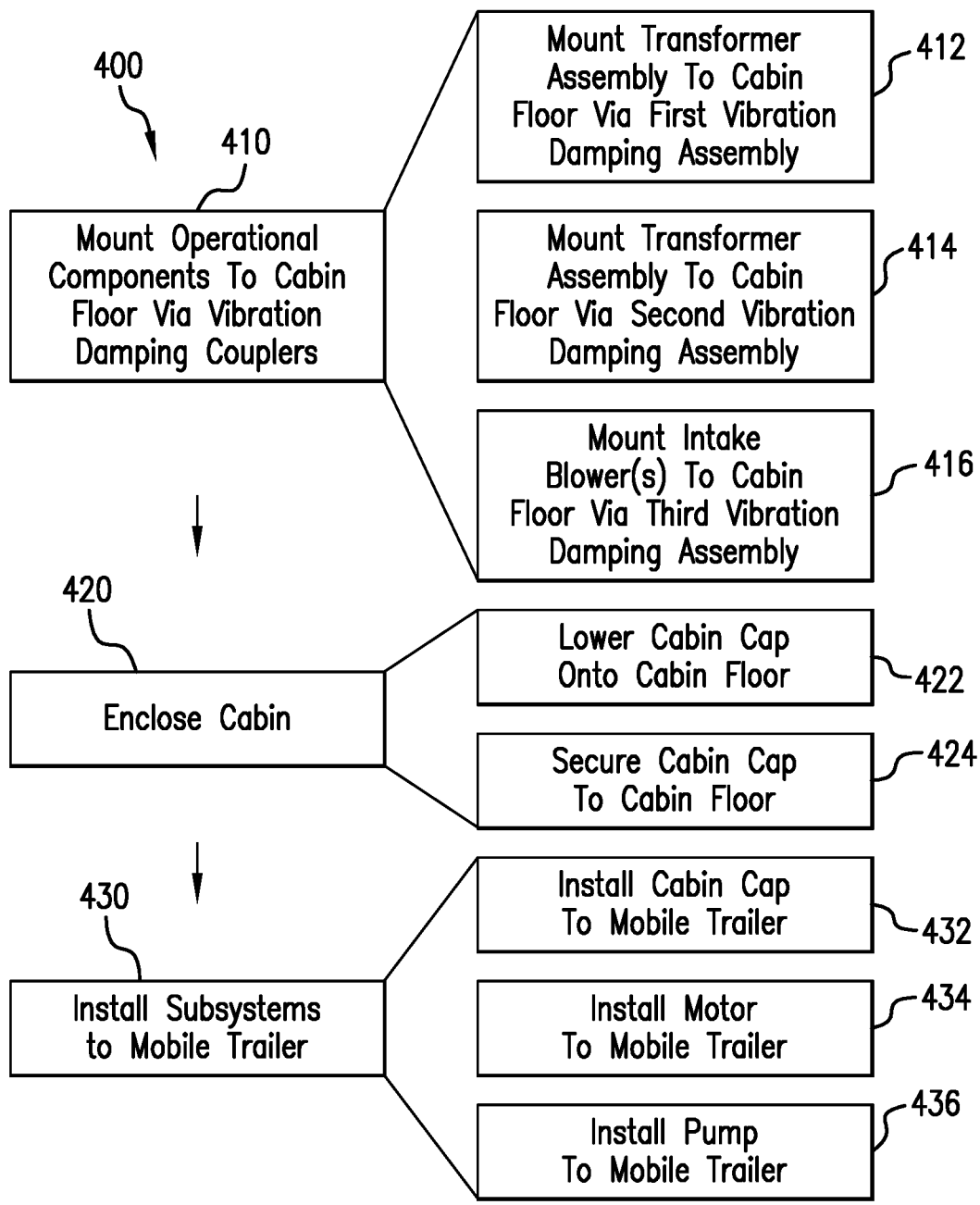
FIG. 15 is a schematic flow diagram of a process according to certain embodiments.

With additional reference to FIG. 15, certain embodiments of the present application relate to a process 400 for manufacturing a VFD cabin and/or a pump configuration including such a VFD cabin. Blocks illustrated for the processes in the present application are understood to be examples only, and blocks may be combined or divided, and added or removed, as well as re-ordered in whole or in part, unless explicitly stated to the contrary. Additionally, while the blocks are illustrated in a relatively serial fashion, it is to be understood that two or more of the blocks may be performed concurrently or in parallel with one another. Moreover, while the process 400 will be described with specific reference to the above-described VFD cabin 200 and pump configuration 130, it is to be appreciated that the process 400 may be performed to manufacture a VFD cabin and/or a pump configuration having additional or alternative features. By way of illustration, although the process 400 is described as being performed to manufacture the above-described VFD cabin 200 and pump configuration 130, the process 500 may additionally or alternatively be performed to manufacture the VFD cabin 700 and pump configuration 630 described below with reference to FIGS. 17-22.

The process 400 generally includes a mounting procedure 410, an enclosing procedure 420, and an installation procedure 430. As described herein, the mounting procedure 410 generally involves mounting a plurality of operational components to a cabin floor, the enclosing procedure 420 generally involves installing a cabin cap to the cabin floor to thereby enclose the cabin, and the installation procedure 430 generally includes installing the cabin and/or additional components to a mobile trailer.

The process 400 may include a mounting procedure 410, which generally involves mounting a plurality of operational components to a cabin floor, such as the cabin floor 210. The illustrated mounting procedure 410 includes block 412, which generally involves mounting a transformer to a cabin floor via a first vibration damping assembly. In certain embodiments, block 412 may involve mounting the transformer 232 to the cabin floor 210 via the vibration damping assembly 236. Given the mass of the transformer 232, block 412 may, for example, involve lifting the transformer 232 into position on the cabin floor 210 using a crane. Due to the fact that the cap 220 is not yet installed, the crane will be able to lift the transformer 232 into position without having to negotiate certain obstacles that would otherwise be present (e.g., a roof and/or sidewalls of the cabin). With the transformer 232 in position, the frame 234 to which the transformer 232 is mounted may be secured to the cabin floor 210 via the vibration damping assembly 236. As noted above, the vibration damping assembly 236 may include a plurality of vibration damping couplers 237, such as the vibration damping couplers 300.

The illustrated mounting procedure 410 further includes block 414, which generally involves mounting a power cell assembly to the cabin floor via a second vibration damping assembly. In certain embodiments, block 414 may involve mounting the plurality of power cells 242 to the cabin floor 210 via the vibration damping assembly 246. In certain embodiments, block 414 may involve mounting the frame 244 to the floor 210 via the vibration damping assembly 246 prior to installing the power cells 242. The power cells 242 may, for example, be installed to the frame 244 via slide rails 245 that facilitate installation and removal of individual power cells 242 to the frame 244. As noted above, the vibration damping assembly 246 may include a plurality of vibration damping couplers 247, such as the vibration damping couplers 300. Additionally, the overall stiffness of the first vibration damping assembly 236 coupling the transformer 232 to the cabin floor 210 may be greater than the overall stiffness of the second vibration damping assembly 246 coupling the power cells 242 to the cabin floor 210.

The illustrated mounting procedure 410 further includes block 416, which generally involves mounting one or more intake blowers to the cabin floor via a third vibration damping assembly. For example, block 416 may involve mounting the intake blower(s) 252 to the cabin floor 210 via the vibration damping couplers 259. In certain embodiments, the vibration damping couplers 259 may be provided along the lines of the above-described vibration damping coupler 300. In certain embodiments, an overall stiffness of the third vibration damping assembly may be less than the overall stiffnesses of the first and second vibration damping assemblies 236, 246.

As should be appreciated, the mounting procedure 410 may further include mounting various other components and/or subsystems to the cabin floor 210, whether that be with or without vibration damping couplers. As one example, the mounting procedure 410 may involve installing the filtration unit 251 to the cabin floor 210 at a location that will be adjacent the intake port 227 when the cap 220 is subsequently installed. The mounting procedure 410 may additionally or alternatively involve mounting one or more components or subsystems to the cabin cap 220 prior to installing the cap 220. For example, the mounting procedure 410 may involve installing the low-voltage VFD closet 229 and/or the exhaust blower(s) 254 to the cabin cap 220 prior to installing the cabin cap 220. It is also contemplated that the low-voltage VFD closet 229 and/or the exhaust blower(s) 254 may be installed to the cabin 200 subsequent to installing the cabin cap 220.

The process 400 may include the enclosing procedure 420, which generally involves installing a cabin cap to the cabin floor to thereby enclose the cabin. In the illustrated form, the enclosing procedure 420 includes block 422, which generally involves lowering a pre-formed cabin cap onto the cabin floor to thereby enclose the installed components within the cabin. For example, block 422 may involve hoisting the pre-formed cabin cap 220 into position on the cabin floor 210 using a crane or similar lifting apparatus.

The enclosing procedure 420 may further include block 424, which generally involves securing the cabin cap 220 to the cabin floor 210. In certain embodiments, block 424 may involve removably securing the cabin cap 220 to the cabin floor 210 (e.g., using bolts, screws, clasps, clamps, and/or another form of releasable fastener) to facilitate removal of the cap 220 in the event that the components internal to the cabin 200 require removal, maintenance, or replacement. In other embodiments, block 424 may involve permanently securing the cap 220 to the floor 210, for example via welding.

In the illustrated form, the enclosing procedure 420 involves lowering a pre-formed cabin cap 220 onto the cabin floor 210 to thereby enclose the cabin 200. It is also contemplated that the cabin 200 may be enclosed in another manner. As one example, the cap 220 may not necessarily be pre-formed, and may instead be built from the cabin floor 210 up.

The process 400 may further include the installation procedure 430, which generally includes installing the cabin and/or additional components to a mobile trailer. The installation procedure 430 may include block 432, which generally involves installing the cabin to a mobile trailer. For example, block 432 may involve installing the cabin 200 to a mobile trailer 131 suitable for connection with a semi-truck or tractor. In the illustrated form, block 432 involves directly coupling the cabin 200 to the mobile trailer 131 without an intervening suspension being installed between the cabin 200 and the chassis of the trailer 131. By way of example, block 432 may involve bolting and/or welding the cabin floor 210 to the chassis of the mobile trailer 131. It is also contemplated that block 432 may involve indirectly mounting the cabin 200 to the trailer 131, for example via an intervening suspension. However, such intervening suspensions may be obviated in certain embodiments for the reasons noted above.

The installation procedure 430 may further include block 434, which generally involves installing an electric motor to the mobile trailer. For example, block 434 may involve installing a single, single-shaft electric motor 134 to the mobile trailer 131. In certain embodiments, block 434 may involve mounting the electric motor 134 directly to the mobile trailer 131 (i.e., without any intervening suspension and/or vibration isolating components). In other embodiments, block 434 may involve indirectly mounting the electric motor 134 to the trailer 131 (e.g., via a suspension and/or vibration damping components). As should be appreciated, block 434 may further involve connecting the motor 134 to the medium-voltage VFD 132 such that the VFD 132 is operable to control operation of the motor 134 using power received via the medium-voltage power line 102. Block 434 may further include connecting auxiliary systems of the motor 134 with a power line connected to the junction panel 260 such that the auxiliary systems of the motor 134 are operable to receive electrical power from the low-voltage power line 102.

The installation procedure 430 may further include block 436, which generally involves installing a single hydraulic pump to the mobile trailer. For example, block 436 may involve installing the hydraulic pump 136 to the mobile trailer 131. In certain embodiments, block 436 may involve mounting the hydraulic pump 136 directly to the mobile trailer 131 (i.e., without any intervening suspension and/or vibration isolating components). In other embodiments, block 436 may involve indirectly mounting the hydraulic pump 136 to the trailer 131 (e.g., via a suspension and/or vibration damping components). As should be appreciated, block 436 may further involve connecting the hydraulic pump 136 to the single shaft 135 of the electric motor 134 such that the motor 134 is operable to drive the hydraulic pump 136 under control of the medium-voltage VFD 132. Block 436 may further include connecting auxiliary systems of the pump 136 with a power line connected to the junction panel 260 such that the auxiliary systems of the pump 136 are operable to receive electrical power from the low-voltage power line 102.

While not specifically illustrated in FIG. 15, it should be appreciated that the process 400 may include additional or alternative blocks, operations, and/or procedures that may be necessary or desired for the manufacture of a cabin 200 and/or a pump configuration 130 including such a cabin. By way of example, the process 400 may involve installing dedicated temperature sensors 249 and/or dedicated cooling fans 258 to the power cell assembly 240. As another example, the process 400 may involve forming the cabin cap 220 and/or connecting the ventilation control system 256 to the blowers 252, 254 and/or the cooling fans 258. Those skilled in the art, upon reading the detailed descriptions regarding the pump configuration 130 and the cabin 200, will readily recognize various other steps that may be taken to manufacture a VFD cabin 200 and/or a pump configuration 130 including the same.

Figure 16:
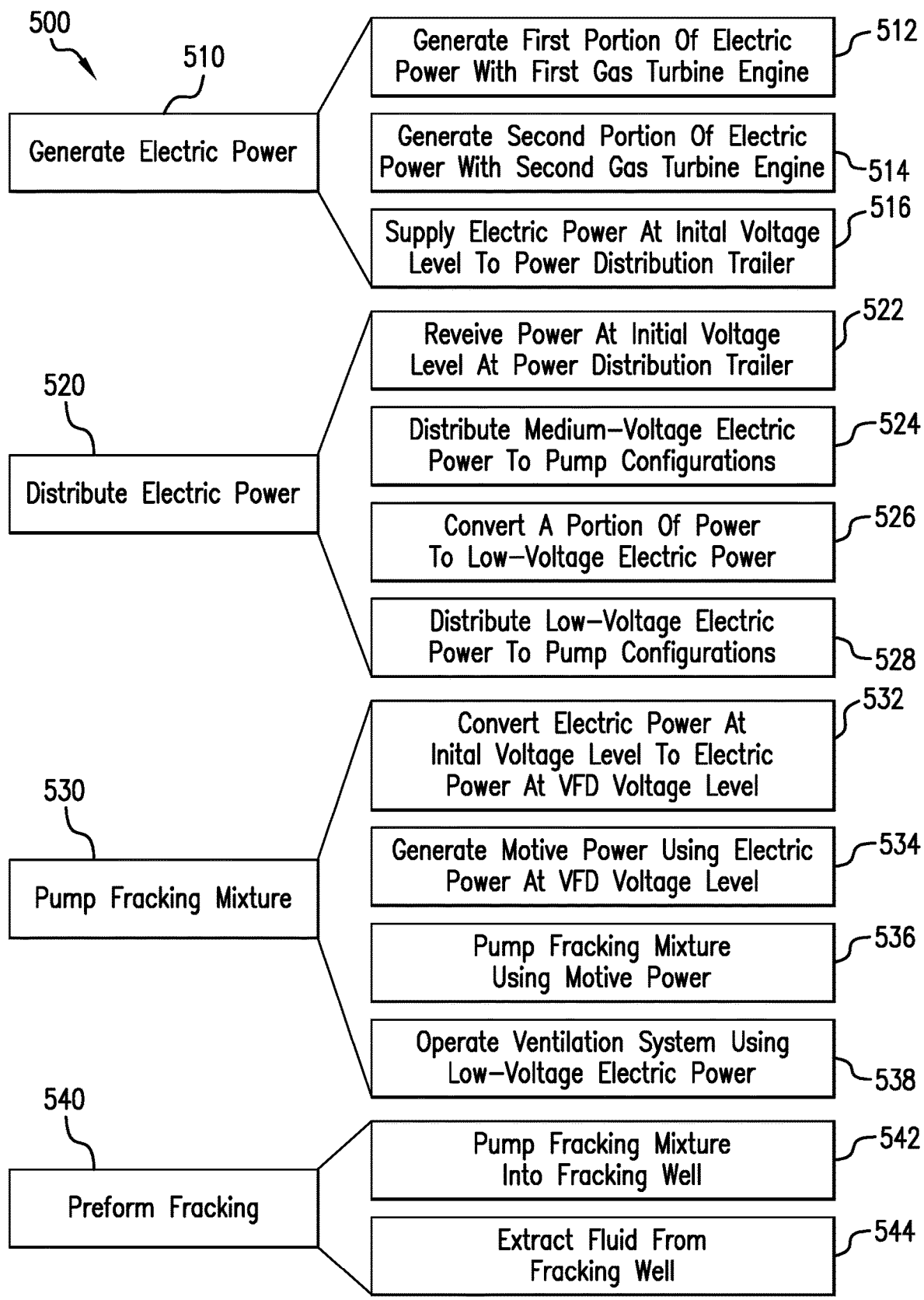
FIG. 16 is a schematic flow diagram of a process according to certain embodiments.

With additional reference to FIG. 16, certain embodiments of the present application relate to a process 500 for conducting a fracking operation. Blocks illustrated for the processes in the present application are understood to be examples only, and blocks may be combined or divided, and added or removed, as well as re-ordered in whole or in part, unless explicitly stated to the contrary. Additionally, while the blocks are illustrated in a relatively serial fashion, it is to be understood that two or more of the blocks may be performed concurrently or in parallel with one another. Moreover, while the process 500 will be described with specific reference to the fracking operation 100 described above, it is to be appreciated that the process 500 may be performed to conduct a fracking operation having additional or alternative features. By way of illustration, although the process 500 is described as being performed utilizing the above-described pump configuration 130, certain portions of the process 500 may additionally or alternatively be performed using the pump configuration 630 described below with reference to FIGS. 17-22.

The illustrated process 500 generally involves a power generation procedure 510, a power distribution procedure 520, a pumping procedure 530, and a fracking procedure 540. As described in further detail herein, the power generation procedure 510 generally involves generating electric power at an initial voltage level, the power distribution procedure 520 generally involves distributing electric power to one or more pump configurations, the pumping procedure 530 generally involves using the distributed electric power to pump a fracking media, and the fracking procedure 540 generally involves using the fracking media to extract fluid from a fracking well 109.

Certain embodiments of the process 500 may involve a power generation procedure 510, which generally involves generating electric power at an initial voltage level in the medium-voltage range and an initial power level in the megawatt range. The power generation procedure 510 may, for example, be performed using the power generation system 110 described above. It is also contemplated that the process 500 may not necessarily include the power generation procedure 510, for example in embodiments in which electric power is supplied to the fracking operation 100 from a power grid (e.g., via direct connection with a substation). Furthermore, while the power generation procedure 510 is described as being performed with gas turbine engines 112, 114, it is also contemplated that other sources of electric power may be utilized.

The power generation procedure 510 may include block 512, which generally involves generating a first portion of the electric power using a first power source, such as a first gas turbine engine. Block 512 may, for example, involve operating the first gas turbine engine 112 to generate the first portion of the electric power at the initial voltage level in the medium-voltage range. In certain embodiments, block 512 may involve operating the first gas turbine engine 112 to generate power in a range of about 12 MW or greater. In certain embodiments, block 512 may involve operating the first gas turbine engine 112 to generate power in a range of about 12 MW to about 16 MW. In certain embodiments, the fuel for operating the first gas turbine engine 112 may be provided at least in part as fluid extracted from the fracking well 109 associated with the fracking operation 100.

The power generation procedure 510 may include block 514, which generally involves generating a second portion of the electric power using a second power source, such as a second gas turbine engine. Block 514 may, for example, involve operating the second gas turbine engine 114 to generate the second portion of the electric power at the initial voltage level in the medium-voltage range. In certain embodiments, block 514 may involve operating the second gas turbine engine 114 to generate power in a range of about 12 MW or greater. In certain embodiments, block 514 may involve operating the second gas turbine engine 114 to generate power in a range of about 12 MW to about 16 MW. In certain embodiments, the fuel for operating the second gas turbine engine 114 may be provided at least in part as fluid extracted from the fracking well 109 associated with the fracking operation 100.

The power generation procedure 510 further includes block 516, which generally involves supplying the electric power at the initial voltage level to a power distribution system. Block 516 may, for example, involve supplying the electric power at the initial voltage level from the power generation system 110 to the power distribution system 120. In certain embodiments, the power supplied to the power distribution system 120 includes the first power generated by the first power source (e.g., the first gas turbine engine 112) and the second power generated by the second power source (e.g., the gas turbine engine 114). In certain embodiments, the power supplied to the power distribution system 120 is about 24 MW or greater. In certain embodiments, the power supplied to the power distribution system 120 is in the range of about 24 MW to about 36 MW. In certain embodiments, the power generation system 110 may generate the electric power at an initial voltage level of about 5 kV to about 15 kV. In certain embodiments, the initial voltage may be provided in the range of 12.5 kV±about 10%. In certain embodiments, the initial voltage may be provided in the range of about 10 kV to about 15 kV. In certain embodiments, the initial voltage may be provided in the range of about 11.8 kV to about 14.5 kV. In certain embodiments, the initial voltage may be provided as about 13.8 kV or greater. It is also contemplated that other voltage levels and/or ranges may be utilized in block 516.

The power generation procedure 510 may further include one or more steps or operations not specifically illustrated in FIG. 16. For example, the power generation procedure 510 may involve providing redundancy in the generation of electric power in that the first power source (e.g., the first gas turbine engine 112) may continue to supply the first portion of the electric power in the event of a short-circuit condition experienced by the second power source (e.g., the second gas turbine engine 114), and in that the second power source (e.g., the second gas turbine engine 114) may continue to supply the second portion of the electric power in the event of a short-circuit condition experienced by the first power source (e.g., the first gas turbine engine 112). Additionally, while the illustrated form of the power generation procedure 510 involves generating the electric power via a pair of gas turbine engines 112, 114 positioned on a single trailer 111, it is also contemplated that the power generation procedure 510 may involve generating power in another manner (e.g., with more or fewer gas turbine engines and/or additional or alternative power sources for generating electric power).

Certain embodiments of the process 500 include a power distribution procedure 520, which generally involves distributing electric power to one or more pump configurations. The power distribution procedure 520 may, for example, be performed by or using the power distribution system 120 described above. In certain embodiments, the power distribution procedure 520 may be performed in conjunction with the power generation procedure 510 described above. In other embodiments, the power distributed in the power distribution procedure 520 may be generated in another manner. As one example, the power distributed in the power distribution procedure 520 may be received from a power grid (e.g. via direct connection with a substation).

The power distribution procedure 520 may include block 522, which generally involves receiving, at a power distribution system, electric power at an initial voltage level. Block 522 may, for example, involve receiving power at the mobile power distribution system 120, such as from the power generation system 110 or the electrical grid. In certain embodiments, the power received in block 522 may be power at an initial voltage level of about 5 kV to about 15 kV. In certain embodiments, the power received in block 522 may be in the range of 12.5 kV±about 10%. In certain embodiments, the power received in block 522 may be in the range of about 10 kV to about 15 kV. In certain embodiments, the power received in block 522 may be provided in the range of about 11.8 kV to about 14.5 kV. In certain embodiments, the power received in block 522 may be about 13.8 kV or greater. In certain embodiments, the power received in block 522 may be in the 15 kV class. It is also contemplated that other voltage levels and/or ranges may be utilized in block 522.

The power distribution procedure 520 may include block 524, which generally involves distributing medium-voltage electric power to one or more pump configurations. Block 524 may, for example, involve distributing electric power at the initial voltage level to one or more pump configurations 130 via one or more medium-voltage power lines 101. In certain embodiments, the medium-voltage power distributed in block 524 may be power at an initial voltage level of about 5 kV to about 15 kV. In certain embodiments, the medium-voltage power distributed in block 524 may be in the range of 12.5 kV±about 10%. In certain embodiments, the medium-voltage power distributed in block 524 may be in the range of about 10 kV to about 15 kV. In certain embodiments, the medium-voltage power distributed in block 524 may be in the range of about 11.8 kV to about 14.5 kV. In certain embodiments, the medium-voltage power distributed in block 524 may be about 13.8 kV or greater. It is also contemplated that other voltage levels and/or ranges may be utilized in block 524. In certain embodiments, block 524 may involve distributing the medium-voltage power via a switchgear arrangement such as that described in the above-referenced U.S. application Ser. No. 16/790,538.

The power distribution procedure 520 may include block 526, which generally involves converting a portion of the received power to low-voltage electric power. Block 524 may, for example, involve operating one or more transformers of the power distribution system 120 to convert a portion of the power received at the initial voltage level to power at a low-voltage voltage level. In certain embodiments, block 524 may involve converting the portion of the electric power from the initial medium-voltage voltage level to a low-voltage voltage level less than 1.0 kV. In certain embodiments, the low-voltage voltage level may be about 480V. It is also contemplated that other low-voltage voltage levels and/or ranges may be utilized in block 526.

The power distribution procedure 520 may include block 528, which generally involves distributing low-voltage electric power to one or more pump configurations. Block 528 may, for example, involve distributing electric power at the low-voltage voltage level to the plurality of pump configurations 130a-130n via one or more low-voltage power lines 102. In certain embodiments, block 528 may further involve distributing low-voltage power to one or more auxiliary systems 190. In certain embodiments, block 528 may involve distributing the low-voltage power via a switchgear arrangement such as that described in the above-referenced U.S. application Ser. No. 16/790,538.

The power distribution procedure 520 may further include one or more blocks, steps, or operations not specifically illustrated in FIG. 16. As one example, the power distribution procedure 520 may involve distributing medium-voltage power to one or more auxiliary systems 190. For example, should the auxiliary system(s) 190 include a blending unit that blends the fracking media provided to the hydraulic pumps 136, the power distribution procedure 520 may involve distributing power to the blending unit at a voltage that is suitable for use by the blending unit, such as power of about 4160V.

As another example, the procedure 520 may involve transmitting information to the one or more pump configurations 130 and/or receiving information from the one or more pump configurations 130. In certain embodiments, such communication may be performed via a wired connection, such as the communications cable 103. In certain embodiments, such communication may be performed via a wireless connection, such as those described above. In certain embodiments, the information communicated between the power distribution system 120 and the pump configurations 130 may relate to the control of the pump configurations 130. By way of example, if information received from one pump configuration 130a indicates that the pump configuration 130a is performing sub-optimally (e.g., is pumping the fracking media at a sub-optimal level), the power distribution system 120 may cause one or more of the remaining pump configurations 130b-130n to operate at a higher HP level to ensure that the total pumping power provided to the fracking system 140 remains at a desired overall HP level. In certain embodiments, the power distribution system 120 may include a control system that provides for such control of the pump configurations 130. In certain embodiments, the power distribution system 120 may control the pump configurations under the control of a control system 180, which may be positioned at the fracking site or remote from the fracking site.

Certain embodiments of the process 500 include a pumping procedure 530, which generally involves using electric power to pump a fracking media. The pumping procedure 530 may, for example, be performed by or with one or more pump configurations 130 along the lines set forth above. In certain embodiments, the pumping procedure 530 may be performed in conjunction with the power generation procedure 510. Additionally or alternatively, the pumping procedure 530 may be performed using power that was generated in a manner other than that described with reference to the power generation procedure 510. In certain embodiments, the pumping procedure 530 may be performed in conjunction with the power distribution procedure 520. Additionally or alternatively, the pumping procedure 530 may be performed using power that has been provided to the pump configurations 130 in another manner. In certain embodiments, the pumping procedure 530 may be performed using a single pump configuration 130. In other embodiments, the pumping procedure 530 may be performed concurrently by multiple pump configurations 130a-130n.

The pumping procedure 530 may include block 532, which generally involves converting electric power at the initial voltage level to electric power at a VFD voltage level. Block 532 may, for example, be performed by or using the medium-voltage VFD 132. In certain embodiments, block 532 involves converting, by the transformer 232, the electric power at the initial voltage level to electric power at a transformer voltage level, and converting, by the plurality of power cells 242, the electric power at the transformer voltage level to electric power at the VFD voltage level. In certain embodiments, block 532 may involve converting electric power from the initial voltage level to the VFD voltage level in the manner along the lines of that described in the above-referenced U.S. application Ser. No. 16/790,581. In certain embodiments, the VFD voltage level may be less than the initial voltage level. In certain embodiments, the VFD voltage level may be a voltage level between the initial voltage level and the transformer voltage level. In certain embodiments, the VFD voltage level may be a medium-voltage voltage level. In certain embodiments, the VFD voltage level may be about 2.5 kV or greater. In certain embodiments, the VFD voltage level may be about 4.16 kV or greater. In certain embodiments, the VFD voltage level may be about 4.16 kV to about 6.6 kV. It is also contemplated that other VFD voltage levels and/or ranges may be utilized in block 532.

The pumping procedure 530 may include block 534, which generally involves generating motive power using the electric power at the VFD voltage level (e.g., the electric power converted to the VFD voltage level in block 532). Block 534 may, for example, be performed by or using the single-shaft electric motor 134. More particularly, block 534 may involve causing the single-shaft electric motor 134 to rotate at an RPM level in response to receiving the electric power at the VFD voltage level. In certain embodiments, the RPM level at which the motor 134 rotates in response to receiving the electric power at the VFD voltage level is about 750 RPM, or about 750 RPM or greater. In certain embodiments, the RPM level at which the motor 134 rotates in response to receiving the electric power at the VFD voltage level is in a range of about 500 RPM to about 1000 RPM. In certain embodiments, the RPM level at which the motor 134 rotates in response to receiving the electric power at the VFD voltage level is in a range of about 750 RPM to about 1500 RPM. It is also contemplated that other RPM levels and/or ranges may be utilized in block 534.

The pumping procedure 530 may include block 536, which generally involves pumping fracking media, for example using the motive power generated in block 534. Block 536 may, for example, be performed by or using the hydraulic pump 136. More particularly, block 536 may involve causing the hydraulic pump 136 to pump the fracking media at a HP level in response to rotation of the motor 134 at the RPM level. In certain embodiments, the HP level for each hydraulic pump 136 is about 5000 HP, or about 5000 HP or greater. In certain embodiments, the HP level for each hydraulic pump 136 is in a range of 4000 HP to 6000 HP. In certain embodiments, the HP level for each hydraulic pump 136 is at least 3000 HP. It is also contemplated that other HP levels and/or ranges may be utilized in block 536. In certain embodiments, block 536 may involve operating one or more of the hydraulic pumps 136 on a continuous duty cycle to continuously pump fracking media into the fracking well 109.

The pumping procedure 530 may include block 538, which generally involves operating a ventilation system to cool the medium-voltage VFD 132. Block 538 may, for example, be performed by or using the ventilation system 250. In certain embodiments, block 538 may involve operating the ventilation system 250 using power received via the low-voltage line 102. In certain embodiments, block 538 may involve operating plural low-voltage VFDs 257 to operate blowers 252, 254 by which air is introduced to and discharged from the cabin 200. In certain embodiments, block 538 may involve controlling the speed of the blowers 252, 254 based upon a temperature within the cabin 200. In certain embodiments, block 538 may involve operating the intake blower(s) 252 to generate an intake CFM, and operating the exhaust blower(s) 254 to generate an exhaust CFM that is lower than the intake CFM such that an overpressure condition is created within the cabin 200. In certain embodiments, block 538 may involve generating an airstream 209 that flows from the intake port 227, through the filtration unit 251 under control of the intake blower 252, and across the medium-voltage VFD 132. In certain embodiments, the power cell assembly 240 may be positioned in the airstream 209 upstream of the transformer assembly 230, and the transformer assembly 230 may be positioned in the airstream 209 downstream of the power cell assembly 240. In certain embodiments, block 538 may involve operating dedicated cooling fans 258 to blow air over and/or through the individual power cells 242. In certain embodiments, the speed of the dedicated cooling fans 258 may be controlled based upon the temperature of the corresponding power cell 242, which temperature may be sensed by the dedicated temperature sensors 249.

The pumping procedure 530 may further include one or more steps or operations not specifically illustrated in FIG. 16. For example, low-voltage auxiliary power may be distributed from the low-voltage power line 102 in order to power auxiliary systems of the medium-voltage VFD 132, auxiliary systems of the motor 134, auxiliary systems of the hydraulic pump 136, auxiliary systems of the cabin 200, and/or auxiliary systems of the pump configuration 130.

Certain embodiments of the process 500 include a fracking procedure 540, which generally involves using the fracking media to extract fluid from a fracking well 109. The fracking procedure 540 may, for example, be performed by or using the fracking system 140 using fracking media pumped by the one or more pump configurations 130a-130n.

The fracking procedure 540 may include block 542, which generally involves pumping a fracking media into a fracking well 109. Block 542 may, for example, be performed by or using the fracking equipment 142. In certain embodiments, block 542 may involve continuously pumping the fracking media at an overall HP level corresponding to the sum of the HP levels provided by the plural single-pump pump configurations 130a-130n, each of which includes a single hydraulic pump 136 that may operate continuously at the HP level for which the pump 136 is rated. In certain embodiments, the overall HP level is about 40,0001 HP, or about 40,000 HP or greater. In certain embodiments, the overall HP level is between about 30,000 HP and about 50,000 HP. It is also contemplated that other overall HP levels and/or ranges may be utilized in block 542.

The fracking procedure 540 may include block 544, which generally involves extracting a fluid from the fracking well 109. Block 544 may, for example, be performed by or using the fracking equipment 142. The extracted fluid may then be stored and/or distributed. In certain embodiments, a portion of the extracted fluid may be fed back to the power generation system 110, for example in embodiments of the process that involve performing the power generation procedure 510 on-site. In such forms, the extracted fluid may be utilized to power one or both of the gas turbine engines 112, 114.

It is to be appreciated that the process 500 may include additional or alternative blocks or operations not specifically illustrated in FIG. 16. For example, the power distribution procedure 520 may further involve distributing low-voltage electric power and/or medium-voltage electric power to one or more auxiliary systems 190, and the process 500 may involve operating such auxiliary systems 190. As one example, the auxiliary system 190 may include a hydration system, and the process 500 may involve operating the hydration system to provide adequate hydration to the fracking media as the hydraulic pumps 136 continuously pump the fracking media into the fracking well 109. As further examples, the auxiliary system(s) 190 may include chemical additive systems, blending systems, mixing systems and/or any other type of system that is required or desired at the fracking site, and the process 500 may involve operating such auxiliary systems 190 using power generated in the power generation procedure 510 and/or distributed in the power distribution procedure 520. Those skilled in the art, upon reading the detailed descriptions regarding the fracking operation 100 and the components and subsystems thereof, will readily recognize various other steps that may be taken during performance of the process 500.

Figure 17:
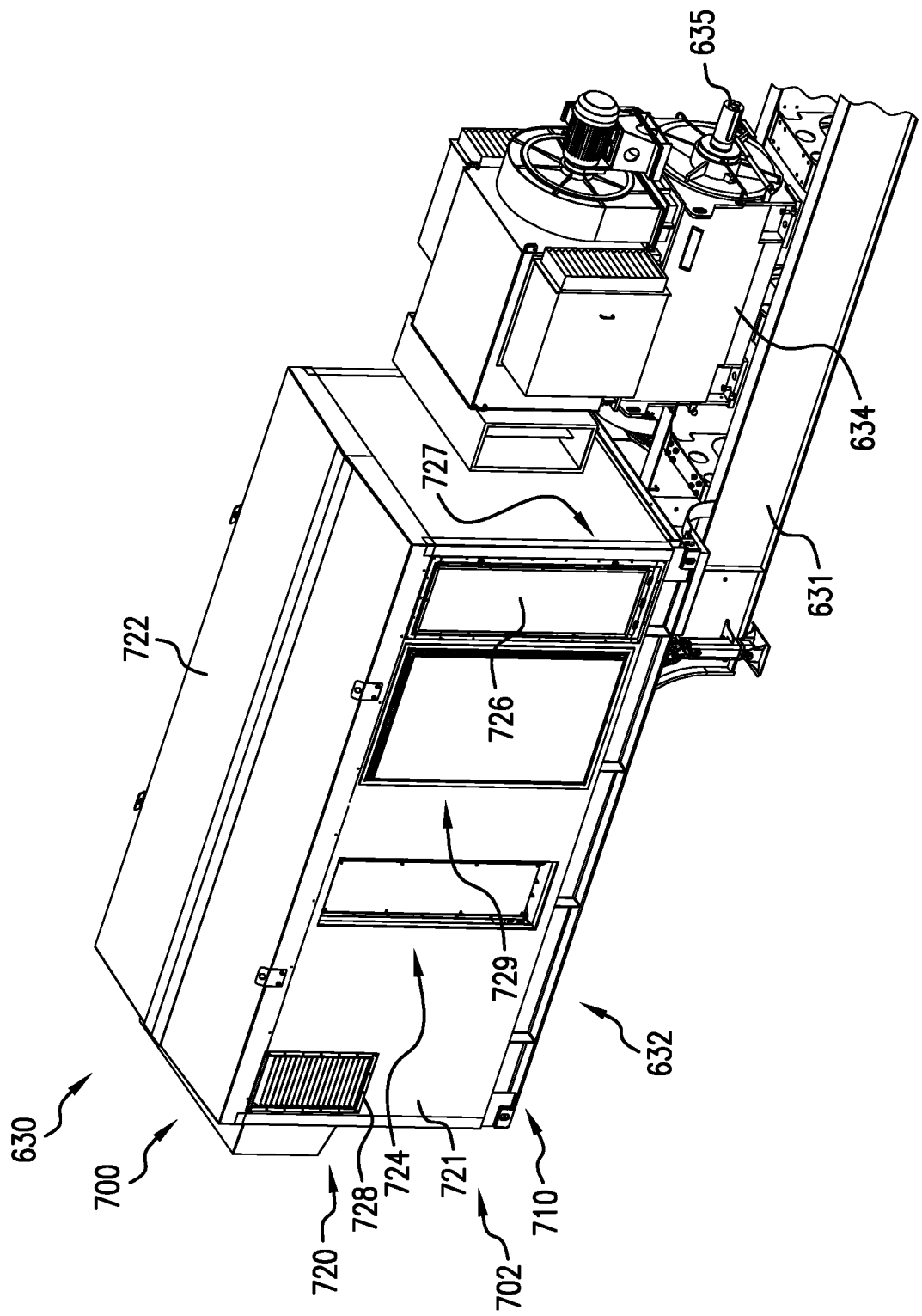
FIG. 17 is a perspective view of a pump configuration according to certain embodiments.

With additional reference to FIG. 17, illustrated therein is a pump configuration 630 according to certain embodiments. The pump configuration 630 is an alternative embodiment of the pump configuration 130, and similar reference characters are used to indicate similar elements and features. For example, the pump configuration 630 generally includes a pump trailer 631, a medium-voltage VFD 632, a single, single-shaft electric motor 634, and a single hydraulic pump (not illustrated), which respectively correspond to the above-described trailer 131, VFD 132, motor 134, and pump 136, and which need not be described in further detail herein. The pump configuration 630 may, for example, be utilized in place of the pump configuration 130 in the system 100 and/or the process 500, and may, for example, be manufactured according to the process 400. In the interest of conciseness, the following description of the pump configuration 630 focuses primarily on elements and features that differ from those described above with respect to the pump configuration 130 and/or are shown in greater detail in FIGS. 17-22 than the corresponding features are illustrated in FIGS. 3-14.

Figure 18:
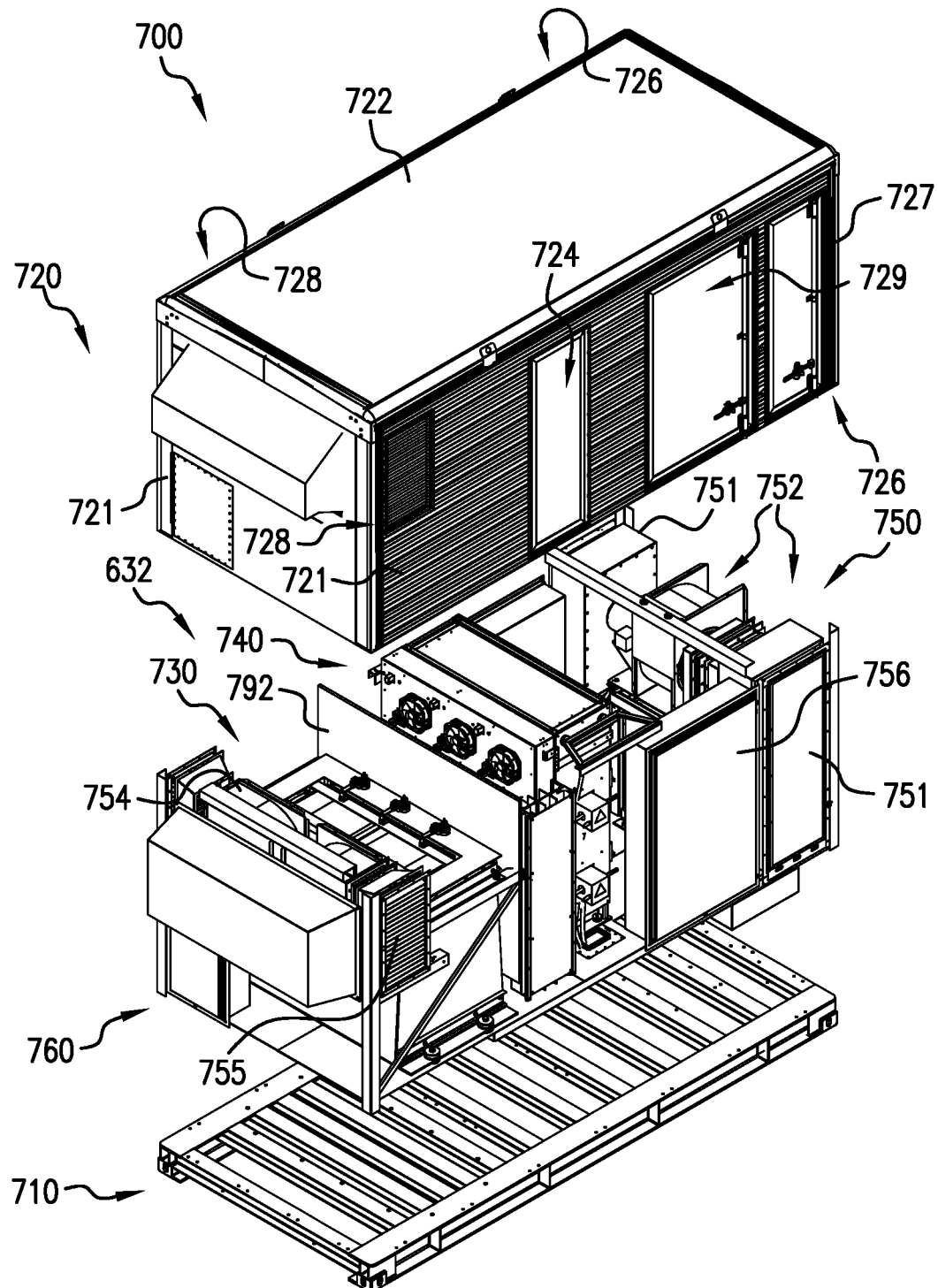
FIG. 18 is a partially exploded assembly view of a VFD cabin according to certain embodiments.

With additional reference to FIG. 18, as in the pump configuration 130, the medium-voltage VFD 632 is provided within a VFD cabin 700. The VFD cabin 700 is an alternative embodiment of the VFD cabin 200, and similar reference characters are used to indicate similar elements and features. For example, the VFD cabin 700 generally includes a housing 702 including a floor 710 and a cap 720, a transformer assembly 730, a power cell assembly 740, a ventilation system 750, and a junction panel 760, which respectively correspond to the above-described housing 202, floor 210, cap 220, transformer assembly 230, power cell assembly 240, ventilation system 250, and junction panel 260. The VFD cabin 700 may, for example, be utilized in place of the VFD cabin 200 in the system 100 and/or the process 500, and may, for example, be manufactured according to the process 400. In the interest of conciseness, the following description of the VFD cabin 700 focuses primarily on elements and features that differ from those described above with respect to the VFD cabin 200 and/or are shown in greater detail in FIGS. 17-22 than the corresponding features are illustrated in FIGS. 3-14. It should be appreciated that elements and features described in connection with only one of the VFD cabins 200, 700 may nonetheless be included in the other of the VFD cabins 200, 700.

Figure 19:
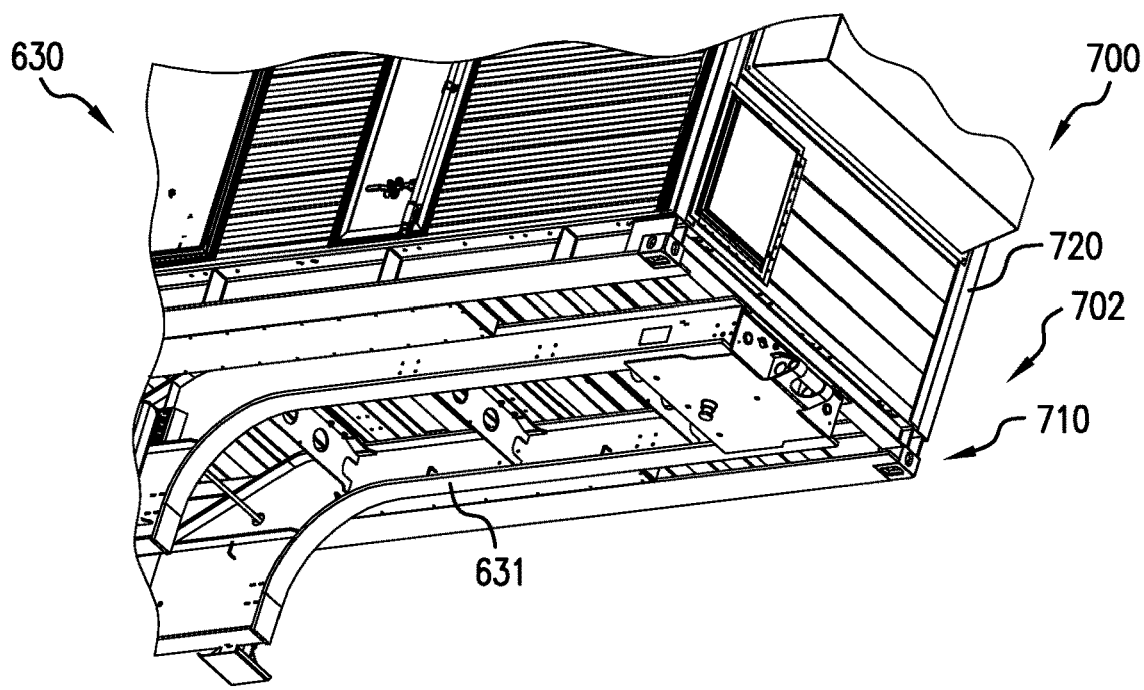
FIG. 19 is a perspective view of a portion of the pump configuration illustrated in FIG. 17.

With additional reference to FIG. 19, in the illustrated form, the floor 710 is rigidly mounted to the trailer 631 without an intervening suspension being positioned between the floor 710 and the trailer 631. For example, the floor 710 may be rigidly coupled to the trailer 631 via welds and/or bolts. In other embodiments, the floor 710 may be indirectly mounted to the trailer 631 via a suspension.

The cap 720 corresponds to the above-described cap 220, and similar reference characters are used to indicate similar elements and features. For example, the cap 720 includes a plurality of sidewalls 721, a roof 722, a maintenance door 724, a cover door 726, one or more intake ports 727, one or more exhaust ports 728, and a low-voltage VFD closet 729, which respectively correspond to the sidewalls 221, roof 222, maintenance door 224, cover door 226, intake port(s) 227, exhaust port(s) 228, and a low-voltage VFD closet 229. Unlike the VFD cabin 200, in which the intake ports 226 and the exhaust ports 228 are respectively provided on the fore and aft end-walls, the intake port(s) 727 and the exhaust port(s) 728 are provided on the lateral sidewalls 721 of the cap 720. More particularly, each lateral sidewall 721 includes an intake port 727 and an exhaust port 728 such that the intake ports 727 are positioned opposite one another near one end of the cabin 700 and the exhaust ports 728 are positioned opposite one another near the opposite end of the cabin 700.

Figure 20:
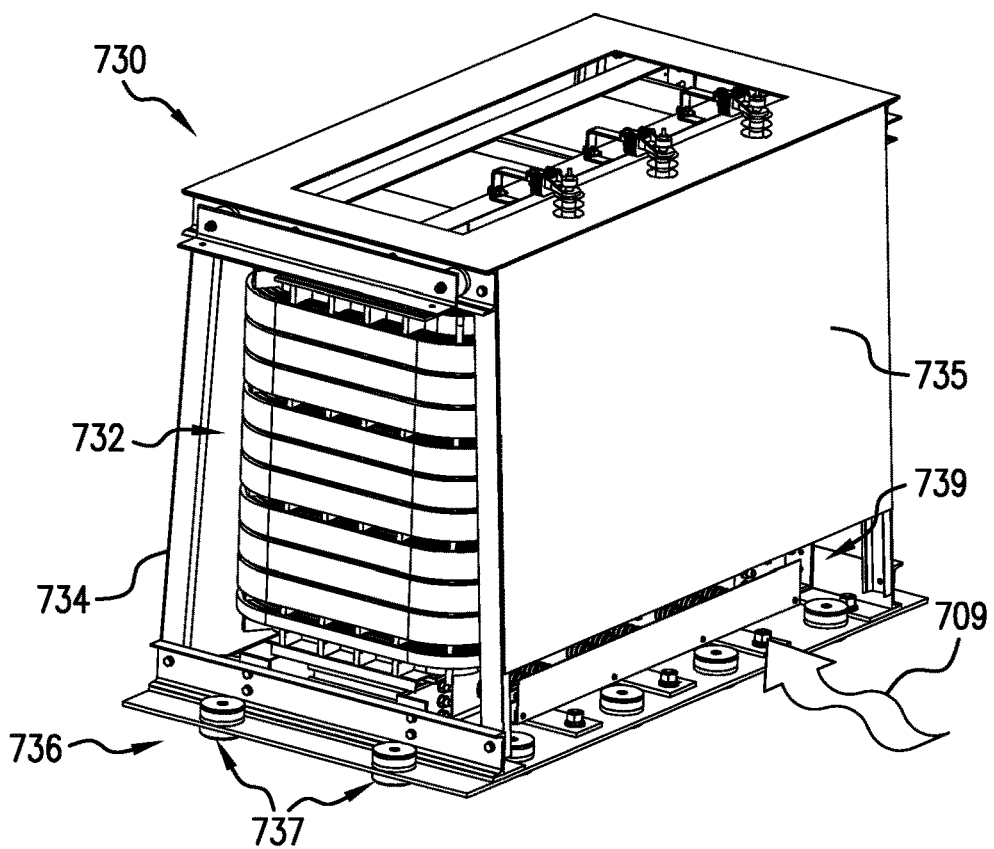
FIG. 20 is a perspective view of a transformer assembly according to certain embodiments.

With additional reference to FIG. 20, the transformer assembly 730 corresponds to the above-described transformer assembly 230, and similar reference characters are used to indicate similar elements and features. For example, the transformer assembly 730 generally includes a transformer 732, a transformer assembly frame 734, and a vibration damping assembly 736 including a plurality of vibration damping couplers 737, which respectively correspond to the transformer 232, the transformer assembly frame 234, and vibration damping assembly 236 including vibration damping couplers 237.

In the illustrated form, the frame 734 includes an end wall 735 that terminates above the floor 710 such that a gap 739 is defined below the end wall 735. This arrangement urges the airstream 709 to flow initially into the bottom of the transformer 732 and upward through the transformer 732 in a manner similar to that described above with reference to FIG. 11. A wall 792 positioned between the transformer assembly 730 and the power cell assembly 740 may further aid in directing air to flow in this manner.

Figure 22:
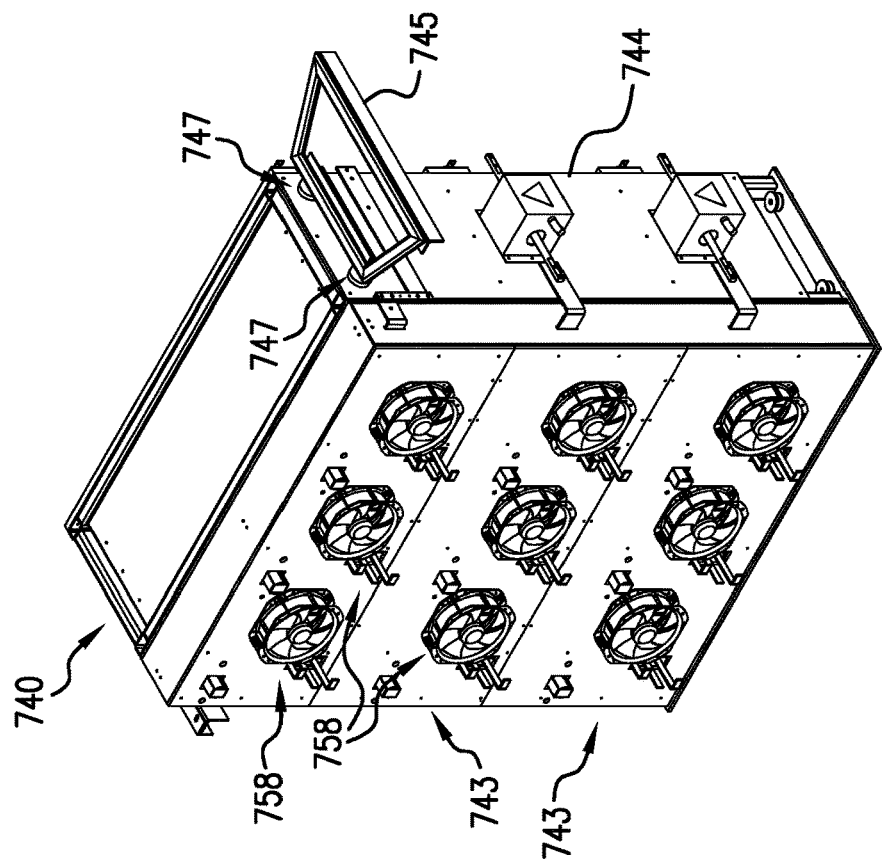
FIGS. 21 and 22 are perspective views of a power cell assembly according to certain embodiments.
Figure 21:
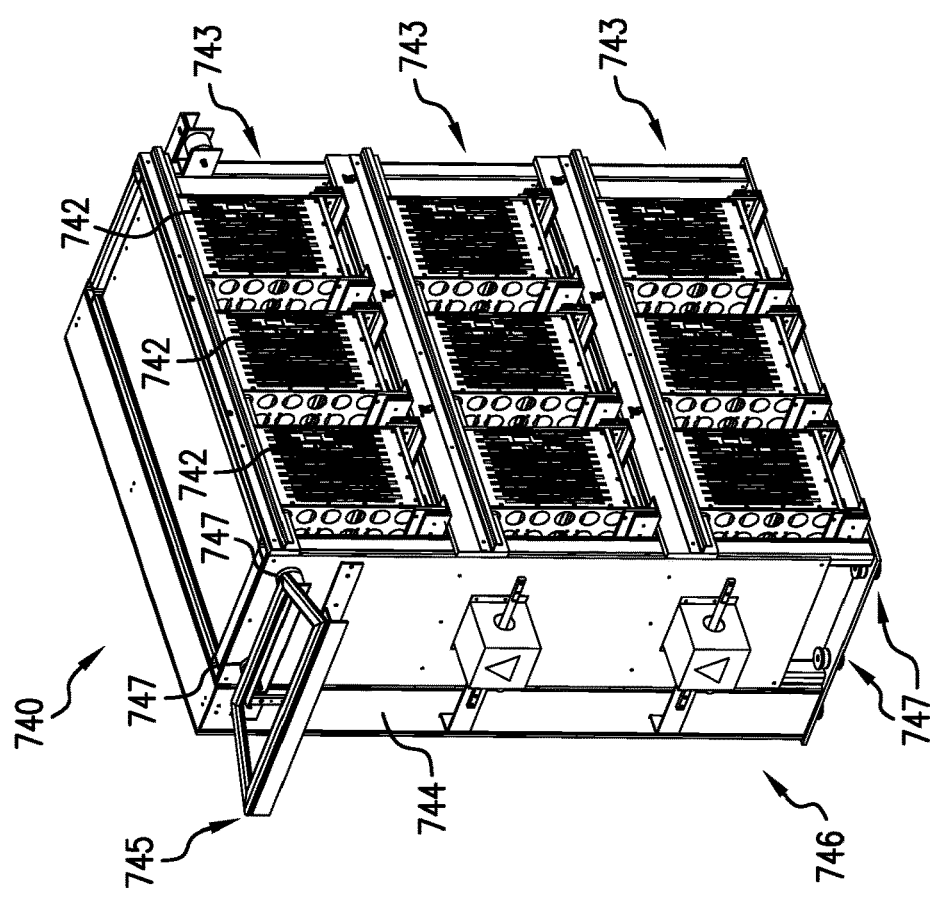

With additional reference to FIGS. 21 and 22, the power cell assembly 740 corresponds to the above-described power cell assembly 240, and similar reference characters are used to indicate similar elements and features. For example, the power cell assembly 740 generally includes a plurality of power cells 742, a power cell assembly frame 744, and a vibration damping assembly 746 including a plurality of vibration damping couplers 747, which respectively correspond to the plurality of power cells 242, the power cell assembly frame 244, and the vibration damping assembly 246 including a plurality of vibration damping couplers 247.

In the illustrated form, the power cell assembly 740 further includes an auxiliary frame 745, and the primary frame 744 is coupled to the interior side of one of the sidewalls 721 via the auxiliary frame 745 to provide lateral support for the power cell assembly 740. The auxiliary frame 745 may be connected to the primary frame 745 and/or the sidewall 721 via vibration damping couplers 747. In the illustrated form, vibration damping couplers 747 are utilized to couple the auxiliary frame 745 to the primary frame 744. Additionally or alternatively, vibration damping couplers 747 may be utilized to couple the auxiliary frame 745 to the sidewall 721. As should be appreciated, the vibration damping couplers 747 may, for example, be provided in the form of the above-described vibration damping couplers 300.

The ventilation system 750 corresponds to the above-described ventilation system 250, and similar reference characters are used to indicate similar elements and features. For example, the ventilation system 750 generally includes one or more filtration units 751, one or more intake blowers 752, one or more exhaust blowers 754, a ventilation control system 756, and a plurality of dedicated cooling fans 758, which respectively correspond to the above-described filtration unit(s) 251, intake blower(s) 252, exhaust blower(s) 254, ventilation control system 256, and dedicated cooling fans 258.

Figure 23:
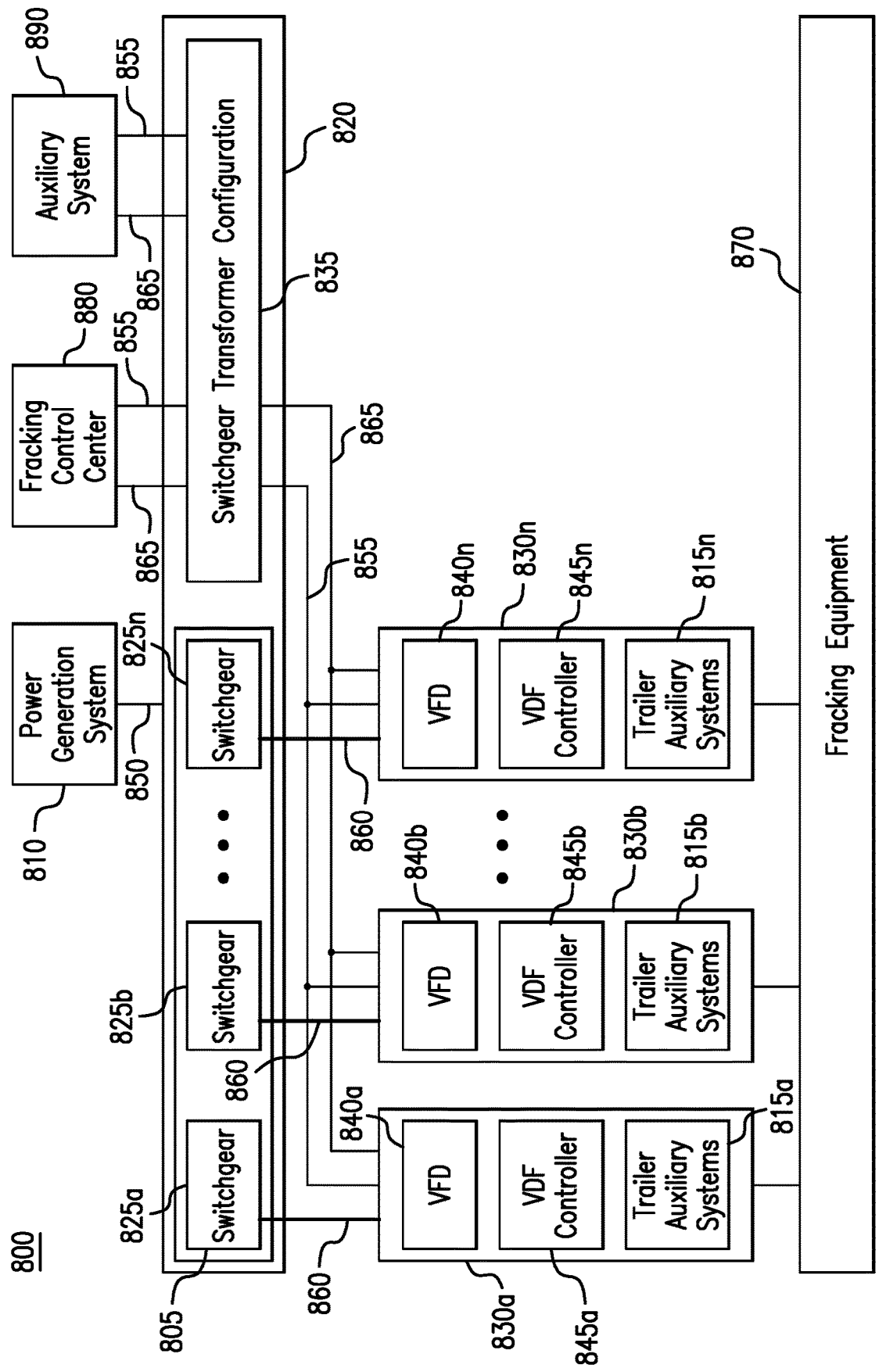
FIG. 23 is a schematic diagram of a fracking system according to certain embodiments.

With additional reference to FIG. 23, illustrated therein is a block diagram of an electric driven hydraulic fracking system that provides an electric driven system to execute a fracking operation in that the electric power is consolidated in a power generation system and then distributed such that each component in the electric driven hydraulic fracking system is electrically powered. An electric driven hydraulic fracking system 800 includes a power generation system 810, a power distribution trailer 820, a plurality of pump trailers 830(*a-n*), a plurality of single medium-voltage VFDs 840(*a-n*), a switchgear configuration 805, a plurality of trailer auxiliary systems 815(*a-n*), a plurality of switchgears 825(*a-n*), a switchgear transformer configuration 835, and fracking equipment 870.

Electric power is consolidated in the power generation system 810 and then distributed at the appropriate voltage levels by the power distribution trailer 820 to decrease the medium voltage cabling required to distribute the electric power. The single medium-voltage VFDs 840(*a-n*) and the trailer auxiliary systems 815(*a-n*) positioned on the pump trailers 830(*a-n*) as well as the fracking control center 880 and auxiliary systems 890 are electrically powered by the electric power that is consolidated and generated by the power generation system 810. The electric driven hydraulic fracking system 800 shares many similar features with the hydraulic fracking operation 100. In the interest of conciseness, the following description focuses primarily on the differences between the electric driven hydraulic fracking system 800 and the hydraulic fracking operation 100.

As noted above, the power generation system 810 may consolidate the electric power 850 that is generated for the electric driven hydraulic fracking system 800 such that the quantity and size of the power sources included in the power generation system 810 is decreased. As discussed above, the power generating system 810 may include numerous power sources as well as different power sources and any combination thereof. For example, the power generating system 810 may include power sources that include a quantity of gas turbine engines. In another example, the power generation system 810 may include a power source that includes an electric power plant that independently generates electric power for an electric utility grid. In another example, the power generation system 810 may include a combination of gas turbine engines and an electric power plant. The power generation system 810 may generate the electric power 850 at a power level and a voltage level. The voltage level at which the power generation system generates the electric power may be referred to herein as the initial voltage level and/or the power generation voltage level.

The power generation system 810 may generate electric power at a power generation voltage level in which the power generation voltage level is the voltage level that the power generation system is capable of generating the electric power 850. For example, when the power sources of the power generation system 810 include a quantity of gas turbine engines, the power generation system 810 may generate the electric power 850 at the voltage level of 13.8 kV, which is a typical voltage level for electric power 850 generated by gas turbine engines. In another example, when the power sources of the power generation system 810 include an electric power plant, the power generation system 810 may generate the electric power 850 at the voltage level of 12.47 kV, which is a typical voltage level for electric power 850 generated by an electric power plant.

In another example, the power generation system 810 may generate electric power 850 that is already at the VFD voltage level to power the single shaft electric motor as discussed in detail below. In such an example, the power generation system 810 may generate the electric power 850 that is already at a VFD voltage level of 4160V. In another example, the power generation system 810 may generate the electric power 850 at the power generation voltage level in range of 4160V to 15 kV. In another example, the power generation system 810 may generate electric power 850 at the power generation voltage level of up to 38 kV. The power generation system 810 may generate the electric power 850 at any power generation voltage level that is provided by the power sources included in the power generation system 810 that will be apparent to those skilled in the relevant art(s) without departing from the spirit and scope of the disclosure. The power generation system 810 may then provide the electric power 850 at the power generation voltage level to the power distribution trailer 820 via one or more medium voltage cables.

The power distribution trailer 820 may distribute the electric power 850 at the power generation voltage level to a plurality of single medium-voltage VFDs 840(*a-n*), where n is an integer equal to or greater than two, with each single medium-voltage VFD 840(*a-n*) positioned on a corresponding single trailer 830(*a-n*) from a plurality of single trailers, where n is an integer equal to or greater than two. The power distribution trailer 820 may include a switchgear configuration 805 that includes a plurality of switchgears 825(*a-n*), where n is an integer equal to or greater than two, to distribute the electric power 850 generated by the at least one power source included in the power distribution trailer 810 at the power generation voltage level 860 to each corresponding single medium-voltage VFD 840(*a-n*) positioned on each corresponding trailer 830(*a-n*).

Since the electric power 850 is consolidated to the power generation system 810, the switch gear configuration 805 may distribute the electric power 850 at the power generation voltage level to each of the single medium-voltage VFDs 840(*a-n*) as electric power 860 at the power generation voltage level such that each of the single medium-voltage VFDs 840(*a-n*) may then drive the single shaft electric motors and the single hydraulic pumps as discussed in detail below. For example, when the power distribution system 810 has power sources that include gas turbine engines, the switch gear configuration 805 of the power distribution trailer 820 may distribute the electric power 850 at the power generation voltage level of 13.8 kV to each of the single medium-voltage VFDs 840(*a-n*) as electric power 860 at the power generation voltage level of 13.8 kV. In another example, when the power distribution 810 has power sources that include an electric power plant, the switch gear configuration 805 of the power distribution trailer 820 may distribute the electric power 850 at the power generation level of 12.47 kV to each of the single medium-voltage VFDs 840(*a-n*) as electric power 860 at the power generation level of 12.47 kV.

In order for the electric power to be consolidated to the power generation system 810 as well as to provide an electric driven system in which each of the components of the electric driven hydraulic fracking system 800 is driven by the electric power generated by the power generation system 810, the power distribution trailer 820 provides the flexibility to distribute the electric power 850 generated by the power generation system 810 at different voltage levels. In adjusting the voltage levels that the electric power 850 generated by the power generation system 810 is distributed, the power distribution trailer 820 may then distribute the appropriate voltage levels to several different components included in the electric driven hydraulic fracking system 800 to accommodate the electric power requirements of the several different components included in the electric driven hydraulic fracking system 800. For example, the power distribution trailer 820 may distribute the electric power 860 generated by the power generation system 810 at the voltage level of 13.8 kV as generated by the power generation system 810 via the switch gears 825(*a-n*) to each of the single medium-voltage VFDs 840(*a-n*) for the each of the single medium-voltage VFDs 840(*a-n*) to drive the single shaft electric motors and the single hydraulic pumps. In another example, the power distribution trailer 820 may distribute the electric power 860 generated by the power generation system 810 at the voltage level of 12.47 kV as generated by the power generation system 810 via the switch gears 825(*a-n*) to each of the single medium-voltage VFDs 840(*a-n*) for each of the single medium-voltage VFDs 840(*a-n*) to drive the single shaft electric motors and the single hydraulic pumps.

However, the electric power distribution trailer 820 may also distribute the electric power 850 generated by the power generation system 810 at a decreased voltage level from the voltage level of the electric power 850 originally generated by the power generation system 810 (i.e., the initial or power generation voltage level). Several different components of the electric driven hydraulic fracking system 800 may have power requirements that require electric power at a significantly lower voltage level than the electric power 850 originally generated by the power generation system 810. The power distribution trailer 820 may include a switchgear transformer configuration 835 that may step down the voltage level of the electric power 850 as originally generated by the power distribution trailer 810 to a lower voltage level that satisfies the power requirements of those components that may not be able to handle the increased voltage level of the electric power 850 originally generated by the power distribution trailer 810. In doing so, the electric power distribution trailer 820 may provide the necessary flexibility to continue to consolidate the electric power 850 to the power generation system 810 while still enabling each of the several components to be powered by the electric power generated by the power generation system 810.

For example, the switchgear transformer configuration 835 may convert the electric power 850 generated by the at least one power source of the power generation system 810 at the power generation voltage level to at an auxiliary voltage level that is less than the power generation voltage level. The switchgear transformer configuration 835 may then distribute the electric power 855 at the auxiliary voltage level to each single medium-voltage VFD 840(*a-n*) on each corresponding single trailer 830(*a-n*) to enable each single medium-voltage VFD 840(*a-n*) from the plurality of single medium-voltage VFDs 840(*a-n*) to communicate with the fracking control center 880. The switchgear transformer configuration 835 may also distribute the electric power 855 at the auxiliary voltage level to a plurality of auxiliary systems 890. The plurality of auxiliary systems 890 assists each single hydraulic pump as each hydraulic pump from the plurality of single hydraulic pumps operate to prepare the well for the later extraction of the fluid from the well.

In such an example, the switchgear transformer configuration 835 may convert the electric power 850 generated by the power generation system 810 with power sources include gas turbine engines at the power generation voltage level of 13.8 kV to an auxiliary voltage level of 480V, which is less than the power generation voltage level of 13.8 kV. The switchgear transformer configuration 835 may then distribute the electric power 855 at the auxiliary voltage level of 480V to each single medium-voltage VFD 840(*a-n*) on each corresponding single trailer 830(*a-n*) to enable each single medium-voltage VFD 840(*a-n*) from the plurality of single medium-voltage VFDs 840(*a-n*) to communicate with the fracking control center 880. The switchgear transformer configuration 835 may also distribute the electric power 855 at the auxiliary voltage level of 480V to a plurality of auxiliary systems 890.

In another example, the switchgear transformer configuration 835 may convert the electric power 850 generated by the power generation system 810 with power sources that include an electric power plant at the power generation voltage level of 12.47 kV to an auxiliary voltage level of 480V, which is less than the power generation voltage level of 12.47 kV. In another example, the switchgear transformer configuration 835 may convert the electric power 850 at the power generation voltage level generated by the power generation system 810 to the auxiliary voltage level of 480V, 120V, 24V and/or any other auxiliary voltage level that is less than the power generation voltage level. The switchgear transformer configuration 835 may convert the electric power 850 at the power generation voltage level generated by the power generation system 810 to any auxiliary voltage level that is less than the power generation voltage level to assist each single medium-voltage VFD 840(*a*-*n*) in executing operations that do not require the electric power 860 at the power generation voltage level that will be apparent to those skilled in the relevant art(s) without departing from the spirit and scope of the disclosure.

Certain embodiments of the present application relate to a variable frequency drive (VFD) cabin, comprising: a cabin housing, the cabin housing comprising: a cabin floor; and a cabin cap secured to the cabin floor, thereby at least partially enclosing a cabin interior of the cabin housing; a medium-voltage VFD positioned within the interior of the cabin housing, the medium-voltage VFD comprising: a transformer assembly comprising: a transformer assembly frame; a transformer mounted to the transformer assembly frame; and a first vibration damping assembly mounted between the transformer assembly frame and the cabin floor; and a power cell assembly comprising: a power cell assembly frame; a plurality of power cells mounted to the power cell assembly frame; and a second vibration damping assembly mounted between the power cell assembly frame and the cabin floor.

In certain embodiments, the power cell assembly further comprises a plurality of slide rails connected with the power cell assembly frame, and wherein each of the power cells is mounted to the power cell assembly frame via a corresponding one of the slide rails.

In certain embodiments, the VFD cabin further comprises a ventilation system, the ventilation system comprising: a filter positioned at an intake port of the cabin housing; at least one intake blower configured to draw air into the cabin interior via the filter; and at least one exhaust blower configured to expel air from the cabin interior via an exhaust port of the cabin housing.

In certain embodiments, the ventilation system is configured to generate an airstream that flows from the intake port to the exhaust port; wherein the power cell assembly is positioned within the airstream upstream of the transformer assembly; and wherein the transformer assembly is positioned within the airstream downstream of the power cell assembly.

In certain embodiments, the at least one intake blower is configured to draw air into the cabin interior at a first flow rate; wherein the at least one exhaust blower is configured to expel air from the cabin interior at a second flow rate; and wherein the first flow rate is greater than the second flow rate such that the ventilation system is configured to generate an overpressure condition within the cabin interior.

In certain embodiments, the overpressure condition is one in which an interior pressure within the cabin exceeds an exterior pressure outside the cabin.

In certain embodiments, the VFD cabin further comprises at least one low-voltage VFD connected with the at least one intake blower and the at least one exhaust blower, wherein the at least one low-voltage VFD is configured to control operation of the at least one intake blower and the at least one exhaust blower.

In certain embodiments, the at least one low-voltage VFD comprises a plurality of low-voltage VFDs, and wherein each low-voltage VFD is dedicated to a corresponding one of the at least one intake blower or to a corresponding one of the at least one exhaust blower.

In certain embodiments, the ventilation system further comprises a plurality of cooling fans; and wherein each cooling fan is dedicated to a corresponding power cell of the plurality of power cells and is configured to blow air across the corresponding power cell.

In certain embodiments, the VFD cabin further comprises a plurality of temperature sensors; wherein each temperature sensor is configured to sense a temperature of a corresponding power cell of the plurality of power cells; and wherein the ventilation system is configured to control operation of the plurality of cooling fans based upon information generated by the plurality of temperature sensors.

In certain embodiments, the first vibration damping assembly has a first overall stiffness; and wherein the second vibration damping assembly has a second overall stiffness less than the first overall stiffness.

In certain embodiments, each of the first vibration damping assembly and the second vibration damping assembly comprises a plurality of vibration damping couplers; and wherein each vibration damping coupler comprises a vibration damper and a bolt extending through the vibration damper.

In certain embodiments, each vibration damper comprises at least one of an elastic material, a rubber material, an elastomeric material, or a spring.

In certain embodiments, the cabin cap is releasably secured to the cabin floor such that the cabin cap is operable to be removed from the cabin floor as a unit.

Certain embodiments relate to a pump configuration comprising the VFD cabin, the pump configuration further comprising: a mobile trailer, wherein the VFD cabin is mounted to the mobile trailer; an electric motor mounted to the mobile trailer, wherein the electric motor is connected with the medium-voltage VFD such that the medium-voltage VFD is operable to control operation of the electric motor; and a hydraulic pump mounted to the mobile trailer, wherein the hydraulic pump is connected with the electric motor such that the hydraulic pump is operable to pump a fracking media when operated by the electric motor.

In certain embodiments, wherein the VFD cabin is mounted to the mobile trailer without a suspension being connected between the VFD cabin and the mobile trailer.

Certain embodiments of the present application relate to a variable frequency drive (VFD) cabin, comprising: a cabin housing, the cabin housing comprising an air intake port and an air exhaust port; a transformer mounted in an interior of the cabin housing, wherein the transformer is configured to transform electric power at an initial voltage to electric power at a transformer voltage, wherein the initial voltage is within a medium-voltage voltage range, and wherein the transformer voltage is within a low-voltage voltage range; a power cell assembly mounted in the interior of the cabin housing and connected with the transformer, wherein the power cell assembly comprises a plurality of power cells and is configured to convert electric power at the transformer voltage to electric power at a VFD voltage, wherein the VFD voltage is within a third medium-voltage voltage range; and a ventilation system, comprising: a filtration unit positioned at the air intake port; at least one intake blower configured to draw air into the cabin housing via the air intake port and the filtration unit at an intake flowrate; at least one exhaust blower configured to expel air from the cabin housing via the exhaust port at an exhaust flowrate; and a ventilation control system configured to control operation of the at least one intake blower and the at least one exhaust blower such that the intake flowrate exceeds the exhaust flowrate to thereby create an overpressure condition within the cabin housing.

In certain embodiments, the ventilation control system comprises at least one low-voltage VFD configured to control the at least one intake blower and the at least one exhaust blower such that the intake flow rate and the exhaust flowrate are variable.

In certain embodiments, the ventilation control system comprises a plurality of low-voltage VFDs, the plurality of low-voltage VFDs comprising: at least one first low-voltage VFD, wherein each first low-voltage VFD is dedicated to a corresponding one of the at least one intake blower; and at least one second low-voltage VFD, wherein each second low-voltage VFD is dedicated to a corresponding one of the at least one exhaust blower.

In certain embodiments, the ventilation system is configured to generate an airflow stream traveling from the intake port to the exhaust port; wherein the power cell assembly is positioned in the airflow stream upstream of the transformer; and wherein the transformer is positioned in the airflow stream downstream of the power cell assembly.

In certain embodiments, the ventilation system further comprises a plurality of cooling fans, wherein each cooling fan is configured to blow air across a corresponding one of the power cells.

In certain embodiments, the VFD cabin further comprises a plurality of temperature sensors, wherein each temperature sensor is configured to sense a temperature of a corresponding one of the power cells; and wherein each cooling fan is configured to vary a flow rate across the corresponding one of the power cells based upon the temperature of the corresponding one of the power cells as sensed by a corresponding one of the temperature sensors.

In certain embodiments, the cabin housing further comprises a closet that is accessible from an exterior of the cabin and is isolated from the interior of the cabin, wherein at least a portion of the ventilation control system is mounted within the closet.

In certain embodiments, the cabin housing lacks an entry door by which the interior of the cabin can be accessed.

In certain embodiments, the transformer is mounted to a floor of the cabin via a plurality of vibration damping couplers.

In certain embodiments, the power cell assembly is mounted to a floor of the cabin via a plurality of vibration damping couplers.

Certain embodiments of the present application relate to a method of manufacturing a cabin comprising a variable frequency drive (VFD) including a transformer and a plurality of power cells, the method comprising: mounting a transformer assembly to a cabin floor, wherein the transformer assembly comprises the transformer, a transformer frame to which the transformer is mounted, and a first vibration damping assembly, wherein mounting the transformer assembly to the cabin floor comprises securing the transformer frame to the cabin floor via the first vibration damping assembly; mounting a power cell assembly to the cabin floor, wherein the power cell assembly comprises the plurality of power cells, a power cell frame to which the plurality of power cells are mounted, and a second vibration damping assembly, wherein mounting the power cell assembly to the cabin floor comprises securing the power cell frame to the cabin floor via the second vibration damping assembly.

In certain embodiments, the method further comprises enclosing the cabin, thereby forming a cabin housing within which the transformer assembly and the power cell assembly are positioned.

In certain embodiments, enclosing the cabin comprises: lowering a preformed cabin cap onto the cabin floor; and securing the preformed cabin cap to the cabin floor such that the cabin housing is defined at least in part by the preformed cabin cap and the cabin floor.

In certain embodiments, the cabin cap comprises a plurality of sidewalls and a roof connected with the plurality of sidewalls.

In certain embodiments, the method further comprises: operating an input blower to draw air into the cabin housing through a filter via an input port formed in the cabin housing at a first flow rate; and operating an exhaust blower to expel air from the cabin housing via an exhaust port formed in the cabin housing at a second flow rate; wherein the first flow rate is greater than the second flow rate such that an overpressure condition is provided within the cabin housing.

In certain embodiments, the method further comprises securing the cabin floor to a mobile trailer.

In certain embodiments, securing the cabin floor to the mobile trailer comprises bolting and/or welding the cabin floor to the mobile trailer.

Certain embodiments of the present application relate to a method, comprising: receiving, by at least one pump configuration, electric power at an initial voltage level, wherein the initial voltage level is in a first medium-voltage voltage range, wherein each pump configuration comprises: a corresponding and respective mobile trailer; a corresponding and respective medium-voltage variable frequency drive (VFD) mounted to the mobile trailer; a corresponding and respective single, single-shaft electric motor mounted to the mobile trailer and operably connected with the medium-voltage VFD; and a corresponding and respective single hydraulic pump mounted to the mobile trailer and operably connected with the single shaft of the single, single-shaft electric motor; converting, by the medium-voltage VFD of each pump configuration, the electric power at the initial voltage level to electric power at a VFD voltage level, wherein the VFD voltage level is in a second medium-voltage voltage range; converting, by the single, single-shaft electric motor of each pump configuration, the electric power at the VFD voltage level to motive power by rotating the single shaft of the single, single-shaft electric motor at a revolutions per minute (RPM) speed; and transmitting rotation of the single shaft of the single, single-shaft electric motor of each pump configuration to the hydraulic pump of the pump configuration, thereby causing the single hydraulic pump of each pump configuration to continuously pump a fracking media at a horsepower (HP) level.

In certain embodiments, the VFD voltage is less than the initial voltage.

In certain embodiments, the first medium-voltage voltage range is about 11.8 kV to about 14.5 kV.

In certain embodiments, the second medium-voltage voltage range is about 4160V or greater.

In certain embodiments, the RPM speed is about 750 RPM or greater.

In certain embodiments, the HP level is about 5000 HP or greater.

In certain embodiments, the at least one pump configuration comprises a plurality of the pump configurations; and the method further comprises: supplying the fracking media pumped by the hydraulic pumps of the plurality of pump configurations to fracking equipment; and operating the fracking equipment to charge the fracking media into a fracking well.

In certain embodiments, the method further comprises: receiving, at a mobile power distribution system, electric power at an initial megawatt (MW) level and the initial voltage level; and distributing, by the mobile power distribution system, electric power at the initial voltage level to the plurality of pump configurations.

In certain embodiments, the mobile power distribution system is mounted to a single power distribution trailer.

In certain embodiments, the electric power at the initial MW level and the initial voltage level is received from a power grid.

In certain embodiments, each pump configuration further comprises a corresponding and respective ventilation system, and the method further comprises: converting, by the mobile power distribution system, a portion of the electric power at the initial voltage level to electric power at a low-voltage voltage level; distributing, by the mobile power distribution system, the electric power at the low-voltage level to the plurality of pump configurations; and operating each ventilation system using the electric power at the low-voltage voltage to cool the medium-voltage VFD of the corresponding pump configuration.

In certain embodiments, the method further comprises: supplying, by the mobile power distribution system, electric power to at least one auxiliary system; and operating the at least one auxiliary system using the power supplied by the mobile power distribution system.

In certain embodiments, the method further comprises: generating, by a mobile power generation system, the electric power at the initial MW level and the initial voltage level; and supplying the electric power at the initial MW level and the initial voltage level to the power distribution trailer.

In certain embodiments, the mobile power generation system is mounted to a single power generation trailer.

In certain embodiments, the generating comprises: operating a first gas turbine engine of the mobile power generation system to provide a first portion of the electric power to be supplied to the mobile power distribution system; and operating a second gas turbine engine of the mobile power generation system to provide a second portion of the electric power to be supplied to the mobile power distribution system.

In certain embodiments, the method further comprises providing a fault redundancy, wherein providing the fault redundancy comprises: continuing to provide, by the first gas turbine engine, the first portion of the electric power when the second gas turbine engine suffers a fault condition; and continuing to provide, by the second gas turbine engine, the second portion of the electric power when the first gas turbine engine suffers the fault condition.

Certain embodiments of the present application relate to a pump configuration for a fracking operation, the pump configuration comprising: a mobile trailer; a medium-voltage variable frequency drive (VFD) mounted to the trailer, wherein the medium-voltage VFD is configured to convert electric power at an initial voltage level to electric power at a VFD, wherein the initial voltage level is about 2.8 kilovolts (kV) or greater; a single, single-shaft electric motor mounted to the mobile trailer and connected with the medium-voltage VFD, wherein the single, single-shaft electric motor is configured to operate in response to receiving the electric power at the VFD voltage; and a single hydraulic pump mounted to the mobile trailer and connected with the single, single-shaft electric motor, wherein the single hydraulic pump is configured to continuously pump fracking media at a horsepower (HP) level of about 5000 HP or greater in response to operation of the single, single-shaft electric motor.

In certain embodiments, the single, single-shaft electric motor is configured to operate at a revolutions per minute (RPM) level of about 750 RPM or greater in response to receiving the electric power at the VFD voltage.

In certain embodiments, the single hydraulic pump is configured to operate on a continuous duty cycle to continuously pump the fracking media at the HP level of about 5000 HP or greater.

In certain embodiments, the VFD voltage is about 4.16 kV or greater.

In certain embodiments, the initial voltage is in a range of about 10 kV to about 16 kV.

In certain embodiments, the pump configuration lacks a second hydraulic pump configured to continuously pump fracking media into the fracking well at the HP level of about 5000 HP or greater.

In certain embodiments, the pump configuration lacks a second single-shaft electric motor configured to operate at the VFD voltage.

In certain embodiments, the pump configuration lacks a second medium-voltage VFD.

In certain embodiments, the pump configuration further comprises a ventilation system comprising: at least one blower configured to blow air across the medium-voltage VFD in response to receiving low-voltage electric power; and at least one low-voltage VFD configured to supply the low-voltage electric power to the at least one blower.

In certain embodiments, the pump configuration further comprises a VFD cabin in which the medium-voltage VFD is positioned; and wherein the cabin further comprises a junction box comprising: a single medium-voltage connector configured for connection with a medium-voltage electric line, wherein the single medium-voltage connector is operable to supply electric power from the medium-voltage electric line to the medium-voltage VFD; and a single low-voltage connector configured for connection with a low-voltage electric line, wherein the single low-voltage connector is operable to supply electric power from the low-voltage electric line to the low-voltage VFD.

In certain embodiments, the junction box further comprises a communication line connector configured for connection with a communication line; and wherein the medium-voltage VFD is configured to operate based upon information received via the communication line.

Certain embodiments of the present application relate to a system comprising a plurality of the pump configuration, the system further comprising a mobile power distribution system connected with the plurality of pump configurations; wherein the mobile power distribution system is configured to receive electric power at a power level of about 24 megawatts (MW) or greater, and to distribute the electric power to the plurality of pump configurations at the initial voltage level.

In certain embodiments, the mobile power distribution system is configured for connection with a power grid operable to supply electric power to the mobile power distribution system.

In certain embodiments, the mobile power distribution system is mounted to a single mobile power distribution trailer.

In certain embodiments, the mobile power distribution system is further configured to convert a portion of the electric power to a low-voltage voltage level, and to distribute electric power at the low-voltage level to each of the pump configurations; and wherein each of the pump configurations comprises a ventilation system configured to operate using the electric power at the low-voltage voltage level.

In certain embodiments, the system further comprises a mobile power generation system connected with the mobile power distribution system; wherein the power generation system is configured to generate the electric power at the power level of about 24 MW or greater and at the initial voltage level.

In certain embodiments, the power generation system comprises: a first gas turbine engine configured to generate a first electric power between about 12 MW and about 16 MW; and a second gas turbine engine configured to generate a second electric power between about 12 MW and about 16 MW; wherein the electric power level of about 24 MW or greater at the initial voltage level comprises the first electric power and the second electric power.

In certain embodiments, the mobile power generation system further comprises a mobile power generation trailer; and wherein the first gas turbine engine and the second gas turbine engine are mounted to the second mobile trailer.

It is to be appreciated that the Detailed Description section, and not the Abstract section, is intended to be used to interpret the claims. The Abstract section may set forth one or more, but not all exemplary embodiments, of the present disclosure, and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) the various changes in form and detail can be made without departing from the spirt and scope of the present disclosure. Thus the present disclosure should not be limited by any of the above-described exemplary embodiments, but should be defined only in accordance with the following claims and their equivalents.

What is claimed is:

1. A pump configuration for a fracking operation, the pump configuration comprising:
   a cabin having a cabin floor and a cabin cap coupled thereto to at least partially enclose a cabin interior of the cabin;
   a medium-voltage variable frequency drive (VFD) positioned within the cabin interior of the cabin to receive electric power at an initial voltage level and convert the electric power from the initial voltage level to electric power at a VFD voltage level, wherein the medium-voltage VFD includes a transformer assembly having a transformer assembly frame, a transformer mounted to the transformer assembly frame, and a vibration damping assembly mounted between the transformer assembly frame and the cabin floor;
   an electric motor coupled to the medium-voltage VFD to receive the electric power at the VFD voltage level from the medium-voltage VFD and operate based on the electric power at the VFD voltage level; and
   a hydraulic pump coupled to the electric motor to continuously pump fracking media in response to operation of the electric motor.

2. The pump configuration of claim 1, wherein the medium-voltage VFD includes a power cell assembly having a power cell assembly frame, a plurality of power cells mounted to the power cell assembly frame, and a second vibration damping assembly mounted between the power cell assembly frame and the cabin floor.

3. The pump configuration of claim 1, wherein:
   the cabin includes an intake port and an exhaust port; and
   the pump configuration includes a ventilation system comprising:
      a filtration unit positioned at the intake port;
      at least one intake blower to draw air into the cabin interior via the intake port through the filtration unit at an intake flowrate;
      at least one exhaust blower to expel air from the cabin interior via the exhaust port at an exhaust flowrate; and
      a ventilation control system to control operation of the at least one intake blower and the at least one exhaust blower such that the intake flowrate exceeds the exhaust flowrate.

4. The pump configuration of claim 1, wherein:
   the VFD voltage level is in a range of about 2 kilovolts (kV) to about 8 kV; and
   the hydraulic pump is configured to continuously pump fracking media at a high horsepower (HHP) level of at least about 5000 HHP.

5. The pump configuration of claim 4, wherein the VFD voltage level is about 4.16 kV or greater.

6. The pump configuration of claim 4, wherein the initial voltage level is in a range of about 10 kV to about 16 kV.

7. The pump configuration of claim 4, wherein the electric motor is configured to operate at a revolution per minute (RPM) level of about 750 RPM or greater in response to receiving the electric power at the VFD voltage level.

8. The pump configuration of claim 1, wherein the pump configuration includes only one hydraulic pump to continuously pump fracking media.

9. The pump configuration of claim 8, wherein the pump configuration includes only one electric motor.

10. The pump configuration of claim 9, wherein the pump configuration includes only one medium-voltage VFD.

11. The pump configuration of claim 1, wherein:
    the transformer assembly is a multi-pulse transformer assembly;
    the electric motor is a single-shaft electric motor; and
    the hydraulic pump is coupled to the electric motor to continuously pump fracking media in response to one or more operational conditions that are based on variables input to the electric motor to cause the fracking media to be pumped by the hydraulic pump within parameters of the electric motor in use of the pump configuration.

12. The pump configuration of claim 2, wherein the power cell assembly includes a plurality of semiconductor devices and a plurality of racks mounted to the power cell assembly frame.

13. The pump configuration of claim 3, wherein the at least one intake blower is configured to draw air into the cabin interior via the intake port through the filtration unit at an intake flowrate sufficient to provide cooling during operation of the pump configuration at a given ambient temperature and elevation.

14. The pump configuration of claim 5, wherein the initial voltage level received by the medium-voltage VFD is at least 12.47 kV.

15. The pump configuration of claim 5, wherein the initial voltage level received by the medium-voltage VFD is in a range of at least 12.47 kV to about 16 kV.

16. The pump configuration of claim 7, wherein the electric motor and the hydraulic pump are configured for operation in combination with one another above a nominal base speed of at least 750 revolutions per minute (RPM) in response to receiving electric power output from the medium-voltage VFD at a given VFD voltage level and an associated frequency and current of the received electric power.

17. A pump configuration for a fracking operation, the pump configuration comprising:
a cabin including an intake port and an exhaust port;
a ventilation system including (i) a filtration unit positioned at the air intake port, (ii) at least one intake blower to draw air into the cabin via the intake port through the filtration unit at an intake flowrate, (iii) at least one exhaust blower to expel air from the cabin via the exhaust port at an exhaust flowrate, and (iv) a ventilation control system to control operation of the at least one intake blower and the at least one exhaust blower such that the intake flowrate exceeds the exhaust flowrate;
a medium-voltage variable frequency drive (VFD) positioned within the cabin to receive electric power at an initial voltage level and convert the electric power from the initial voltage level to electric power at a VFD voltage level;
an electric motor coupled to the medium-voltage VFD to receive the electric power at the VFD voltage level from the medium-voltage VFD and operate based on the electric power at the VFD voltage level; and
a hydraulic pump coupled to the electric motor to continuously pump fracking media in response to operation of the electric motor.

18. The pump configuration of claim 17, wherein the medium-voltage VFD includes a transformer assembly having a transformer assembly frame, a transformer mounted to the transformer assembly frame, and a vibration damping assembly mounted between the transformer assembly frame and a cabin floor of the cabin.

19. The pump configuration of claim 18, wherein the medium-voltage VFD includes a power cell assembly having a power cell assembly frame, a plurality of power cells mounted to the power cell assembly frame, and a second vibration damping assembly mounted between the power cell assembly frame and the cabin floor.

20. The pump configuration of claim 17, wherein:
the VFD voltage level is about 4.16 kV or greater; and
the initial voltage level is in a range of about 10 kV to about 16 kV.

21. The pump configuration of claim 17, wherein:
the hydraulic pump is configured to continuously pump fracking media at a horsepower (HP) level of at least about 5000 HP; and
the electric motor is configured to operate at a revolution per minute (RPM) level of about 750 RPM or greater in response to receiving the electric power at the VFD voltage level.

22. A system for a fracking operation, the system comprising:
a power generation system to generate electric power at a power generation level of about 24 megawatts (MW) or greater;
a power distribution system coupled to the power generation system to receive electric power from the power generation system at the power generation level and distribute the electric power at an initial voltage level; and
a pump configuration coupled to the power distribution system, the pump configuration comprising:
a cabin having a cabin floor and a cabin cap coupled thereto to at least partially enclose a cabin interior of the cabin;
a medium-voltage variable frequency drive (VFD) positioned within the cabin interior of the cabin to receive electric power from the power distribution system at the initial voltage level and convert the electric power from the initial voltage level to electric power at a VFD voltage level;
an electric motor coupled to the medium-voltage VFD to receive the electric power at the VFD voltage level from the medium-voltage VFD and operate based on the electric power at the VFD voltage level; and
a hydraulic pump coupled to the electric motor to continuously pump fracking media in response to operation of the electric motor.

23. The system of claim 22, wherein:
the VFD voltage level is about 4.16 kV or greater; and
the initial voltage level is in a range of about 10 kV to about 16 kV.

24. The system of claim 22, wherein the power generation system comprises:
a first gas turbine engine configured to generate a first electric power between about 12 MW and about 16 MW; and
a second gas turbine engine configured to generate a second electric power between about 12 MW and about 16 MW,
wherein the electric power at the power generation level of about 24 MW or greater comprises the first electric power and the second electric power.

25. The system of claim 22, wherein the pump configuration comprises a ventilation system having a filtration unit positioned at an intake port of the cabin, at least one intake blower to draw air into the cabin interior via the intake port through the filtration unit at an intake flowrate, at least one exhaust blower to expel air from the cabin interior via the exhaust port at an exhaust flowrate, and a ventilation control system to control operation of the at least one intake blower and the at least one exhaust blower such that the intake flowrate exceeds the exhaust flowrate.

26. The system of claim 22, wherein the medium-voltage VFD comprises a transformer assembly having a transformer assembly frame, a transformer mounted to the transformer assembly frame, and a vibration damping assembly mounted between the transformer assembly frame and the cabin floor.

* * * * *